(12) United States Patent
Dill et al.

(10) Patent No.: US 7,010,052 B2
(45) Date of Patent: Mar. 7, 2006

(54) APPARATUS AND METHOD OF CTCM ENCODING AND DECODING FOR A DIGITAL COMMUNICATION SYSTEM

(75) Inventors: Jeffrey C. Dill, Athens, OH (US); Sergio R. Lopez-Permouth, Athens, OH (US); Alan Ray Lindsey, Remsen, NY (US); Yung-Cheng Lo, San Leandro, CA (US); Frank A. Alder, McArthur, OH (US); Xiangyu Song, Plano, TX (US)

(73) Assignee: The Ohio University, Athens, OH (US)

( * ) Notice: Subject to any disclaimer, the term of this patent is extended or adjusted under 35 U.S.C. 154(b) by 811 days.

(21) Appl. No.: 09/835,727

(22) Filed: Apr. 16, 2001

(65) Prior Publication Data

US 2002/0196862 A1 Dec. 26, 2002

(51) Int. Cl.
*H04L 5/12* (2006.01)
(52) U.S. Cl. ............... 375/265; 375/262; 375/341; 714/786; 714/792
(58) Field of Classification Search ............... 375/265, 375/261, 234, 341, 259, 262, 348, 350, 243, 375/298; 382/232; 714/792, 786, 795
See application file for complete search history.

(56) References Cited

U.S. PATENT DOCUMENTS

| | | | |
|---|---|---|---|
| 4,648,057 A | 3/1987 | Wagstaff et al. | 708/403 |
| 5,406,570 A | 4/1995 | Berrou et al. | 714/792 |
| 5,446,747 A | 8/1995 | Berrou | 714/788 |
| 5,563,897 A | 10/1996 | Pyndiah et al. | 423/446 |
| 5,721,746 A | 2/1998 | Hladik et al. | 714/792 |

(Continued)

FOREIGN PATENT DOCUMENTS

WO   WO 96/17439   6/1996

OTHER PUBLICATIONS

Yung-Cheng Lo, et al. "High Dimensional Cicular Trellis-Coded Modulation", Signals, Systems & Computer, IEEE Computer Society Conf., USA Nov. 2-5, 1997, pp. 560-564.

(Continued)

*Primary Examiner*—Stephen Chin
*Assistant Examiner*—Ted M. Wang
(74) *Attorney, Agent, or Firm*—Calfee, Halter & Griswold LLP

(57) ABSTRACT

A method of building systematically a multi-dimensional (n, D, L) circular trellis coded modulation (CTCM) encoder with properties of optimal energy efficiency, strong tail biting and maximum minimum distance ($d_{min}$) of trellis paths is disclosed. In addition, a communication system for use in a power limited channel application is disclosed comprising a circular trellis coded modulation (CTCM) encoder with permuted state structure for encoding based on a circular trellis path associated with a sequence of digital information bits and a set of simplexes identified for the path from a multi-dimensional signal constellation; a transmitter coupled to said CTCM encoder for transmitting said sequence of channel symbols over said channel; a receiver for receiving a transmission from said transmitter including said sequence of channel symbols and any noise induced therein; and a CTCM decoder coupled to said receiver for decoding the received transmission without knowledge of the starting state of the circular trellis path of the CTCM encoder to recover the sequence of information bits. Apparatus and methods of encoding and decoding are also disclosed utilizing a combination of circular trellis-coded modulation with permuted state structure and simplex signal constellation techniques for use in the digital communication system.

38 Claims, 26 Drawing Sheets

U.S. PATENT DOCUMENTS

| | | | | |
|---|---|---|---|---|
| 5,907,565 | A | 5/1999 | Alamouti | 714/792 |
| 5,983,388 | A | 11/1999 | Friedman et al. | 714/776 |
| 6,011,950 | A | 1/2000 | Young | 725/67 |
| 6,108,388 | A | 8/2000 | Douillard et al. | 375/348 |
| 6,115,436 | A | 9/2000 | Ramesh et al. | 375/341 |
| 6,119,264 | A | 9/2000 | Berrou et al. | 714/786 |
| 6,560,362 | B1 * | 5/2003 | Piret et al. | 382/232 |
| 6,578,173 | B1 * | 6/2003 | Alamouti | 714/792 |

OTHER PUBLICATIONS

Alder F. A. et al.: "Simplex Symbol Assignment In Circular Trellis-Coded Modulation", Military Communications Conference Proceedings, Milcom 1999, US, Oct. 31, 1999, pp. 311-315.

Anderson J. B. et al., "Tailbiting Map Decoders" IEEE Journal on Selected Areas in Communications, vol. 16, No. 2, Feb. 1, 1998, pp. 297-302.

J.E. Curry, A. R. Lindsey, J. C. Dill, S. Lopez-Permouth: "A Group Theoretic Description of Circular Trellis Coded Modulation" Proceedings of SPIE, vol. 4395, Apr. 17-18, 2001, pp. 47-56.

A Turbo Code Tutorial, William E. Ryan.

Symbol Assignment and Performance of Simplex Signaling in High Dimensional Trellis-Coded Modulation, by Frank A. Alder, Aug. 1998, (pp. 1-93).

Circular Trellis-Coded Modulation in Spread Spectrum Communications, by Yung-Chen Lo, Aug., 1997 (pp. 114).

* cited by examiner

TABLE 1 - STATE TRANSITION TABLE FOR CTCM (4,3)

| STATE | INPUT 0 | INPUT 1 | INPUT 2 | INPUT 3 | STATE | INPUT 0 | INPUT 1 | INPUT 2 | INPUT 3 |
|---|---|---|---|---|---|---|---|---|---|
| 1 | 1 | 2 | 5 | 34 | 33 | 34 | 5 | 2 | 1 |
| 2 | 3 | 8 | 15 | 37 | 34 | 35 | 18 | 51 | 40 |
| 3 | 4 | 14 | 10 | 50 | 35 | 36 | 33 | 39 | 46 |
| 4 | 5 | 34 | 1 | 2 | 36 | 37 | 15 | 8 | 3 |
| 5 | 6 | 26 | 11 | 47 | 37 | 38 | 56 | 21 | 58 |
| 6 | 7 | 64 | 17 | 25 | 38 | 39 | 46 | 36 | 33 |
| 7 | 8 | 3 | 37 | 15 | 39 | 40 | 51 | 18 | 35 |
| 8 | 9 | 28 | 29 | 20 | 40 | 41 | 45 | 59 | 60 |
| 9 | 10 | 50 | 4 | 14 | 41 | 42 | 57 | 49 | 19 |
| 10 | 11 | 47 | 6 | 26 | 42 | 43 | 30 | 54 | 16 |
| 11 | 12 | 63 | 31 | 62 | 43 | 44 | 23 | 48 | 32 |
| 12 | 13 | 27 | 53 | 55 | 44 | 45 | 41 | 60 | 59 |
| 13 | 14 | 4 | 50 | 10 | 45 | 46 | 39 | 33 | 36 |
| 14 | 15 | 37 | 3 | 8 | 46 | 47 | 11 | 26 | 6 |
| 15 | 16 | 54 | 30 | 43 | 47 | 48 | 32 | 44 | 23 |
| 16 | 17 | 25 | 7 | 64 | 48 | 49 | 19 | 42 | 57 |
| 17 | 18 | 35 | 40 | 51 | 49 | 50 | 10 | 14 | 4 |
| 18 | 19 | 49 | 57 | 42 | 50 | 51 | 40 | 35 | 18 |
| 19 | 20 | 29 | 28 | 9 | 51 | 52 | 24 | 22 | 61 |
| 20 | 21 | 58 | 38 | 56 | 52 | 53 | 55 | 13 | 27 |
| 21 | 22 | 61 | 52 | 24 | 53 | 54 | 16 | 43 | 30 |
| 22 | 23 | 44 | 32 | 48 | 54 | 55 | 53 | 27 | 13 |
| 23 | 24 | 52 | 61 | 22 | 55 | 56 | 38 | 58 | 21 |
| 24 | 25 | 17 | 64 | 7 | 56 | 57 | 42 | 19 | 49 |
| 25 | 26 | 6 | 47 | 11 | 57 | 58 | 21 | 56 | 38 |
| 26 | 27 | 13 | 55 | 53 | 58 | 59 | 60 | 41 | 45 |
| 27 | 28 | 9 | 20 | 29 | 59 | 60 | 59 | 45 | 41 |
| 28 | 29 | 20 | 9 | 28 | 60 | 61 | 22 | 24 | 52 |
| 29 | 30 | 43 | 16 | 54 | 61 | 62 | 31 | 63 | 12 |
| 30 | 31 | 62 | 12 | 63 | 62 | 63 | 12 | 62 | 31 |
| 31 | 32 | 48 | 23 | 44 | 63 | 64 | 7 | 25 | 17 |
| 32 | 33 | 36 | 46 | 39 | 64 | 2 | 1 | 34 | 5 |

Fig. 9

| | | | | |
|---|---|---|---|---|
| 1 | 1 | 1 | 1 | 1 |
| 1 | 2 | 3 | 4 | 1 |
| 1 | 5 | 6 | 64 | 1 |
| 1 | 34 | 35 | 33 | 1 |
| 2 | 3 | 4 | 1 | 2 |
| 2 | 8 | 9 | 4 | 2 |
| 2 | 15 | 16 | 64 | 2 |
| 2 | 37 | 38 | 33 | 2 |
| 3 | 4 | 1 | 2 | 3 |
| 3 | 14 | 3 | 14 | 3 |
| 3 | 10 | 6 | 7 | 3 |
| 3 | 50 | 35 | 36 | 3 |
| 4 | 5 | 26 | 13 | 4 |
| 4 | 34 | 18 | 49 | 4 |
| 4 | 1 | 2 | 3 | 4 |
| 4 | 2 | 8 | 9 | 4 |
| 5 | 6 | 64 | 1 | 5 |
| 5 | 26 | 13 | 4 | 5 |
| 5 | 11 | 63 | 64 | 5 |
| 5 | 47 | 32 | 33 | 5 |
| 6 | 7 | 3 | 10 | 6 |
| 6 | 64 | 1 | 5 | 6 |
| 6 | 17 | 35 | 46 | 6 |
| 6 | 25 | 6 | 25 | 6 |
| 7 | 8 | 29 | 16 | 7 |
| 7 | 3 | 10 | 6 | 7 |
| 7 | 37 | 21 | 24 | 7 |
| 7 | 15 | 30 | 63 | 7 |
| 8 | 9 | 4 | 2 | 8 |
| 8 | 28 | 9 | 14 | 8 |
| 8 | 29 | 16 | 7 | 8 |
| 8 | 20 | 38 | 36 | 8 |
| 9 | 10 | 26 | 27 | 9 |
| 9 | 50 | 18 | 19 | 9 |
| 9 | 4 | 2 | 8 | 9 |
| 9 | 14 | 8 | 28 | 9 |
| 10 | 11 | 12 | 13 | 10 |
| 10 | 47 | 48 | 49 | 10 |

| | | | | |
|---|---|---|---|---|
| 10 | 6 | 7 | 3 | 10 |
| 10 | 26 | 27 | 9 | 10 |
| 11 | 12 | 13 | 10 | 11 |
| 11 | 63 | 64 | 5 | 11 |
| 11 | 31 | 32 | 46 | 11 |
| 11 | 62 | 63 | 25 | 11 |
| 12 | 13 | 10 | 11 | 12 |
| 12 | 27 | 29 | 30 | 12 |
| 12 | 53 | 30 | 62 | 12 |
| 12 | 55 | 21 | 61 | 12 |
| 13 | 14 | 15 | 54 | 13 |
| 13 | 4 | 5 | 26 | 13 |
| 13 | 50 | 51 | 52 | 13 |
| 13 | 10 | 11 | 12 | 13 |
| 14 | 15 | 54 | 13 | 14 |
| 14 | 37 | 56 | 49 | 14 |
| 14 | 3 | 14 | 3 | 14 |
| 14 | 8 | 28 | 9 | 14 |
| 15 | 16 | 64 | 2 | 15 |
| 15 | 54 | 13 | 14 | 15 |
| 15 | 30 | 63 | 7 | 15 |
| 15 | 43 | 32 | 36 | 15 |
| 16 | 17 | 18 | 42 | 16 |
| 16 | 25 | 26 | 53 | 16 |
| 16 | 7 | 8 | 29 | 16 |
| 16 | 64 | 2 | 15 | 16 |
| 17 | 18 | 42 | 16 | 17 |
| 17 | 35 | 46 | 6 | 17 |
| 17 | 40 | 60 | 24 | 17 |
| 17 | 51 | 61 | 63 | 17 |
| 18 | 19 | 9 | 50 | 18 |
| 18 | 49 | 4 | 34 | 18 |
| 18 | 57 | 38 | 39 | 18 |
| 18 | 42 | 16 | 17 | 18 |
| 19 | 20 | 58 | 41 | 19 |
| 19 | 29 | 43 | 48 | 19 |
| 19 | 28 | 20 | 56 | 19 |
| 19 | 9 | 50 | 18 | 19 |

| | | | | |
|---|---|---|---|---|
| 20 | 21 | 52 | 27 | 20 |
| 20 | 58 | 41 | 19 | 20 |
| 20 | 38 | 36 | 8 | 20 |
| 20 | 56 | 19 | 28 | 20 |
| 21 | 22 | 48 | 57 | 21 |
| 21 | 61 | 12 | 55 | 21 |
| 21 | 52 | 27 | 20 | 21 |
| 21 | 24 | 7 | 37 | 21 |
| 22 | 23 | 22 | 23 | 22 |
| 22 | 44 | 59 | 60 | 22 |
| 22 | 32 | 39 | 51 | 22 |
| 22 | 48 | 57 | 21 | 22 |
| 23 | 24 | 25 | 47 | 23 |
| 23 | 52 | 53 | 43 | 23 |
| 23 | 61 | 62 | 31 | 23 |
| 23 | 22 | 23 | 22 | 23 |
| 24 | 25 | 47 | 23 | 24 |
| 24 | 17 | 40 | 60 | 24 |
| 24 | 64 | 34 | 51 | 24 |
| 24 | 7 | 37 | 21 | 24 |
| 25 | 26 | 53 | 16 | 25 |
| 25 | 6 | 25 | 6 | 25 |
| 25 | 47 | 23 | 24 | 25 |
| 25 | 11 | 62 | 63 | 25 |
| 26 | 27 | 9 | 10 | 26 |
| 26 | 13 | 4 | 5 | 26 |
| 26 | 55 | 38 | 46 | 26 |
| 26 | 53 | 16 | 25 | 26 |
| 27 | 28 | 29 | 54 | 27 |
| 27 | 9 | 10 | 26 | 27 |
| 27 | 20 | 21 | 52 | 27 |
| 27 | 29 | 30 | 12 | 27 |
| 28 | 29 | 54 | 27 | 28 |
| 28 | 20 | 56 | 19 | 28 |
| 28 | 9 | 14 | 8 | 28 |
| 28 | 28 | 28 | 28 | 28 |
| 29 | 30 | 12 | 27 | 29 |
| 29 | 43 | 48 | 19 | 29 |

*Fig. 12A*

| | | | | |
|---|---|---|---|---|
| 29 | 16 | 7 | 8 | 29 |
| 29 | 54 | 27 | 28 | 29 |
| 30 | 31 | 48 | 42 | 30 |
| 30 | 62 | 12 | 53 | 30 |
| 30 | 12 | 27 | 29 | 30 |
| 30 | 63 | 7 | 15 | 30 |
| 31 | 32 | 46 | 11 | 31 |
| 31 | 48 | 42 | 30 | 31 |
| 31 | 23 | 61 | 62 | 31 |
| 31 | 44 | 60 | 61 | 31 |
| 32 | 33 | 5 | 47 | 32 |
| 32 | 36 | 15 | 43 | 32 |
| 32 | 46 | 11 | 31 | 32 |
| 32 | 39 | 51 | 22 | 32 |
| 33 | 34 | 40 | 45 | 33 |
| 33 | 5 | 47 | 32 | 33 |
| 33 | 2 | 37 | 38 | 33 |
| 33 | 1 | 34 | 35 | 33 |
| 34 | 35 | 33 | 1 | 34 |
| 34 | 18 | 49 | 4 | 34 |
| 34 | 51 | 24 | 64 | 34 |
| 34 | 40 | 45 | 33 | 34 |
| 35 | 36 | 3 | 50 | 35 |
| 35 | 33 | 1 | 34 | 35 |
| 35 | 39 | 35 | 39 | 35 |
| 35 | 46 | 6 | 17 | 35 |
| 36 | 37 | 58 | 45 | 36 |
| 36 | 15 | 43 | 32 | 36 |
| 36 | 8 | 20 | 38 | 36 |
| 36 | 3 | 50 | 35 | 36 |
| 37 | 38 | 33 | 2 | 37 |
| 37 | 56 | 49 | 14 | 37 |
| 37 | 21 | 24 | 7 | 37 |
| 37 | 58 | 45 | 36 | 37 |
| 38 | 39 | 18 | 57 | 38 |
| 38 | 46 | 26 | 55 | 38 |
| 38 | 36 | 8 | 20 | 38 |
| 38 | 33 | 2 | 37 | 38 |

| | | | | |
|---|---|---|---|---|
| 39 | 40 | 59 | 45 | 39 |
| 39 | 51 | 22 | 32 | 39 |
| 39 | 18 | 57 | 38 | 39 |
| 39 | 35 | 39 | 35 | 39 |
| 40 | 41 | 49 | 50 | 40 |
| 40 | 45 | 33 | 34 | 40 |
| 40 | 59 | 45 | 39 | 40 |
| 40 | 60 | 24 | 17 | 40 |
| 41 | 42 | 43 | 44 | 41 |
| 41 | 57 | 58 | 59 | 41 |
| 41 | 49 | 50 | 40 | 41 |
| 41 | 19 | 20 | 58 | 41 |
| 42 | 43 | 44 | 41 | 42 |
| 42 | 30 | 31 | 48 | 42 |
| 42 | 54 | 55 | 56 | 42 |
| 42 | 16 | 17 | 18 | 42 |
| 43 | 44 | 41 | 42 | 43 |
| 43 | 23 | 52 | 53 | 43 |
| 43 | 48 | 19 | 29 | 43 |
| 43 | 32 | 36 | 15 | 43 |
| 44 | 45 | 46 | 47 | 44 |
| 44 | 41 | 42 | 43 | 44 |
| 44 | 60 | 61 | 31 | 44 |
| 44 | 59 | 60 | 22 | 44 |
| 45 | 46 | 47 | 44 | 45 |
| 45 | 39 | 40 | 59 | 45 |
| 45 | 33 | 34 | 40 | 45 |
| 45 | 36 | 37 | 58 | 45 |
| 46 | 47 | 44 | 45 | 33 |
| 46 | 11 | 31 | 32 | 34 |
| 46 | 26 | 55 | 38 | 34 |
| 46 | 6 | 17 | 35 | 34 |
| 47 | 48 | 49 | 10 | 34 |
| 47 | 32 | 33 | 5 | 35 |
| 47 | 44 | 45 | 46 | 35 |
| 47 | 23 | 24 | 25 | 35 |
| 48 | 49 | 10 | 47 | 35 |
| 48 | 19 | 29 | 43 | 36 |

Fig. 12B

| | | | | |
|---|---|---|---|---|
| 48 | 42 | 30 | 31 | 36 |
| 48 | 57 | 21 | 22 | 36 |
| 49 | 50 | 40 | 41 | 36 |
| 49 | 10 | 47 | 48 | 37 |
| 49 | 14 | 37 | 56 | 37 |
| 49 | 4 | 34 | 18 | 37 |
| 50 | 51 | 52 | 13 | 37 |
| 50 | 40 | 41 | 49 | 38 |
| 50 | 35 | 36 | 3 | 38 |
| 50 | 18 | 19 | 9 | 38 |
| 51 | 52 | 13 | 50 | 38 |
| 51 | 24 | 64 | 34 | 39 |
| 51 | 22 | 32 | 39 | 39 |
| 51 | 61 | 63 | 17 | 39 |
| 52 | 53 | 43 | 23 | 39 |
| 52 | 55 | 58 | 60 | 40 |
| 52 | 13 | 50 | 51 | 40 |
| 52 | 27 | 20 | 21 | 40 |
| 53 | 54 | 53 | 54 | 40 |
| 53 | 16 | 25 | 26 | 41 |
| 53 | 43 | 23 | 52 | 41 |
| 53 | 30 | 62 | 12 | 41 |
| 54 | 55 | 56 | 42 | 41 |
| 54 | 53 | 54 | 53 | 42 |
| 54 | 27 | 28 | 29 | 42 |
| 54 | 13 | 14 | 15 | 42 |
| 55 | 56 | 42 | 54 | 42 |
| 55 | 38 | 46 | 26 | 43 |
| 55 | 58 | 60 | 52 | 43 |
| 55 | 21 | 61 | 12 | 43 |
| 56 | 57 | 56 | 57 | 43 |
| 56 | 42 | 54 | 55 | 44 |
| 56 | 19 | 28 | 20 | 44 |
| 56 | 49 | 14 | 37 | 44 |
| 57 | 58 | 59 | 41 | 44 |
| 57 | 21 | 22 | 48 | 45 |
| 57 | 56 | 57 | 56 | 45 |
| 57 | 38 | 39 | 18 | 45 |

| | | | | |
|---|---|---|---|---|
| 58 | 59 | 41 | 57 | 45 |
| 58 | 60 | 52 | 55 | 33 |
| 58 | 41 | 19 | 20 | 34 |
| 58 | 45 | 36 | 37 | 34 |
| 59 | 60 | 22 | 44 | 34 |
| 59 | 59 | 59 | 59 | 34 |
| 59 | 45 | 39 | 40 | 35 |
| 59 | 41 | 57 | 58 | 35 |
| 60 | 61 | 31 | 44 | 35 |
| 60 | 22 | 44 | 59 | 35 |
| 60 | 24 | 17 | 40 | 36 |
| 60 | 52 | 55 | 58 | 36 |
| 61 | 62 | 31 | 23 | 36 |
| 61 | 31 | 44 | 60 | 36 |
| 61 | 63 | 17 | 51 | 37 |
| 61 | 12 | 55 | 21 | 37 |
| 62 | 63 | 25 | 11 | 37 |
| 62 | 12 | 53 | 30 | 37 |
| 62 | 62 | 62 | 62 | 38 |
| 62 | 31 | 23 | 61 | 38 |
| 63 | 64 | 5 | 11 | 38 |
| 63 | 7 | 15 | 30 | 38 |
| 63 | 25 | 11 | 62 | 39 |
| 63 | 17 | 51 | 61 | 39 |
| 64 | 2 | 15 | 16 | 39 |
| 64 | 1 | 5 | 6 | 39 |
| 64 | 34 | 51 | 24 | 40 |
| 64 | 5 | 11 | 63 | 40 |

Fig. 12C

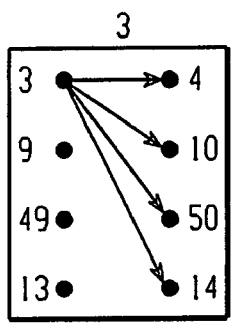
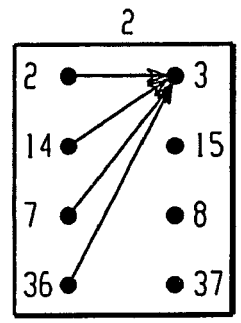
Fig. 13(a)  Fig. 13(b)
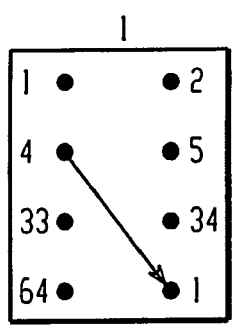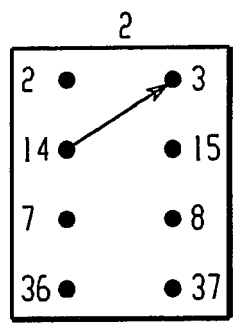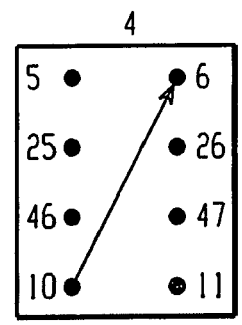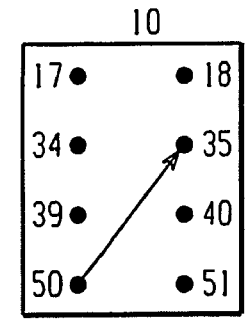
Fig. 13(c)
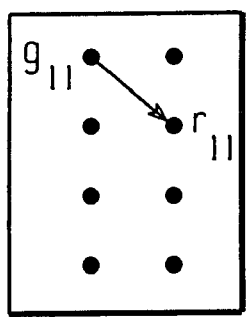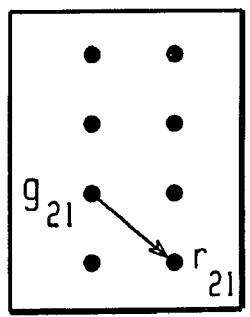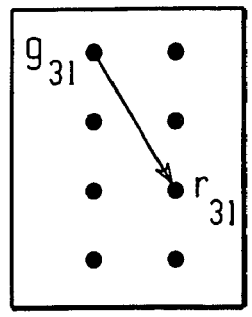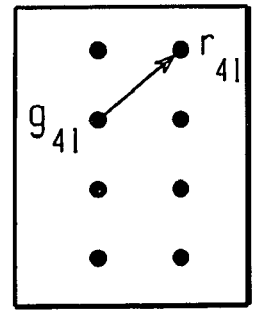
Fig. 14(a)

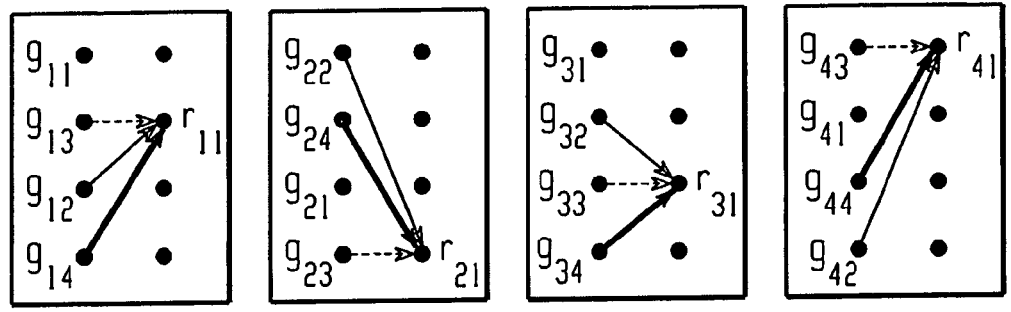
Fig. 14(b)
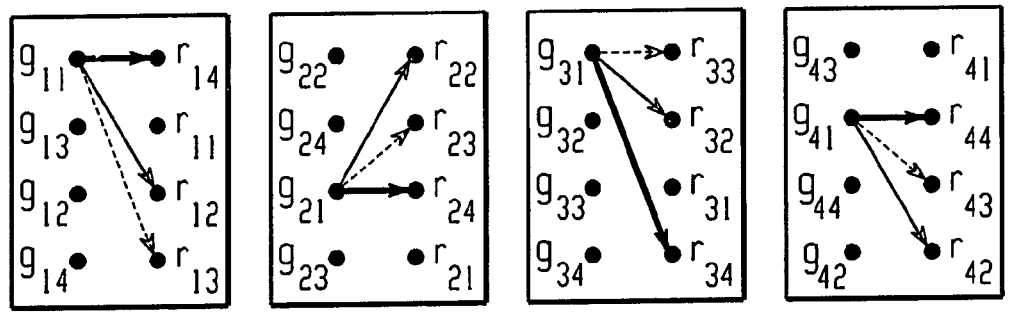
Fig. 14(c)
Fig. 15(a)
Fig. 15(b)
Fig. 15(c)

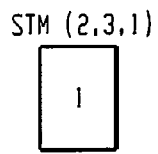
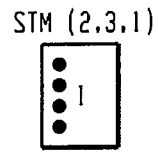
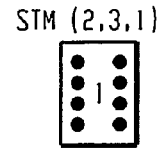
Fig. 16(a)   Fig. 16(b)   Fig. 16(c)
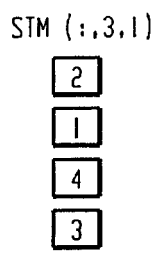
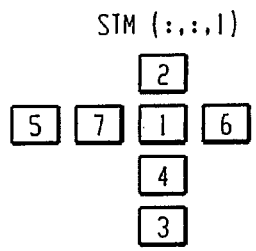
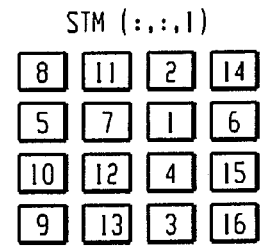
Fig. 16(d)   Fig. 16(e)   Fig. 16(f)
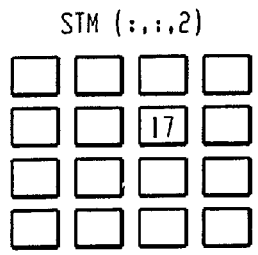
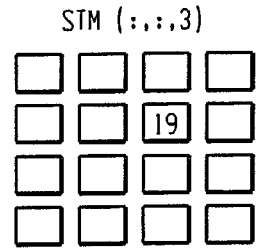
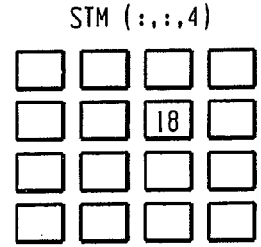
Fig. 16(g)   Fig. 16(h)   Fig. 16(i)
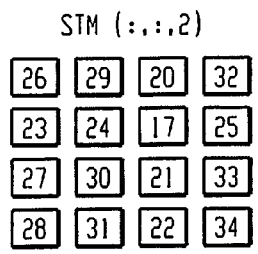
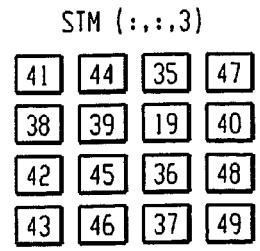
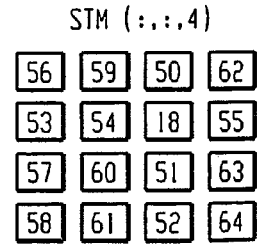
Fig. 16(j)   Fig. 16(k)   Fig. 16(l)

STM (2,3)

| | |
|---|---|
| 1 | 1 |
| 64 | 2 |
| 4 | 5 |
| 33 | 34 |

Fig. 17(a)

STM (:,3)

| | |
|---|---|
| 2 | 3 |
| 7 | 8 |
| 14 | 15 |
| 36 | 37 |

| | |
|---|---|
| 1 | 1 |
| 64 | 2 |
| 4 | 5 |
| 33 | 34 |

| | |
|---|---|
| 34 | 35 |
| 17 | 18 |
| 50 | 51 |
| 39 | 40 |

| | |
|---|---|
| 5 | 6 |
| 25 | 26 |
| 10 | 11 |
| 46 | 47 |

Fig. 17(b)

STM (:,:)

| | | | | | | | |
|---|---|---|---|---|---|---|---|
| | | | | 2 | 3 | | |
| | | | | 7 | 8 | | |
| | | | | 14 | 15 | | |
| | | | | 36 | 37 | | |

| | | | | | | | |
|---|---|---|---|---|---|---|---|
| 6 | 64 | 3 | 4 | 1 | 1 | 35 | 33 |
| 63 | 7 | 13 | 14 | 64 | 2 | 32 | 36 |
| 16 | 25 | 9 | 10 | 4 | 5 | 38 | 46 |
| 24 | 17 | 49 | 50 | 33 | 34 | 45 | 39 |

| | |
|---|---|
| 34 | 35 |
| 17 | 18 |
| 50 | 51 |
| 39 | 40 |

| | |
|---|---|
| 5 | 6 |
| 25 | 26 |
| 10 | 11 |
| 46 | 47 |

Fig. 17(c)

| | | | | | | | |
|---|---|---|---|---|---|---|---|
| 26 | 13 | 8 | 9 | 2 | 3 | 18 | 49 |
| 12 | 27 | 27 | 28 | 7 | 8 | 48 | 19 |
| 54 | 53 | 28 | 29 | 14 | 15 | 56 | 42 |
| 52 | 55 | 19 | 20 | 36 | 37 | 41 | 57 |
| 6 | 64 | 3 | 4 | 1 | 1 | 35 | 33 |
| 63 | 7 | 13 | 14 | 64 | 2 | 32 | 36 |
| 16 | 25 | 9 | 10 | 4 | 5 | 38 | 46 |
| 24 | 17 | 49 | 50 | 33 | 34 | 45 | 39 |
| 47 | 32 | 37 | 38 | 34 | 35 | 40 | 45 |
| 31 | 48 | 55 | 56 | 17 | 18 | 44 | 41 |
| 43 | 23 | 20 | 21 | 50 | 51 | 58 | 60 |
| 22 | 44 | 57 | 58 | 39 | 40 | 59 | 59 |
| 11 | 63 | 15 | 16 | 5 | 6 | 51 | 24 |
| 62 | 12 | 53 | 54 | 25 | 26 | 23 | 52 |
| 30 | 62 | 29 | 30 | 10 | 11 | 21 | 61 |
| 61 | 31 | 42 | 43 | 46 | 47 | 60 | 22 |

Fig. 17(d)

$$\begin{array}{rrr} 1 & 2 & 3 \\ 1 & -2 & -3 \\ -1 & 2 & -3 \\ -1 & -2 & 3 \end{array} \qquad \begin{array}{rrr} 1 & 2 & -3 \\ 1 & -2 & 3 \\ -1 & 2 & 3 \\ -1 & -2 & -3 \end{array}$$

$$\begin{array}{rrr} 1 & 3 & 5 \\ -1 & 4 & 6 \\ 2 & -3 & -6 \\ -2 & -4 & -5 \end{array}$$

$$\begin{array}{rrr} 1 & 3 & 5 \\ -1 & 4 & 6 \\ 2 & -3 & -6 \\ -2 & -4 & -5 \end{array} \quad \begin{array}{rrr} 1 & -3 & -5 \\ -1 & -4 & -6 \\ 2 & 3 & 6 \\ -2 & 4 & 5 \end{array} \quad \begin{array}{rrr} -1 & 3 & -5 \\ 1 & 4 & -6 \\ -2 & -3 & 6 \\ 2 & -4 & 5 \end{array} \quad \begin{array}{rrr} -1 & -3 & 5 \\ 1 & -4 & 6 \\ -2 & 3 & -6 \\ 2 & 4 & -5 \end{array}$$
(1) (2) (3) (4)

IIS(:,1,1)

IIS(:,1,1)

IIS(:,1,1)

IIS(:,:,1)

| | | | |
|---|---|---|---|
| 1  3  -1  -2<br>3  4  -3  -4<br>-1  1  2  -2<br>5  6  -6  -5 | -1  1  -2  2<br>17 18 -17 -18<br>21 22 -22 -21<br>-13 13 -14 14<br>-17 -18 17 18<br>-5 -6  6  5 | 1 -3  -4  3<br>-1 -3  -4  3<br>13 -13 14 -14<br>-13 -17 -18 17<br>13 -19 -20 19<br>-11 -12 12 11 | |
| 1  9  -1  -2<br>9 10 -9 -10<br>11 12 -12 -11 | 1 19 -9 -23<br>-1 20 -10 -24<br>-2 -19 9 24<br>2 -20 10 23<br>13 -19 -20 19<br>-13 -20 -12 11 | -13 -9 -23<br>-13 -10 -24<br>14  9  24<br>-14 10 23<br>13 -19 -11<br>-13 -20 -12<br>13 20 11 | |
| 7 -3 -11<br>-7 -4 -12<br>-8 3 12<br>8 4 11 | 7 -17 -23<br>-7 -18 -24<br>-8 17 24<br>8 18 23<br>15 3 23<br>-15 4 24<br>16 -3 -24<br>-16 -4 -23<br>-15 17 11<br>15 18 12<br>-16 -17 -12<br>16 -18 -11 | | |
| -7 -9 -5<br>-7 -10 -6<br>-8 9 6<br>8 10 5 | 7 -19 -21<br>-7 -20 -22<br>8 19 22<br>-8 20 21<br>-15 9 21<br>15 10 22<br>-16 -9 -22<br>16 -10 -21<br>15 19 5<br>-15 20 6<br>16 -19 -6<br>-16 -20 -5 | | |

Fig. 22(e)

IIS(:,:,1)

| | | | |
|---|---|---|---|
| 1 3 -1 -2<br>3 4 -3 -4<br>-1 1 2 -2<br>5 6 -6 -5 | | -3  3<br>-4  4 | -5<br>-6<br>6<br>5 |
| 1  9  -1  -2<br>9 10 -9 -10<br>-1 -1  2 -2<br>11 12 -12 -11 | | -9  9<br>-10 10 | -11<br>-12<br>12<br>11 |
| 7 -3 -11<br>-7 -4 -12<br>-8 3 12<br>8 4 11 | -7 7<br>-8 8 | 3 -3<br>4 -4 | 11<br>12<br>-12<br>-11 |
| -7 -9 -5<br>-7 -10 -6<br>-8 9 6<br>8 10 5 | 7<br>-7<br>8<br>-8 | 9 -9<br>10 -10 | 5<br>6<br>-6<br>-5 |

IIS(:,:,2)

| | | | |
|---|---|---|---|
| -1  1 -2  2<br>33 34 -33 -34<br>41 42 -42 -41<br>13 -13 13 -14<br>-37 -38 37 38<br>-41 -42 42 41 | 1 -1  2 -2<br>37 38 -37 -38<br>45 46 -46 -45<br>-13 -13 14 14<br>-33 -34 33 34<br>-45 -46 46 45 | -1  1 -2  2<br>35 36 -35 -36<br>43 44 -44 -43<br>-13 13 -14 14<br>-39 -40 39 40<br>-43 -44 44 43 | 1 -1  2 -2<br>39 40 -39 -40<br>47 48 -48 -47<br>13 -13 14 -14<br>-35 -36 35 36<br>-47 -48 48 47 |
| -7  7 -8  8<br>-33 -34 33 34<br>-43 -44 44 43 | 7 -7  8 -8<br>-37 -38 37 38<br>47 48 -48 -47 | -7  7 -8  8<br>-35 -36 35 36<br>-47 -48 48 47 | 7 -7  8 -8<br>-39 -40 39 40<br>45 46 -46 -45 |
| 7 -7  8 -8<br>-35 -36 35 36<br>-41 -42 42 41 | -15 15 -16 16<br>33 34 -33 -34<br>45 46 -46 -45 | -15 -15 16 16<br>-35 -36 35 36<br>47 48 -48 -47 | -15 15 -16 16<br>35 36 -35 -36<br>45 46 -46 -45 |
| 15 -15 16 -16<br>39 40 -39 -40<br>41 42 -42 -41 | | | |

Fig. 22(i)

IIS(:,:,4)

| | | | |
|---|---|---|---|
| -5 -6  6  5<br>-21 -22 22 21<br>21 22 -22 -21<br>5  6 -6 -5 | -11 -12 12 11<br>-23 -24 24 23<br>23 24 -24 -23<br>11 12 -12 -11 | 11 12 -12 -11<br>23 24 -24 -23<br>-23 -24 24 23<br>-11 -12 12 11 | 5  6 -6 -5<br>21 22 -22 -21<br>-21 -22 22 21<br>-5 -6  6  5 |

Fig. 22(h)

IIS(:,:,4)

| -25 -33 -5 | 25 -37 -21 | -29 33 21 | 29 37 5 |
|---|---|---|---|
| 25 -34 -6 | -25 -38 -22 | 29 34 22 | -29 38 6 |
| 26 33 6 | 26 37 22 | -30 -33 -22 | 30 -37 -6 |
| -26 34 5 | -26 38 21 | 30 -34 -21 | -30 -38 -5 |
| 25 -35 -11 | -25 -39 -23 | 29 35 23 | -29 39 11 |
| -25 -36 -12 | 25 -40 -24 | -29 36 24 | 29 40 12 |
| 26 35 12 | 26 39 24 | 30 -35 -24 | -30 -39 -12 |
| -26 36 11 | -26 40 23 | -30 -36 -23 | 30 -40 -11 |
| 27 33 11 | 27 37 23 | -31 -33 -23 | 31 -37 -11 |
| -27 34 12 | -27 38 24 | 31 -34 -24 | -31 -38 -12 |
| -28 -33 -12 | -28 -37 -24 | -32 33 24 | 32 37 12 |
| 28 -34 -11 | 28 -38 -23 | 32 34 23 | -32 38 11 |
| 27 35 5 | -27 39 21 | 31 -35 -21 | -31 -39 -5 |
| -27 36 6 | 27 40 22 | -31 -36 -22 | 31 -40 -6 |
| -28 -35 -6 | -28 -39 -22 | 32 35 22 | 32 39 6 |
| 28 -36 -5 | 28 -40 -21 | -32 36 21 | -32 40 5 |

*Fig. 22(k)*

IIS(:,:,3)

| 25 -3 -41 | -25 -17 -45 | 29 3 45 | -29 17 41 |
|---|---|---|---|
| -25 -4 -42 | 25 -18 -46 | -29 4 46 | 29 18 42 |
| 26 3 42 | -26 17 46 | 30 -3 -46 | -30 -17 -42 |
| -26 4 41 | 26 18 45 | -30 -4 -45 | 30 -18 -41 |
| -25 -9 -43 | 25 -19 -47 | -29 9 47 | 29 19 43 |
| 25 -10 -44 | -25 -20 -48 | 29 10 48 | -29 20 44 |
| 26 9 44 | 26 19 48 | -30 -9 -48 | 30 -19 -44 |
| 26 10 43 | -26 20 47 | 30 -10 -47 | -30 -20 -43 |
| 27 3 43 | -27 17 47 | 31 -3 -47 | -31 -17 -43 |
| -27 4 44 | 27 18 48 | -31 -4 -48 | 31 -18 -44 |
| 28 -3 -44 | -28 -17 -48 | 32 3 48 | 32 17 44 |
| -28 -4 -43 | 28 -18 -47 | -32 4 47 | -32 18 43 |
| -27 9 41 | 27 19 45 | -31 -9 -45 | 31 -19 -41 |
| 27 10 42 | -27 20 46 | 31 -10 -46 | -31 -20 -42 |
| -28 -9 -42 | -28 -19 -46 | -32 9 46 | 32 19 42 |
| 28 -10 -41 | 28 -20 -45 | 32 10 45 | -32 20 41 |

*Fig. 22(j)*

APPARATUS AND METHOD OF CTCM ENCODING AND DECODING FOR A DIGITAL COMMUNICATION SYSTEM

GOVERNMENT RIGHTS CLAUSE

The U.S. Government may have certain rights in the present invention as a result of work performed under and/or for the following Air Force contracts: F30602-96-C-0176 and F30602-99-C-0064.

BACKGROUND OF THE INVENTION

The present invention is directed to encoders and decoders for a digital communication system, in general, and, more particularly, to apparatus and method of encoding and decoding utilizing a combination of circular trellis-coded modulation with permuted state structure and simplex signal constellation techniques for use in a digital communication system.

In a digital communication system such as shown by way of example in the block diagram schematic of FIG. 1, digital data information is provided by a source 10 in a coded information sequence to a channel encoder 14. Channel coding in encoder 14 transforms the information sequence to a sequence of code symbols called a code sequence or code word. The transformation is designed to improve communication performance by enabling the code sequence to better withstand various channel impairments, such as noise, fading, and jamming. A modulator 16 maps the code sequence to a sequence of channel symbols drawn from a predetermined signal constellation, for example. Channel symbols may be realized by analog waveforms to be transmitted by a conventional transmitter 20 over a channel which, for the purposes of this description is assumed to be a discrete memoryless channel (DMC) with additive white Gaussian noise (AWGN).

The channel symbols are received from the channel by a conventional receiver 22 and passed to a demodulator 24 which makes a definite decision (hard decision) or a quantized approximation (soft decision) for each received symbol to one of the symbols in the predetermined signal constellation. Those symbol values are fed into a channel decoder 26 to decide the code sequence and the corresponding information sequence which may be provided to an information sink. Spreading by a power spectrum spreader 30 maps the channel signals into an extended time or frequency range according to a certain mapping function before transmission. This has advantages in many aspects, such as anti-jamming Despreading by a power spectrum despreader 34 extracts the channels signals from their received spread format.

Adding a spread spectrum (SS) function to a communication system is generally done for power limited channel transmission without substantial limitation on bandwidth of the channel. Two criteria which are satisfied are first, the bandwidth of the transmitted signal should be much larger than the message bandwidth, and second, this bandwidth should be determined by some function that is independent of the message, known as PSEUDONOISE (PN), for example. Two prevalent types of SS are direct sequence (DS) and Frequency Hopping (FH). By using PN to shift the phase of a message in DS or to select the carrier frequency in FH pseudo randomly, the effect of spreading the message spectrum over a larger frequency range is achieved. Both systems can be coupled with a coded modulation scheme for transmission over a power-limited channel. Thus, coding gain and processing gain can be achieved at the same time.

In modem digital communication, the goal is to transmit data at a high rate and with low power. According to a generalization of Shannon's Theorem, one can communicate with arbitrary reliability, i.e. error probability as small as desired, so long as one does not transmit too fast. Performance of communication systems are measured by way of a Shannon graph which plots the ratio of energy per bit ($E_b$) over the power spectral density of background noise in the channel environment ($N_o$) along an abscissa and probability of bit error ($P_{BE}$) along the ordinate. An exemplary Shannon graph plotted on a log-log scale is shown in FIG. 2. In the graph, the ratio $E_b/N_o$ is a measure of energy efficiency in decibels (dB). All curves plotted on the graph will take the form of a waterfall and are commonly referred to as waterfall curves. One benchmark is a curve 40 produced by a simple form of bit-by-bit modulation which is referred to as binary phase shift keying (BPSK) which is compared to the Shannon limit curve 42 that is an idealistic standard.

The goal in the design of modem digital communication systems is to bring the associated waterfall curve as close as practically possible to the unrealizable Shannon limit curve 42. Error correction codes embedded in or redundant to the data codes assist in this process, but there is always a price to be paid as the performance is drawn closer and closer to the Shannon limit. This price includes error coding complexity which translates into higher costs and bandwidth or coding rate. As error codes become more and more complex, greater and greater computing power is needed which translates into dollars. Another price to be paid for error correcting codes is coding rate which is the ratio of data bits to total bits transmitted. For example, if for every data bit, two bits are transmitted over the channel, then a code rate of one-half is effected. Therefore, in order to transmit a data sequence with error codes, twice the bandwidth is needed than would be needed if error coding was not used. Thus, code rate translates directly into bandwidth efficiency. Thus, the error correcting capability of the system will be determined as a trade-off given the cost appropriated for the system, and the bandwidth and power requirements that the system has to operate within.

In the real world, a channel may be either power limited or bandwidth limited and there are always trade-offs to be made depending on the application with regard to the type of error correcting codes to be used and the complexity thereof. For example, in satellites or deep space probes that have a tight power budget, signals are to be transmitted with minimum possible energy per data bit in order to preserve the lifetime of the solar batteries providing power. However, antennas may be designed to accommodate very wide transmission bandwidths with little power. Therefore, in this application, it would be desirable to use an error correcting code which may be spread over a wide bandwidth, but uses as little power as possible. On the other hand, in a telephone system that has a very narrow transmission bandwidth, but has a large power capacity, an error correcting code may be chosen to have strong signal-to-noise characteristics with high code rates. Some communication systems are made more efficient by combining the coding and modulation steps into one step, like in trellis coded modulation (TCM) or block coded modulation which will become more evident from the description found herein below.

Error control coding is generally part of the channel coding in which a controlled redundancy to the information sequence is introduced to provide the transmitted code sequence with improved ability to combat error and provide a way for the receiver to detect or correct error during transmission over a noisy channel. Conventional error control codes in practice today may be divided into two general categories: block codes and convolutional codes. In block coding, the information sequence is segmented into blocks of fixed length k. The encoder transforms each block of k information symbols to a r-tuple vector known as a code word according to a certain rule defined by a generator matrix or polynomial, for example. k/r is defined as the code rate—a measure of information bits or symbols (k) per total bits or symbols (r) transmitted. Thus, (r−k) bits are the redundancy or check bits added to perform error detection or correction. The encoder encodes each k information symbols independently. Most decoding methods for block codes are algebraic operations such as syndrome decoding for linear block codes, for example. Reed-Solomon codes, which are a particular sub-set of a family of block codes referred to as BCH codes, is a commercially successful block code used in commercial and military electronic equipment today. Hamming code is another block code in frequent use.

It is understood that block codes may be made to correct as many errors as desired, but at a price, which is a deterioration of code rate. That is, adding more redundant bits increases the number of total bits r being transmitted for the same number of information bits k; thus, reducing the ratio of k/r or code rate. In addition, since the capacity or block of information bits is fixed in length, there may be much waste of resources. By way of example, suppose the system is transmitting English words of varying length with each transmission. Then, in order to ensure that all possible words are transmitted, the length of the block should be fixed to accommodate the longest word to be transmitted. Accordingly, wasted transmission capacity will result for all shorter words, especially those substantially shorter than the longest word.

Convolutional codes, on the other hand, need not use a fixed length of information bits nor do they compute a fixed number of redundant check bits to be appended thereto and thus, provide flexibility to accommodate finite words of varying length. Convolutional codes differ from block codes in that they generate redundancy bits "on-the-fly". The encoder for generating convolutional codes contains memory so that the r-tuple encoder output at any given time depends not only on the k-tuple input at that time instance but also on the previous K-input k-tuples. K is defined as constraint length (sometimes termed as memory order or stages of a linear shift register). An (k, r, K) convolutional code can be implemented with a k-input, r-output linear sequential circuit with input memory K, with $K=\max_{1 \leq i \leq k} K_i$, where $K_i$ is the number of the delay elements or stages in the $i_{th}$ shift register. The rate k/r has the same code rate significance as block codes. An exemplary binary (1,2,2) encoder for convolutional coding is shown in FIG. 3. The two code symbol streams V1 and V2 output from the encoder of FIG. 3 are multiplexed together. Accordingly, for every one bit of data, there are two bits output rendering a code rate of one-half.

State diagrams and trellis diagrams are frequently used to represent a convolutional code encoder. Viewing the convolutional encoder as a finite state machine driven by the information sequence results in a state diagram illustrating the state transitions related to each possible k-tuple input. FIG. 4 exemplifies a state diagram for the encoder shown in FIG. 3. The branch is labeled by the k-tuple input string together with the output code word. By extending the state diagram of FIG. 4 along the time dimension and merging the same state at the same time instance, a trellis diagram can be obtained such as that shown in FIG. 5. A node in a trellis denotes a state. A branch represents a state transition driven by a certain input information string. It is labeled by a code symbol the encoder outputs when that state transition occurs. The level of trellis at time $t_0$ is 0, and it increases by one at each time instance. From a starting state, all the states will be reached after a certain trellis level and then a fixed trellis section prevails. This trellis section completely describes the codes. A code word corresponding to an information sequence is represented by a sequence of state transitions along the time dimension, which is named as a trellis path. Any encoder defined by a finite state machine may be represented by a trellis and referred to as a trellis encoder. A circular trellis encoder is a type of trellis encoder in which each information sequence is mapped to a circular trellis path, i.e. a path having the same starting state and ending state. This state may be any one of the states in the circular trellis and is completely determined by the information sequence itself. In addition, all information conveyed by a trellis diagram may be also recorded in a table, referred to as a state transition table. Each transition in the table indicates the next state of the transition originating from any of the total states and driven by all possible k-tuple inputs. Use of convolutional or trellis coding in communication systems presumes that the starting state is known and agreed upon between the encoder and decoder stages thereof.

In circular trellis coding, the information sequence is truncated periodically with length L to have a block structure. In order to provide the same error protection to the last information symbol, a technique called trellis termination is employed to force the encoded trellis path to satisfy the state constraint that the starting and ending states of a trellis path should be the same. Zero tailing, tail biting, and circular trellis with permuted state structure are the three ways to do this. For a trellis code, usually 0 state is assumed. 0 state corresponds to the situation that the contents of the encoder shift register are all zeros initially. Zero tailing is one method used for trellis termination in which a certain number of zeros are appended to the truncated information sequence to force the encoded trellis path to go back to 0 state. For ease of understanding, consider a binary (1, r , K) convolutional code. In this case, K zeros are needed to append. For an information sequence of length L, the resultant code is a ((L+K)r,L) block code of rate (1/r)(L/(L+K))=(1/r)(1−K/(L+K)). The term K/(L+K) is called the rate loss due to zero tailing. To reduce the rate loss, the truncation period L is generally made as long as permissible.

An alternative method that does not introduce code rate loss is tail biting. For a binary (1, r, K) encoder, the encoder is first initialized by inputting the last K information bits of the information sequence into the encoder with its output being ignored, then, is input with all L information bits and the resultant L·r output bits is taken as the code word. The last K information bits will force the encoded path to go back to the initial state of the encoder. This state is fully determined by the input data sequence itself. It is a type of circular trellis coding. The resulting code is a (L, L·r) block code of rate 1/r.

Currently, zero tailing is the dominant practical method for trellis termination because of its simplicity and the fact that many efficient decoding algorithms were developed based on this assumption. Tail biting is only used for research to associate quasi-cyclic block codes with convolutional codes in order to apply convolutional decoding algorithm to block codes. A circular trellis coding with permuted state structure was introduced recently in the Dissertation of Yung-Cheng Lo, entitled "Circular Trellis-Coded Modulation In Spread Spectrum Communications", Ohio University, August 1997, in which the state constraint is satisfied by designing a permuted state transition table for the encoder without code rate loss or initializing the encoder.

In Lo's Dissertation referenced above, a circular trellis is denoted as T(n, D), where n is the number of exiting branches from each state. D which is called trellis depth is the number of stages needed to reach all the possible states from a starting state. The starting state of an information sequence can be any of the total states in this trellis. When the encoder accepts one q-ary information symbol at one time (this is the case for circular trellis coding with permuted state structure), n=q, i.e., the size of the information symbol alphabet. When it accepts k-tuple q-ary inputs at one time, $n=q^k$ In either case, the total number of states in this trellis is $S=n^D$. A state transition table may be built for this type of circular trellis using Zech's logarithm operating in a Galois finite field, GF(S). Then, in GF(S), a natural (1, S−1)-type permutation maybe expressed. By properly choosing the n out of the S "(1, S−1)-type permutation" and letting each of them associate with the state transitions driven by one of the n information symbol alphabets, a state transition table is constructed that guarantees each information sequence of length L≧D+1 will be mapped to a circular trellis path. And, the starting and ending states of this path is a function of the symbols in the information sequence. No zero padding or encoder initialization is needed in this coding scheme.

Moreover, the goal of channel coding is to achieve coding gain which is defined as the reduction in the required $E_b/N_0$ to achieve a specified error probability using the coded system versus an uncoded system, where $E_b$ is the average bit energy of the input data, $N_0$ is the one-sided power spectrum density of channel noise. In conventional communication systems, coding and modulation are separate processes. The coding gain is achieved at the price of bandwidth expansion by transmitting r-tuple code word instead of k-tuple data block in the same time slot. A trellis coded modulation (TCM) method combines coding and modulation into one process. Conventional TCM has been widely used in band-limited channels. With the development of spread spectrum communications, coded modulation for power-limited spread spectrum channels has become the latest research interest.

TCM was introduced to achieve coding gain without bandwidth expansion. More specifically, it combines a multilevel/phase signal constellation with a trellis coding scheme—usually a convolutional code. A larger signal constellation is used to provide the needed coding redundancy while keeping the same channel symbol rate (bandwidth) and average power as those of an uncoded system. FIG. 6 illustrates two multilevel/phase signal e constellations used by TCM, along with the corresponding uncoded system. The expanded signal set does result in reduced distance between adjacent signal points for a given signal power. However, because of the redundancy introduced by the code, this reduced distance no longer determines the error performance. Instead, the minimum Euclidean distance (ED) between all pairs of code sequences $\{a_n\}$ and $\{a'_n\}$, which the encoder can produce determines the error performance and is defined in the following equation:

$$d_{\min} = \min_{\{a_n\} \neq \{a'_n\}} \left[ \sum_n d^2(a_n, a'_n) \right]^{1/2},$$

where $d(a_n, a'_n)$ denotes the ED between channel signals $a_n$ and $a'_n$.

If soft-decision ML decoding is used, the error-event probability Pr(e) will asymptotically approach a lower bound at high signal-to-noise ratio as expressed in the following equation:

$$Pr(e) \geq N(d_{min})Q(d_{min}/2\sigma_n),$$

where $N(d_{min})$ denotes the average number of error events with distance $d_{min}$, and Q(·) is the Gaussian error probability function. $\sigma_n^2$ is the variance of the channel noise.

Therefore, assigning signal points to the coded bits (or the state transitions in a trellis codes) in a way that maximizes the minimum ED is a way to improve system performance. An assignment procedure called "mapping by set partitioning" has been devised, which can always make the maximum minimum ED larger than the minimum distance between signal points in an uncoded system with the same data rate and average power; i.e., it can always get coding gain which can be calculated as:

$$G = \frac{(d_{\min}^2/S_{av})_{coded}}{(d_{\min}^2/S_{av})_{uncoded}}$$

where $S_{av}$ is the average signal power.

"Mapping by set partitioning" first successively partitions a channel signal constellation into subsets with increasing minimum distance between symbols in the subsets (refer to FIG. 7) and then maps the signal constellation to code bits according to the following rules: All channel symbols are assigned with equal frequency and symmetry.

1. All parallel transitions in the trellis structure are assigned the maximum possible ED.
2. All transitions diverging from or merging into a trellis state are assigned the next maximum possible ED separation.

Applying the symbol assignment rules to an 8-state trellis by way of example as shown in FIG. 8, gives $(d_{min})_{coded}$= 2.141. Taking an uncoded 4-PSK as reference, $(d_{min})_{uncoded}$= 1.414. Here, the coding gain for 2/3 rate coded 8-PSK is 3.6 dB.

In the CTCM with permuted state structure of the Lo Dissertation referenced above, the goal was to achieve coding gain, processing gain, and power efficiency at the same time. Orthogonal and bi-orthogonal signal constellations were researched, but they are not optimal for power limited channels. It has been shown in the Master's Thesis of Frank A. Alder, entitled "Signal Assignment and Performance of Simplex Signaling in High Dimensional Trellis-Coded Modulation", Ohio University, August 1998, that a simplex signal set achieves the same error probability as an equally likely orthogonal set while using the minimum energy. It is considered the optimum signal set to achieve power efficiency. A simplex is a set of M signals in an N-dimensional space with N≧M−1, satisfying that for all i, j∈{1,2, . . . , M}, the cross-correlation between signals $s_i$ and $s_j$ is $$s_i \cdot s_j = \begin{cases} 1, & i = j \\ \frac{-1}{M-1}, & i \neq j \end{cases},$$

for normalized signal energy. It can be verified that these M signals have equal distance from each other.

CTCM using simplex signaling was explored in the above referenced Alder Thesis for very small trellises. But no systematic way to build the signal constellation and the symbol assignment therefor has of yet been described. As a result, the error distance property of these codes cannot be analyzed systematically for practical use. In addition, efficient decoding has not been investigated for these codes heretofore.

There are several efficient decoding algorithms developed for conventional TCM, such as sequential decoding, threshold decoding, Viterbi decoding, and the BCJR algorithm, for example. Among them, the Viterbi algorithm, which has been shown to be a dynamic ML decoding algorithm, is the most frequently used in practice. It is optimal in the sense that it minimizes the probability of code word error. The BCJR algorithm is also considered optimal in that it minimizes the probability of symbol (or bit) error, but is much less popular than Viterbi algorithm and is almost never applied in practical systems. The reason for this is that it yields performance in terms of symbol error probability only slightly superior to the Viterbi algorithm, yet it presents a much higher complexity. Both Viterbi and BCJR algorithm require the starting state or the distribution of the starting state be known a priori. This is not the case for circular trellis coding with permuted state structure. The optimum maximum likelihood (ML) decoding for circular trellis is to run the Viterbi algorithm the number of total states times, each for one possible starting state. This is obviously not desirable for large trellis. Hence, it would be desirable to investigate the BCJR algorithm again for use in the decoding process in this case, but first, the probability of the distribution of the starting state needs to be solved. John B. Anderson and Stephen M. Hladik in their paper entitled "Tailbiting MAP Decoders", IEEE Journal on Selected Areas in Communications, vol. 16, No. 2, February 1998, pp 297–302 (see also U.S. Pat. No. 5,721,746, Feb. 24, 1998) extended BCJR algorithm to tail biting codes and this extension is referred to as the circular BCJR algorithm.

SUMMARY OF THE INVENTION

In accordance with one aspect of the present invention, a method of building systematically a multi-dimensional (n, D, L) circular trellis coded modulation (CTCM) encoder with properties of optimal energy efficiency, strong tail biting and maximum minimum distance ($d_{min}$) of trellis paths, where n is the size of the symbol alphabet, D is the depth of the trellis, and L is the length of the information symbol sequence comprises the steps of: (a) identifying simplex-transition sets of originating and next states for each stage i of the circular trellis; (b) determining butterfly structures associated with the identified simplex-transition sets wherein the originating and next states of said simplex-transition sets are arranged in an internal order within said butterfly structures; (c) aligning said butterfly structures into a multi-dimensional state transition matrix (STM) in a predetermined order; (d) constructing a simplex of channel symbols from a multi-dimensional signal constellation space for each of said identified simplex-transition sets; (e) aligning each simplex into a multi-dimensional initial input simplex (IIS) matrix in an order in relation to said predetermined order of butterfly structures in said STM; and (f) assigning channel symbols to state transitions of a trellis path by mapping between said simplex-transitions of the STM and said simplexes of said IIS matrix.

In accordance with another aspect of the present invention, a communication system for use in a power limited channel application comprises: a circular trellis coded modulation (CTCM) encoder for converting a sequence of digital information bits of a predetermined length into a corresponding sequence of channel symbols based on a circular trellis path associated with the sequence of digital information bits and a set of simplexes identified for said path from a multi-dimensional signal constellation, said CTCM encoder including means for determining an initial starting state of the trellis path which renders the path circular without the addition of redundant bits to the sequence of digital information bits; a transmitter coupled to said CTCM encoder for transmitting said sequence of channel symbols over said channel; a receiver for receiving a transmission from said transmitter including said sequence of channel symbols and any noise induced therein; a CTCM decoder coupled to said receiver for decoding the received transmission without knowledge of the starting state of the circular trellis path of the CTCM encoder to recover the sequence of information bits.

In accordance with yet another aspect of the present invention, a circular trellis coded modulation (CTCM) encoder for converting a sequence of digital information bits of a predetermined length into a corresponding sequence of channel symbols based on a circular trellis path associated with the sequence of digital information bits and a set of simplexes identified for said path from a multi-dimensional signal constellation comprises: means for determining an initial starting state of the trellis path which renders the path circular without the addition of redundant bits to the sequence of digital information bits; first means for storing a representation of a multi-dimensional matrix of simplexes of channel symbols, said simplexes being arranged in said matrix in an ordered relationship to identified state transitions of the trellis path; and means for converting the sequence of digital information bits into the corresponding sequence of channel symbols of the trellis path by operating on the sequence of digital information bits in accordance with said stored matrix representation. This aspect of the present invention includes a method of circular trellis coded modulation (CTCM) encoding by converting a sequence of digital information bits of a predetermined length into a corresponding sequence of channel symbols based on a circular trellis path associated with the sequence of digital information bits and a set of simplexes identified for said path from a multi-dimensional signal constellation.

In accordance with still another aspect of the present invention, a method of decoding a received sequence of channel symbols, denoted as $Y_1^L = Y_1, Y_2, \ldots, Y_L$, where L is the sequence length, from a channel to obtain a sequence of symbols $X_1^L = X_1, X_2, \ldots, X_L$, belonging to the signal constellation of an encoder comprises the steps of: (a) hard decoding $Y_t$ for each t of the sequence using the probability expression $P(Y_t/X_t) = \max P(Y_t/X)$, for all X, i.e. $X_1, X_2, \ldots, X_L$, where $P(Y_t/X)$ is a function of the Euclidean distance between $Y_t$ and X and a noise spectrum density of the channel; (b) selecting $Y_t$ having the largest $P(Y_t/X_t)$ as $Y_i$; (c) circular shifting the sequence $Y_1^L$ using $Y_i$ as the starting symbol; and (d) decoding the circular shifted sequence by an iterative circular BCJR algorithm to obtain a corresponding information symbol sequence.

BRIEF DESCRIPTION OF THE DRAWINGS

FIG. 9 is a table exemplifying a state transitions with permuted state structure for a CTCM (4,3) encoder.

FIGS. 12A–12C illustrate a table of all of the paths of a CTCM (4,3) in which L=4.

FIGS. 13(a)–13(c) illustrate simplex-transition butterfly sets for various stages of a CTCM (4,3).

FIGS. 14(a)–14(c) illustrate ordered arrangement of states of simplex transitions within butterfly sets.

FIGS. 15(a)–15(c) illustrate an ordered arrangement of originating and next states of simplex transitions in butterfly sets.

FIGS. 16(a)–16(l) illustrate an ordered arrangement of simplex transition butterfly sets in a state transition matrix (STM).

FIGS. 17(a)–17(d) illustrate an ordered arrangement of simplex transition butterfly sets for a CTCM (4,3) in a STM.

FIG. 21(a)–21(c) illustrate an ordering of member symbols of simplex in accordance with "fill" and "copy" rules.

Figures 22F, 22G:
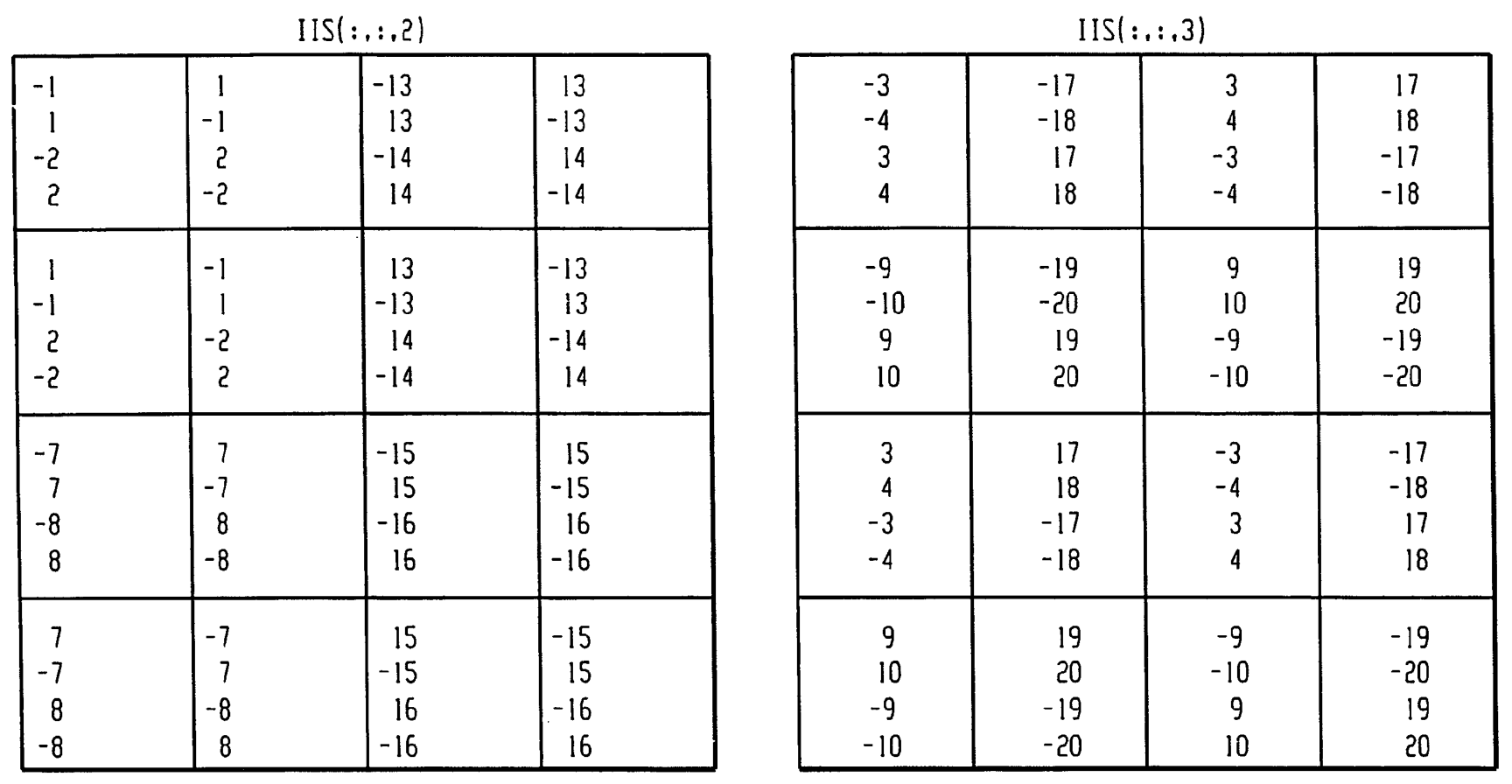

FIGS. 22(a)–22(k) illustrate a building of an ordered arrangement of member symbols of simplexes into an IIS matrix based on a one-to-one mapping with a corresponding STM.

DETAILED DESCRIPTION OF THE INVENTION

Figure 1:
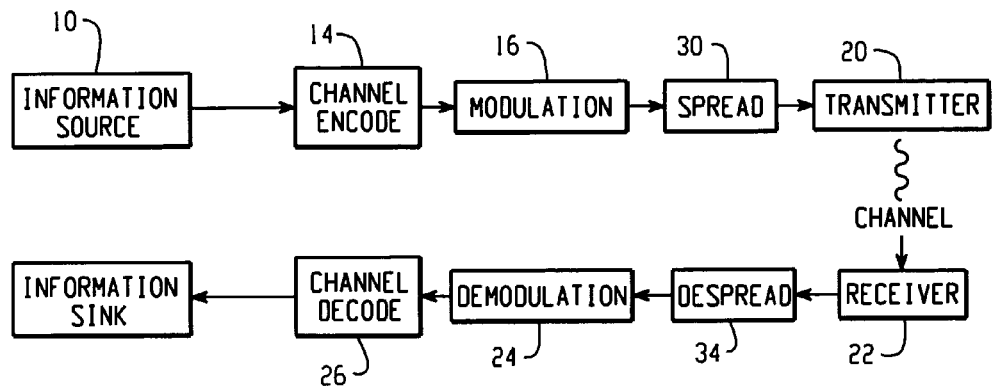
FIG. 1 is a block diagram of an exemplary digital communication system suitable for embodying the principles of the present invention.
Figure 2:
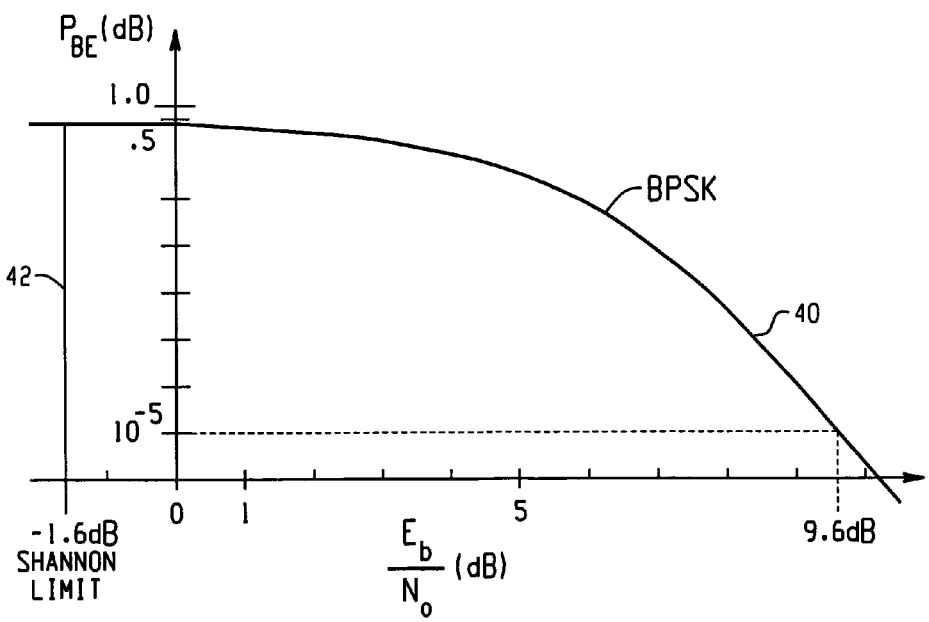
FIG. 2 is an exemplary graph depicting performance of a communication system plotted on a log-log scale.
Figure 3:
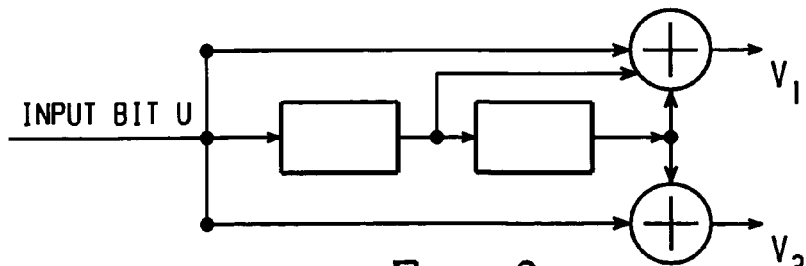
FIG. 3 is a block diagram of an exemplary binary encoder for convolutional coding.
Figure 4:
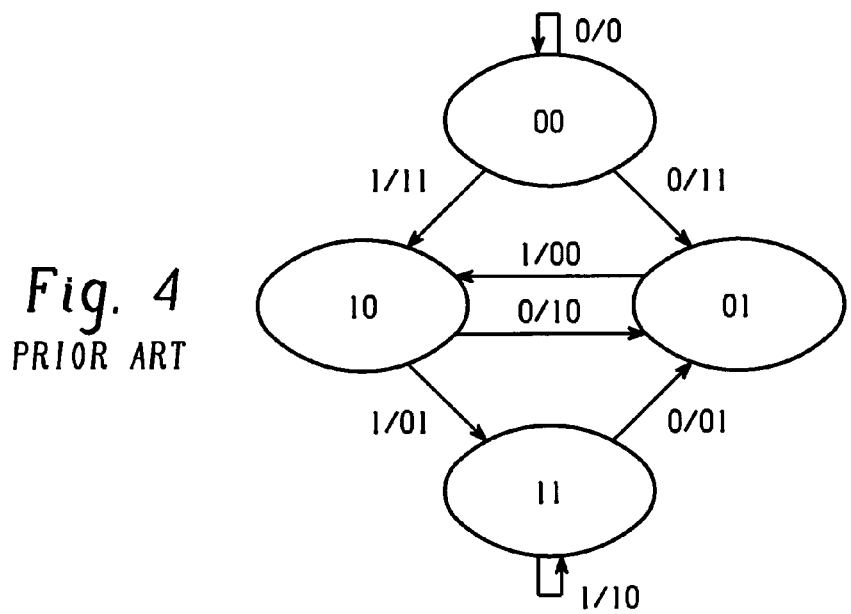
FIG. 4 is an exemplary state diagram for the encoder shown in FIG. 3.
Figure 5:
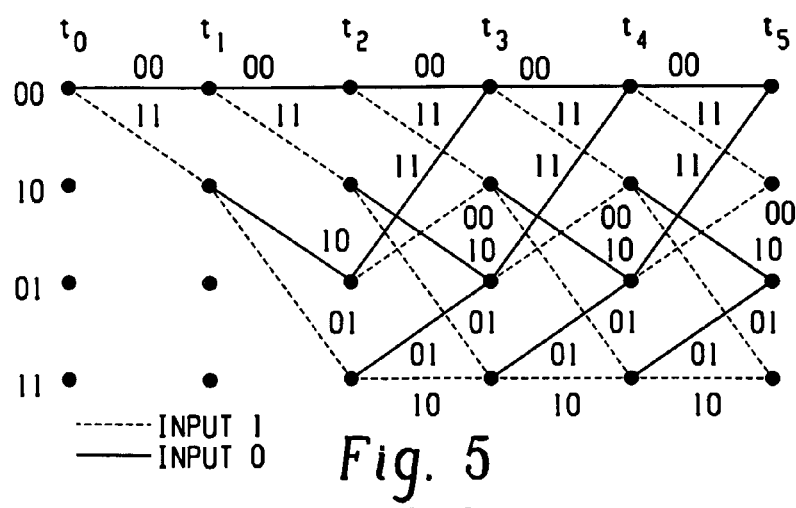
FIG. 5 is an exemplary trellis diagram showing states and transitions.
Figure 6:
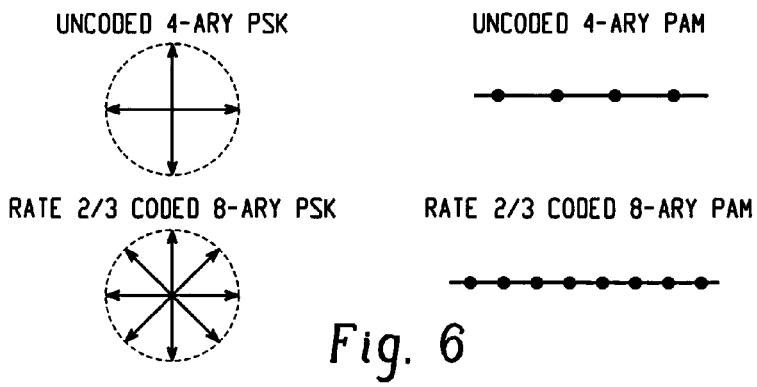
FIG. 6 is an illustration of a coded and an uncoded multilevel/phase signal constellation.
Figure 7:
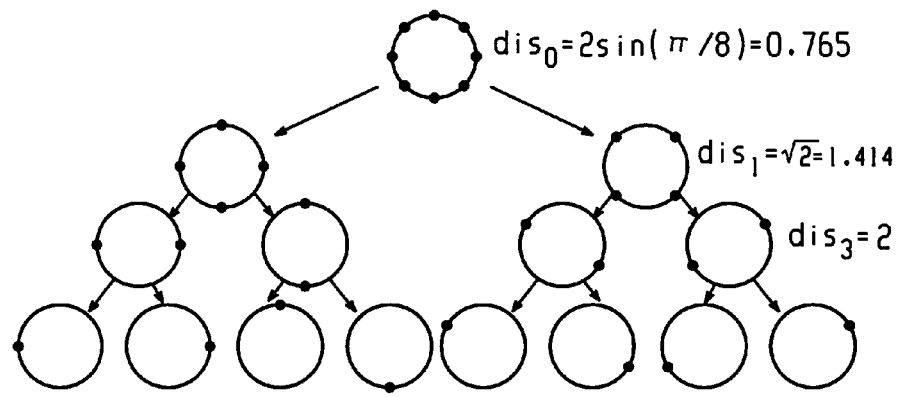
FIG. 7 is an illustration of successive partitions of a channel signal constellation into subsets with increasing minimum distance between symbols in the subsets.
Figure 8:
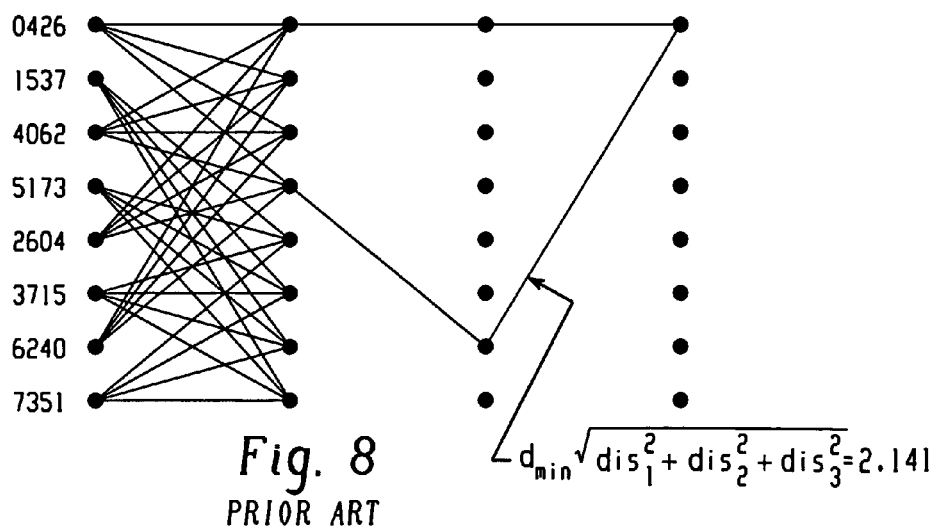
FIG. 8 is an exemplary 8-state trellis suitable for applying symbol assignment rules.

The building of a trellis-coded modulation encoder suitable for use in a communication system similar to the one described in connection with the embodiment of FIG. 1 involves the construction of a state transition table for the trellis of the encoder, the design of a signal constellation, and mapping rules between the symbols in the signal constellation and the state transitions. A circular trellis coded modulation (CTCM) encoder embodiment of one aspect of the present invention is described herein below, especially for power-limited channel applications.

The CTCM encoder of the present embodiment employs a circular trellis coding with permuted state structure. The state constraint is satisfied without code rate loss or initializing the encoder. It is done by designing a permuted state transition table for the encoder. A circular trellis may be denoted as T (n, D), where n is the number of exiting branches from each state, and D is called trellis depth, i.e. the number of stages needed to reach all the possible states from a starting state. This starting state may be any of the total states in this trellis. When the encoder accepts one q-ary information symbol at one time (this is the case for circular trellis coding with permuted state structure), n=q, i.e., the size of the information symbol alphabet. When it accepts k-tuple q-ary inputs at one time, $n=q^k$. In either case, the total number of states in this trellis is $S=n^D$.

In the present embodiment, the state transition table of the encoder is based on a family of permutations of the state set. To facilitate the construction of the permutations, the state set is chosen to be the finite field GF(S) and its elements are identified with their logarithms, 1, 2, ..., S−1 with respect to a primitive base. It is therefore necessary that S be a power of a prime. As the permutations are induced using the field operations, Zech logarithms are instrumental for concise representation. Each of the S permutations involved is an S−1 cycle leaving a different element of GF(S) fixed. Reflecting this structure, the expression 'a nature (1, S−1) state permutation' has often been used to refer to these permutations. The permutations are denoted $\sigma, \sigma_1, \ldots, \sigma_{S-1}$ as a way to refer to permutation $\sigma_i$ in terms of its fixed element i. To be precise, for $i \in \{\infty, 1, \ldots, S-1\}$, $\sigma_i = (Z(i), Z(i-1)+1, Z(i-2)+2, \ldots, Z(i-(S-2))+S-2)$, where Z denotes the Zech logarithm. This collection of permutations has the attractive property that any B-fold composition of elements of the collection has one and only one fixed element as long as B is not a multiple of S. It is this property that affords us the ability to assign to any information sequence a circular trellis path. Reflecting the size of our input alphabet, an effective subset of these permutations is chosen carefully to assure that our state transition table satisfies the desirable properties described below in this application (such as existence of butterflies, n-flies, ..., etc.) No zero padding or encoder initialization is needed in this coding scheme. For a description in greater detail of a permuted state transition table suitable for use in the present embodiment reference is made to the Dissertation of Yung-Cheng Lo, Ohio University 1997, referenced herein above, which is incorporated by reference herein.

A systematic way to build a multi-dimensional simplex signal constellation and a method of symbol assignment in connection therewith will be described herein below. In the description below, first a design criterion is determined and applied to the multi-dimensional CTCM. Next, a matrix is built to record all sets of state transitions that should be assigned simplexes. Then, a suitable simplex signal constellation and a method of symbol assignment therefor are described.

The goal of designing an error coding scheme for a communication system is to obtain coding gain, i.e., to get reduced error probability compared with an uncoded communication system at a specific signal-to-noise ratio. For a trellis coded modulation scheme, suppose a particular code sequence (trellis path) is transmitted, then the decoder will select one code sequence or trellis path that has the minimum distance to the received sequence in order to minimize the code word error. Denote the probability of making an incorrect decision on the code sequence as Pr(e). For AWGN channel with noise variance $\sigma_n^2$, Pr(e) will asymptotically approach the lower bound at high signal to noise ratio, i.e.

$$Pr(e) \geq N(d_{min})Q(d_{min}/2\sigma_n) \qquad (3)$$

where $d_{min}$ is defined as the minimum Euclidean distance (ED) between all pairs of code sequences, $N(d_{min})$ denotes the number of paths having distance $d_{min}$, and $Q(\cdot)$ is the Gaussian error probability function.

It is observed from the above expression (3) that the minimum distance of the code sequence is of primary importance to its error performance. Usually, $d_{min}$ will correspond to the minimum distance produced by an error path that splits and remerges with the transmitted path, since we would expect paths that do not remerge to keep accumulating distance. This error path is called the error event of the transmitted path. And the distance from this error event to the transmitted path is called free distance, denoted as $d_{free}$. In order to reduce Pr(e), it is desired to maximize $d_{free}$, for example. From Equation (3), it is also desirable that the number of code sequences having distance $d_{free}$ be small.

The symbol error probability, denoted as Pr(s), is usually of more interest than the code word probability Pr(e), and is defined as the ratio of the number of symbol errors over the symbols in the information sequence. In order to minimize the symbol error, it is further desired to have the information sequence corresponding to the decode path have a small number of symbols differing from the information sequence corresponding to the transmitted path. That is to say, the unmerged stages between the error event and the transmitted path should be made as small as possible. The error event having the minimum unmerged stage with the transmitted sequence is called the minimum error event. For a coding scheme with uniformity, taking any code sequence as the transmitted sequence will give the same arguments as above.

Accordingly, by analyzing the error events in a CTCM, sets of state transitions that should be assigned simplexes may be identified. Then, a multi-dimensional matrix may be designed to record them. First, the butterfly structure of trellis codes is given to facilitate the description. A circular trellis T (n, D) with permuted state structure may be denoted in the following description as CTCM(n, D), where n is the size of the information symbol alphabet and D is the trellis depth. Some other related system parameters are information symbol sequence length L, the number of space dimensions N of the signal constellation which will be built, and the total states $S=n^D$.

For all trellis codes, sets of p originating states and sets of q next states that have complete intra-connectivity, but no connectivity with other state sets may be identified. Such structure is called a (p, q) butterfly. The set of the originating states or the next states in a butterfly is named the originating state set or the next state set of that butterfly. In a butterfly, each of the p originating states has transitions to each of the q next states with p*q being the total number of transitions in a butterfly. The state transition table for a CTCM (n, D) built using the method described herein above in connection with Lo's Dissertation shows (n, n) butterflies. Since each state can be a member of one and only one butterfly's originating states set and one and only one butterfly's next states set, there are a total number of $S/n=n^{D-1}$ butterflies representing all the $n^{D-1} \cdot n = n^{D+1}$ state transitions in the state transition table.

EXAMPLE 1

Figure 10:
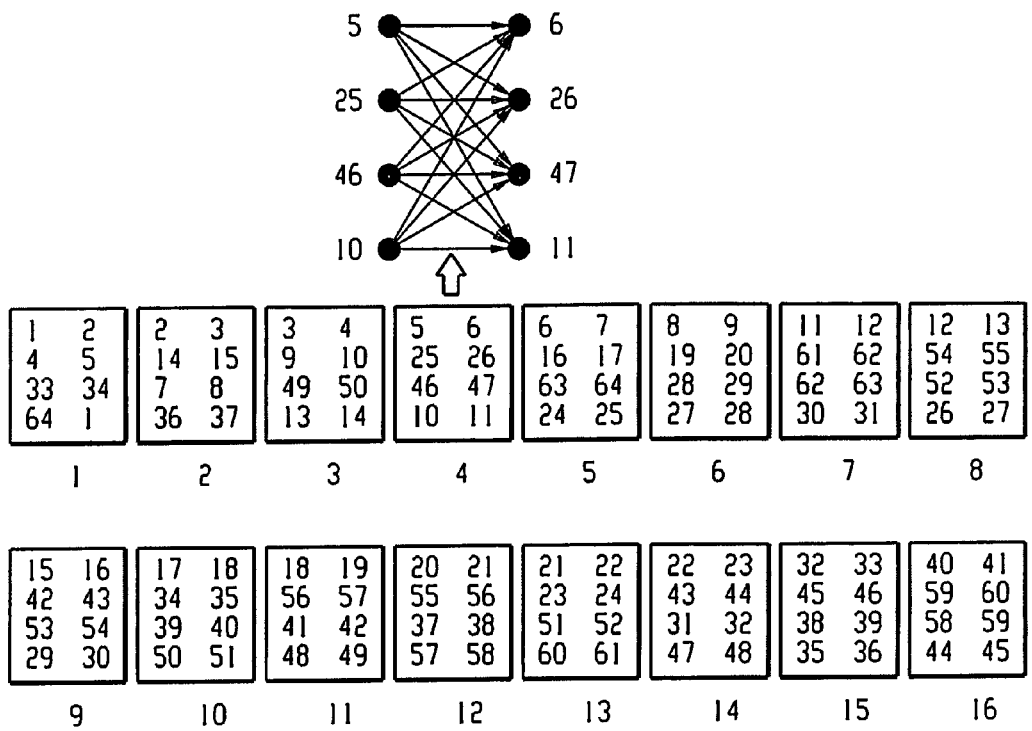
FIG. 10 is an illustration depicting 16 butterflies identified from the state transition table of FIG. 9.

Take CTCM (4,3) as an example. The state transition table for this example is shown in Table 1 of FIG. 9. The states are numbered by integer from 1 to 64. It can be found that any member of the set of states{1, 64, 4, 33} can transit to state 1, 2, 5, and 34. Then, the set of states {1, 64, 4, 33} and the set of states {1, 2,5, 34} build a butterfly with such states being the originating states set and the next states set of this butterfly, respectively. This butterfly may be written as butterfly {[1, 64, 4, 33], [1, 2, 5, 34]}. All 16 butterflies may be identified from Table 2 and are illustrated in FIG. 10, where each box represents a butterfly. The originating state set and next state set are in the left side and right side of a butterfly, respectively. By this representation, we regard a butterfly as an ordered structure and refer to a particular arrangement of the states in a butterfly as the internal order of a butterfly. For this example, the location of the state (or transition) in a butterfly is referred to as the internal location of the state (or transition). The internal location of an originating state or a next state from top to bottom in a butterfly is 1, 2, 3, and 4. In addition, the butterflies may be numbered arbitrarily by integer from 1 to 16 as shown in FIG. 10.

Figure 11:
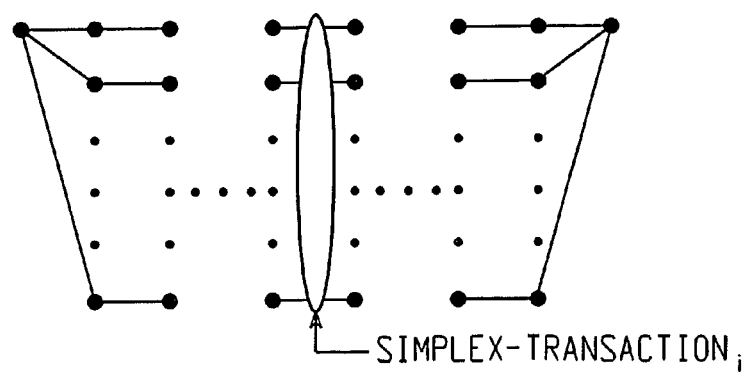
FIG. 11 is an illustration exemplifying the various paths of a circular trellis.

For this Example 1, let us consider the error events. As shown herein above, for a circular trellis CTCM (n, D) (with permuted state structure), the smallest information sequence length that can be employed is L=D+1 or 4 for this example. The minimum error events occur in this situation. There are a total number of $n^{D+1}$ or 256 paths in the trellis for this example. Each starting state associates with n or 4 paths diverging at the beginning and remerging at the last stage D+1 or 4 for this example (see FIG. 11). Given that each state transition occurs equally likely and there is no better knowledge to differentiate these n paths from each other, these n paths may be made equally distant from each other in this example. If one path is taken as the transmitted path, the minimum error events are the other n−1 paths. In order to make $d_{free}$ as large as possible and achieve energy efficiency in a power-limited channel, at each trellis stage the n state transitions on these n paths should be assigned a simplex and the set of such n state transitions may be considered a simplex-transition. A simplex-transition at stage i is denoted as simplex-transitions, i=1, 2, . . . , D+1 (see FIG. 11). Accordingly, for each stage i, the n paths associated with a certain starting state define a simplex-transition$_i$. Then, for all the possible starting states, there is a total number of $n^D$ or 64 simplex-transitions; for each i, i=1, 2, . . . , D+1. A particular state transition appears exactly once in a simplex-transitions; for all i, i=1, 2, . . . , D+1. The set of originating states or next states of the n transitions in a simplex-transition is called the originating state set or next state set of this simplex-transition.

EXAMPLE 2

For CTCM (4,3), Table 2 of FIGS. 12A–12C illustrates all of the 256 paths (rows of the table) for L=D+1=4, wherein the numbers in the columns of a row represent the states along a path with the starting state to the extreme left of each row and the ending state to the extreme right thereof. Transitions originate from states of column i to next states of the adjacent column going from left to right, said transitions representing the state transitions at stage i. The set of 4 state transitions at a stage i on the paths associated with a starting state constitute a simplex-transition$_i$; for each i, i=1, 2, 3, 4. Note that for this example, there are 64 simplex-transition$_i$'s; for each stage i, i=1, 2, 3, 4.

For instance, on the 4 paths associated with starting state 3, the set of state transitions at stage 2 (i.e. transitioning states between column 2 and column 3 of Table 2) constitute a simplex-transition$_2$ denoted as simplex-transition$_2$ {4→1, 14→3, 10→6, 50→35}. For a particular state transition—say 2→3—it can be verified that it appears exactly once in:
one simplex-transition$_1${2→3, 2→8, 2→15, 2→37},
one simplex-transition$_2${1→1, 2→3, 5→6, 34→35},
one simplex-transition$_3${26→13, 18→49, 2→3, 8→9}, and
one simplex-transition$_4${2→3, 14→3, 7→3, 36→3}. (end of example)

In general, for a CTCM (n, D), all $n^{D+1}$ distinct state transitions are represented in its $n^{D-1}$ butterflies. So, how the simplex-transitions are reflected in the butterflies may be analyzed. From FIG. 11, it can be seen that the n transitions in a simplex-transition$_1$, i.e. stage i=1, have a same originating state, so they are contained in the butterfly whose originating state set contains this originating state. They are the state transitions from this originating state in this butterfly to each of all the next states in this butterfly. The n transitions in a simplex-transition$_{D+1}$, i.e. stage i=D+1 or the last stage, have a same next state and are, therefore, contained in the butterfly whose next state set contains this next state. They are the state transitions from each of all the originating states to this next state in this butterfly. Each butterfly contains n simplex-transition$_1$'s and n simplex-transition$_{D+1}$'s. A total number of $n^{D-1}$ butterflies contain all the $n^D$ simplex-transition$_1$'s and simplex-transition$_{D+1}$'s (see FIG. 10). For the n transitions in a simplex-transitions, for the middle stages, i.e. 2≦i≦D, each transition has a different originating state and a different next state. Compared with the butterflies of the first and last stages, it can be seen that each transition of the middle stages is contained in a different butterfly. Accordingly, for the middle stages, it may be said that there are n butterflies associated with a simplex-transition$_i$.

EXAMPLE 3

For a CTCM (4,3), compare all the simplex-transitions's from Table 2 of FIGS. 12A–12C with all its 16 butterflies as shown in FIG. 10. For instance, on the 4 paths associated with starting state 3 of the first stage, the simplex-transition$_1$ {3→4, 3→14, 3→10, 3→50}, is contained in butterfly 3, as shown in FIG. 13(a). The simplex-transition$_4$ {2→3, 14→3, 7→3, 36→3} of the last stage is contained in butterfly 2, as shown in FIG. 13(b). The 4 transitions in simplex-transition$_2$ {4→1, 14→3, 10→6, 50→35} of a middle stage are contained in butterflies 1, 2, 4, and 10, respectively as shown in FIG. 13(c). Also, it can be verified that the other 15 transitions in each of the butterflies 1, 2, 4, and 10 constitute the other 15 simplex-transition$_2$'s. (end of example)

In general, for a CTCM (n, D), the following property is observed for a simplex-transition$_i$ of the middle stages, i.e. 2≦i≦D.

Property 1

Consider two simplex-transition$_i$'s: if the originating state (or next state) of a transition in one simplex-transition$_i$ is the same as the originating state (or next state) of a transition in the other simplex-transition$_i$, then the originating state set (or next state set) of one simplex-transitions will be identical to that of the other simplex-transition$_i$.

From this property, the following statement may be made.

Statement 1

For a simplex-transition$_i$, find the n butterflies associated with it. Then the other $n^2-1$ transitions in each of these n butterflies constitute the other $n^2-1$ simplex-transition$_i$'s.

As proof, if the n butterflies associated with the first simplex-transition$_i$ are numbered as butterfly m, m=1, 2, ..., n, the originating states and next states in butterfly m will be labeled using $g_{mj}$ and $r_{mj}$, j=1, 2, ..., n. Moreover, each of the n transitions in a simplex-transition$_i$ of a middle stage is contained in a different butterfly (see FIG. 14(a)). So, for the first simplex-transition$_i$, the originating state and next state of the transition contained in butterfly m may be labeled as $g_{m1}$ and $r_{m1}$, respectively, and then this first simplex-transition$_i$ is expressed as $\{g_{m1} \to r_{m1} | m=1, \ldots, n\}$.

Now, consider the other transitions in these n butterflies. For a particular butterfly m', m'=1, 2, ..., n, there are other n−1 transitions having $r_{m'1}$ as next state. Label them as $g_{m'k} \to r_{m'1}$, k=2, 3, ..., n (see FIG. 14(b)). For each k, consider a new simplex-transition containing transition $g_{m'k} \to r_{m'1}$. The next state of transition $g_{m'k} \to r_{m'1}$ is $r_{m'1}$·$r_{m'1}$ is also the next state of the transition $g_{m1} \to r_{m1}$ in the first simplex-transition$_i$. From Property 1 above, the next state set of this new simplex-transition$_i$ will be identical to that of the first simplex-transition$_i$ which is the set of states $\{r_{m1} | m=1, \ldots, n\}$. This indicates that this new simplex-transition$_i$ is contained in these n butterflies. For this new simplex-transition$_i$, the transition contained in butterfly m, m≠m', may be labeled as $g_{mk} \to r_{m1}$. Then, this new simplex-transition$_i$ is expressed as $\{g_{mk} \to r_{m1} | m=1, \ldots, n\}$.

Similarly, there are other n−1 transitions originating from $g_{m'1}$ in butterfly m' which may be labeled as $g_{m'1} \to r_{m'k}$, k=2, 3, ..., n (see FIG. 14(c)). For each k, a new simplex-transition containing the transition $g_{m'1} \to r_{m'k}$ will have the originating state set identical to that of the first simplex-transition$_i$, namely the set of states $\{g_{m1} | m=1, \ldots, n\}$ This indicates that this new simplex-transition$_i$ is also contained in these n butterflies. For this new simplex-transition$_i$, the transition contained in butterfly m, m≠m', may be labeled as $g_{m1} \to r_{mk}$. Then this new simplex-transition$_i$ is expressed as $\{g_{m1} \to r_{mk} | m=1, \ldots, n\}$.

So far, (n−1)+(n−1)=2n−2 more transitions in each of these n butterflies have been considered and they constitute 2n−2 new simplex-transition$_i$'s. The originating and next states in these n butterflies have been labeled as $g_{mj}$ and $r_{mj}$, j=1, 2, ..., n, respectively.

The transitions yet to be considered in butterfly m' are $g_{m's} \to r_{m't}$, where s, t=2, 3, ..., n. For each s and t, consider a new simplex-transition$_i$ containing the transition $g_{m's} \to r_{m't}$. From Property 1, it will have the originating state set identical to that of the simplex-transition$_i$ $\{g_{ms} \to r_{m1} | m=1, \ldots, n\}$ which is the set of states $\{g_{ms} | m=1, \ldots, n\}$. Also, it will have the next state set identical to that of the simplex-transition$_i$ {$g_{m1} \rightarrow r_{mt}$|m=1, . . . , n} which is the set of states {$r_{mt}$|m=1, . . . , n}. This shows that the new simplex-transition$_i$ is {$g_{ms} \rightarrow r_{mt}$|m=1, . . . , n}. So, it has been shown that the remaining (n−1)·(n−1)=n²−2n+1 unconsidered transitions in each butterfly also constitute the other (n−1)·(n−1)=n²−2n+1 new simplex-transition$_i$'s and that the set of transitions {$g_{mj} \rightarrow r_{mk}$|m=1, . . . , n} is a simplex-transition$_i$, for all j and k, j, k=1, 2, . . . , n.

In summary, it has been proven that in the n butterflies associated with a simplex-transition$_i$, all the n·(n·n) transitions will constitute a number of n·n simplex-transition$_i$'s. Later in this description, it may be said that these n butterflies constitute simplex-transition$_i$ and a set of n butterflies constituting simplex-transition$_i$ will be referred to as a simplex-transition$_i$-butterfly-set.

Continuing, for each stage i of the middle stages, i.e. 2≦i≦D, there are a number of $n^D$ simplex-transition$_i$'s. The total number of $n^{D-1}$ butterflies can be grouped into $n^{D-2}$ sets of n butterflies constituting simplex-transition, each set containing n² simplex-transition$_i$'s. Any particular butterfly is a member of a set of n butterflies constituting simplex-transitions for all i, 2≦i≦D.

EXAMPLE 4

For a CTCM (4,3), all the butterflies and simplex-transitions were solved in Examples 1 and 2 herein above. Using these solutions, the 4 simplex-transition$_2$-butterfly-sets may be identified as: butterfly set {1, 2, 4, 10}, butterfly set {3, 6, 9, 12}, butterfly set {5, 8, 7, 14}, and butterfly set {15, 11, 13, 16}; and the 4 simplex-transition$_3$-butterfly-sets may be identified as butterfly set {1, 3, 5, 15}, butterfly set {2, 6, 8, 11}, butterfly set {4, 9, 7, 13}, and butterfly set {10, 12, 14, 16}.

Note that the butterflies and all the paths at L=D+1 are completely determined by the state transition table, Table 1 of FIG. 9, so all sets of n transitions constituting simplex-transition$_i$'s where i=1, 2, . . . , D+1 and all sets of n butterflies constituting simplex-transition$_i$'s where i=2, 3, . . . , D are fixed in a CTCM for a given n and D.

How to build a convenient structure to record all the butterflies associated with the simplex-transitions will now be described. The proof of Statement 1 above has shown that in a simplex-transition$_i$-butterfly-set, by proper labeling, the set of transitions {$g_{mj} \rightarrow r_{mk}$|m=1, . . . , n} constitute a simplex-transition$_i$ for all j and k, j, k=1, 2, . . . , n. Since a butterfly has been represented as an ordered structure, if we place $g_{m'j}$ in butterflies m' in the same internal location as $g_{m''j}$ in butterfly m'', m', m''=1, 2, . . . , n, then the set of n transitions constituting a simplex-transition$_i$ will be in the same internal location of these n butterflies. An exemplary procedure of steps for accomplishing this will be described below.

Procedure 1

Initially, arrange the internal orders of butterflies in a simplex-transition$_i$-butterfly-set, i=2, 3, . . . , D, then, number these n butterflies as butterfly m, m=1, 2, . . . , n. The originating states and next states in butterfly m are to be labeled using $g_{mj}$ and $r_{mj}$, j=1, 2, . . . , n.

Step 1. Select any one of these n butterflies, say butterfly m'. Arrange the originating states and next states in the left side and right side in this butterfly arbitrarily and label them as $g_{m'j}$ and $r_{m'j}$ arbitrarily, j=1, 2, . . . , n.

Step 2. For each k, k=1, 2, . . . , n, identify the simplex-transition$_i$ containing transition $g_{m'k} \rightarrow r_{m'1}$. For this simplex-transition$_i$, label the transition contained in butterfly m, m≠m', as $g_{mk} \rightarrow r_{m1}$. Place $g_{mk}$ and $r_{m1}$ in butterfly m in the same internal location as $g_{m'k}$ and $r_{m'1}$ in butterfly m'.

Step 3. For each k, k=2, 3, . . . , n, identify the simplex-transition$_i$ containing transition $g_{m'1} \rightarrow r_{m'k}$. For this particular simplex-transition$_i$, label the transition in this simplex-transition contained in butterfly m, m≠m' as $g_{m1} \rightarrow r_{mk}$. Place $r_{mk}$ in butterfly m in the same internal location as $r_{m'k}$ in butterfly m'.

Following the proof of Statement 1, it can be verified that all the other set of n transitions {$g_{ms} \rightarrow r_{mt}$|m=1, . . . , n}, for all s and t, s, t=2, 3, . . . , n constitute simplex-transition$_i$, and are in the same internal location of these n butterflies.

From this procedure, it can be seen that one of the n butterflies' internal orders will fix all the other n−1 butterflies' internal orders in a simplex-transition$_i$-butterfly-set.

EXAMPLE 5

For a CTCM (4,3), from Example 4 above, it is known that butterfly set {1, 2, 4, 10} is a simplex-transition$_2$-butterfly-set and the internal order of states therein may be arranged according to Procedure 1 above in the following manner:

1. First choose any one of these four butterflies—say butterfly 2—and arrange the states in an arbitrary way (see FIG. 15(a)).
2. For each of the transitions 7→3, 2→3, 14→3 and 36→3, identify the simplex-transtition$_2$ containing this transition from Table 1 of FIGS. 12A–12C which are:
   simplex-transition$_2${7→3, 64→1, 25→6, 17→35},
   simplex-transition$_2${2→3, 1→1, 5→6, 34→35},
   simplex-transition$_2${14→3, 4→1, 10→6, 50→35} and
   simplex-transition$_2${36→3, 33→1, 46→6, 39→35}.

Then, the originating states 64, 1, 4, 33 and next state 1 should be placed in the same internal location in butterfly 1 as originating state 7, 2, 14, 36 and next state 3 in butterfly 2. Similarly, the locations of the originating states and one next state of butterflies 4 and 10 will be fixed (see FIG. 15(b)).

3. For each of the transitions 7→15, 7→37 and 7→8, the simplex-transition$_2$ containing this transition is
   simplex-transition$_2${7→15, 64→5, 25→11, 17→51},
   simplex-transition$_2${7→37, 64→34, 25→47, 17→40} and
   simplex-transition$_2${7→8, 64→2, 25→26, 17→18}.

Then, in butterfly 1, the next state 5, 34, 2 should be placed in the same internal location as the next state 15, 37, 8 in butterfly 2. Similarly, the locations of the three other next states of butterfly 4 and 10 will be fixed (see FIG. 15(c)).

Thus, for a CTCM (n, D), a total number of $n^{D-1}$ butterflies exist. Simplex-transition$_1$ of the first stage and simplex-transition$_{D+1}$ of the last stage are within a butterfly. Simplex-transition$_i$, of the middle stages, where 2≦i ≦D, are constituted by sets of n butterflies. Now, if a butterfly is regarded as a unit element with ordered structure, all such butterflies may be arranged in a D−1 dimensional matrix with n location indexes along each matrix dimension. This matrix may be referred to as the state transition matrix (STM). A location in STM is referred to using STM ($x_1$, $x_2$, . . . , $x_i$, . . . , $x_{D-1}$), where $x_k$ is the location index along the $k_{th}$ dimension of STM, $x_k \in$ {1, 2, . . . , n}, k=1, 2, . . . , D−1. The expression $x_k$=: mean $x_k$ can take any possible value and the expression STM ($x_1$, $x_2$, . . . , $x_{k-1}$,:, $x_{k+1}$, . . . , $x_{D-1}$) will re the n locations of the butterflies along the $k_{th}$ dimension. These n locations have the same location index $x_j$ along the $j_{th}$ dimension, where $j \neq k$. Also, the expression $x_k =: /m$, where $m \in \{1, 2, \ldots, n\}$, means $x_k$ can take any possible value except m.

Since any particular butterfly of the middle stages is a member of a set of n butterflies constituting simplex-transition$_i$, for all i, $2 \leq i \leq D$. A method to arrange all the butterflies into the STM such that the set of n butterflies constituting simplex-transition$_i$ are located in the n locations along the $(i-1)_{th}$ dimension of STM, i.e., STM $(x_1, x_2, \ldots, x_{i-2}, :, x_i, \ldots, X_{D-1})$, for all i, $2 \leq i \leq D$ will be described. There are $n_{D-2}$ possible combinations for $x_j$, $j \neq i-1$. A total number of $n^{D-2}$ sets of n locations along the $(i-1)_{th}$ dimension are used for placing all the $n^{D-2}$ sets of n butterflies constituting simplex-transition$_i$ for all i, $2 \leq i \leq D$. Also, the internal orders of the set of n butterflies constituting simplex-transition$_i$, where $2 \leq i \leq D$, can be arranged according to Procedure 1 such that the n transitions constituting a simplex-transitions are placed in the same internal location of these n butterflies. Then, in the STM, a simplex-transition$_i$, $2 \leq i \leq D$, will be the n transitions located in the same internal locations of a set of n butterflies along the $(i-1)_{th}$ dimension.

Note that Procedure 1 above only arranges the internal orders of the set of n butterflies constituting simplex-transition$_i$. When locating or indexing these n butterflies in STM $(x_1, x_2, \ldots, x_{i-2}, :, x_i, \ldots, x_{D-1})$, the order of indexing these n butterflies in these locations is not fixed in Procedure 1. It will be shown shortly in the procedure of building the STM that the first set of n butterflies constituting simplex-transition$_i$ can be placed into STM $(x_1, x_2, \ldots, x_{i-2}, :, x_i, \ldots, x_{D-1})$ in an arbitrary order, but a particular choice on this fix the order of placing all the other sets of n butterflies constituting simplex-transitions along the $(i-1)_{th}$ dimension of STM. A choice set called STM-FREE, whose member elements indicate a particular choice made for arranging the internal orders or the order of placing the n butterflies constituting simplex-transition$_i$ along the $(i-1)_{th}$ dimension when building STM may be defined in the procedure of building STM found herein below.

Procedure 2

For a CTCM (n, D), its butterflies are numbered from 1 to $n^{D-1}$.

1. First, select any butterfly, say butterfly 1, for example, and record this choice as STM-FREE (first butterfly). There are $n^{D-1}$ choices. Use n=4, D=4 for this example. Secondly, place this selected butterfly into any location in STM, say—STM $(l_1, l_2, \ldots, l_{D-1})$. Record a particular choice in STM-FREE (first location). There are $n^{D-1}$ choices (see FIG. 16(a), take $l_1=2$, $l_2=3$ and $l_3=1$). Then place the n originating states, represented by dots, in the left side of this butterfly in an arbitrary way (see FIG. 16(b)) and record a particular arrangement in STM-FREE (left side butterfly). There are n! different arrangements. Finally, place the n next states, also represented by dots, in the right side of this butterfly in an arbitrary way (see FIG. 16(c)) and record a particular arrangement in STM-FREE (night side butterfly). There are n! different arrangements. STM-FREE (left side butterfly, right side butterfly) completely fixes the internal order of this butterfly 1. Name this first selected butterfly as the anchor butterfly.

2. Build the first dimension. Identify the other n−1 (3 for this example) butterflies that constitute simplex-transition$_2$ with the anchor butterfly (butterfly 1 for this example). The internal orders of these n−1 butterflies are fixed with respect to the anchor butterfly using Procedure 1 above. They should be placed into locations along the first dimension of STM and should have the location indexes along all the other dimensions the same as anchor butterfly, i.e., the locations STM $(x_1, l_2, \ldots, l_{D-1})$ where $x_1=:/l_1$. The order of placing them may be arbitrary. There are (n−1)! different ways. Record a particular arrangement in STM-FREE ($1_{st}$ dimension). FIG. 16(d) illustrates this step 2, assuming that butterfly set $\{1, 2, 3, 4\}$ constitute simplex-transition$_2$.

3. Build the second dimension. Identify the other n−1 (3 for this example) butterflies that constitute simplex-transition$_3$ with the anchor butterfly. The internal orders of these n−1 butterflies are also fixed with respect to the anchor butterfly using Procedure 1. They should be placed into locations along the $2_{nd}$ dimension of STM and have the same location indexes along all the other dimensions as the anchor butterfly, i.e., the locations STM $(l_1, x_2, l_3, \ldots, l_{D-1})$ where $x_2=:/l_2$. The order of placing them may be arbitrary. There are (n−1)! different ways to place them. Record a particular arrangement in STM-FREE ($2_{nd}$ dimension). FIG. 16(e) illustrates this step 3, assuming that butterfly set $\{5, 1, 6, 7\}$ constitute simplex-transition$_3$.

4. For each $x_2$ where $x_2 \neq l_2$, regard the butterfly in STM $(l_1, x_2, l_3, \ldots, l_{D-1})$ as the new anchor butterfly. For example, regard butterfly 5 as the new anchor butterfly and repeat steps 2 and 3. The other n−1 butterflies constituting simplex-transition$_2$ with this new anchor butterfly will be identified. Their internal order is fixed with respect to this butterfly using Procedure 1 above. These n−1 butterflies should be placed in locations along the first dimension-STM $(x_1, x_2, l_3, \ldots, l_{D-1})$ where $x_1=:/l_4$ and denoted as $b_k$, k=1, 2, 3. This time, the order of placing them along the first dimension is now fixed. Suppose butterfly $b_k$ is to be placed in STM $(x_1, x_2, l_3, \ldots, l_{D-1})$ where $j \in \{1, 2, \ldots, n\}$ and $j \neq l_1$; that mean $b_k$ is a member of the simplex-transition$_3$-butterfly-set containing the butterfly in STM $(j, x_2, l_3, \ldots, l_{D-1})$ which has been placed in the previous stage. Since a particular butterfly is a member of one and only one simplex-transition$_3$-butterfly-set, so by cross-checking the membership of butterfly $b_k$ in the n−1 simplex-transition$_3$-butterfly-sets containing butterflies in STM $(x_1, l_2, l_3, \ldots, l_{D-1})$ where $x_1=:/l_1$, the location index of butterfly $b_k$ along t dimension is obtained (see FIG. 16(f)).

In FIG. 16(f), assume that butterfly 8, 9, and 10 constitute simplex-transition$_2$ with the newly chosen anchor butterfly 5, and the three of simplex-transition$_3$-butterfly-set containing butterfly 2, 3, 4 are butterfly $\{8, 11, 2, 14\}$, butterfly $\{10, 12, 4, 15\}$, and butterfly $\{9, 13, 3, 16\}$, respectively. Then butterfly 8, 9 and 10 should all have the same location index along the $2_{nd}$ dimension as butterfly 5 and have the same location index along the $1_{st}$ dimension as butterflies 2, 4, 3, respectively. Similarly, all the rest of the locations are filled with the proper butterflies. Thus, it is shown that the order of placing the other n−1 butterflies in the simplex-transition$_2$-butterfly-set and simplex-transition$_3$-butterfly-set containing the anchor butterfly fix all the butterflies' location in this two-dimensional place where the anchor butterfly is located.

5. Build the third dimension. Identify the other n−1 butterflies constituting simplex-transition$_4$ as the anchor butterfly; their internal order will be fixed using Procedure 1. They should be placed in STM $(l_1, l_2, x_3, \ldots, l_{D-1})$ where $x_3=:/l_3$. The order of placing them may be arbitrary. There are (n−1)! different ways to place them. Choose a particular arrangement and record it in STM-FREE ($3_{rd}$ dimension). See FIGS. 16(g), 16(h), and 16(i), assuming that butterfly {1, 17, 18, 19} constitute simplex-transition$_4$. For each $x_3$ where $x_3 \rightarrow l_3$, regard the butterfly in STM $(l_1, l_2, x_3, \ldots, l_{D-1})$ as the anchor butterfly. Repeat steps 2 and 3 above; butterflies from certain simplex-transition$_2$-butterfly-sets and simplex-transition$_3$-butterfly-sets will be identified and placed into the rest of locations in the two-dimensional plane containing this butterfly—STM $(:,:, x_3, l_4, \ldots, l_{D-1})$ and their locations are also fixed.

For each $x_3$ where $x_3 \neq l_3$, when repeating steps 2 and 3, the order of placing the butterflies constituting simplex-transition$_2$ with the butterfly in STM $(l_1, l_2, x_3, \ldots, l_{D-1})$ along the first dimension into STM $(x_1, l_2, x_3, l_4, \ldots, l_{D-1})$ where $x_1 =: /l_1$, will be fixed the memberships of these butterflies in the simplex-transition$_4$-butterfly-sets containing the butterflies in STM $(x_1, l_2, l_3, l_4, \ldots, l_{D-1})$ where $x_1 =: /l_1$. The order of placing the butterflies constituting simplex-transition$_3$ with the butterfly in STM $(l_1, l_2, x_3, \ldots, l_{D-1})$ along the second dimension into STM $(l_1, x_2, l_3, l_4, \ldots, l_{D-1})$, where $x_2 =: /l_2$ will be fixed by cross-checking the memberships of these butterflies in the simplex-transition$_4$-butterfly-sets containing the butterflies in STM $(l_1, x_2, l_3, l_4, \ldots, l_{D-1})$ where $x_2 =: /l_2$. Then, from the previous steps, this will consequently fix all other butterflies in this two-dimensional plane—STM $(:,:, x_3, l_4, \ldots, l_{D-1})$ (see FIG. 16($j$)).

In FIG. 16($j$), assume that butterfly 20, 21, and 22 constitute simplex-transition$_2$ with butterfly 17 and also assume that butterfly 23, 24, and 25 constitute simplex-transition$_3$ with butterfly 17. Then the locations of butterfly 20, 21, 22, 23, 24, and 25 will be fixed by cross-checking with simplex-transition$_4$-butterfly-sets containing butterfly 2, 3, 4 and 5, 6, 7. Assume butterfly 20 is in the simplex-transition$_4$-butterfly-set containing butterfly 2, butterfly 23 is in the simplex-transition$_4$-butterfly-set containing butterfly 5, then they should have the same location indexes along the first and second dimension in STM $(:,:,2)$ as butterfly 2 and 5 in STM$(:,:,1)$, respectively. By this way, proper sets of butterflies will be placed in the remaining locations in STM $(:,:,2)$. Similarly, the remaining locations in STM $(:,:,3)$ and STM$(:,:,4)$ will be filled (see FIGS. 16($k$) and 16($l$)). The internal order of all these butterflies will be fixed using Procedure 1.

6. Continuing in the same manner, fill the remaining locations along a new dimension of STM, until completely filling the D-1 dimensional matrix. At step i, the n-1 butterflies constituting simplex-transitions with the anchor butterfly will be placed into locations along the $(i-1)_{th}$ dimension, i.e., the locations STM$(l_1, l_2, \ldots, x_{i-1}, l_i, \ldots, l_{D-1})$ where $x_{i-1} =: /l_{i-1}$. The order of placing them in these locations may be arbitrary. Record a particular arrangement in STM-FREE ($(i-1)_{th}$ dimension). There are $(n-1)!$ different ways. Then, for each $x_{i-1}$ where $x_{i-1} \neq l_{i-1}$, regard the butterfly in STM$(l_1, l_2, \ldots, x_{i-1}, x_{i-1}, l_i, \ldots, x_{i-1}, l_1, \ldots, 1$ step 2 until step i-1, the unfilled locations in STM$(:,:, \ldots, :, x_{i-1}, l_i, \ldots, l_{D-1})$ will be filled by butterflies from certain simplex-transition$_2$-butterfly-sets, simplex-transition$_3$-butterfly-sets, $\ldots$, simplex-transition$_{i-1}$-butterfly-sets. The locations of all these butterflies used to fill are fixed; because when repeating step 2 until step i-1, the order of placing the butterflies constituting simplex-transition$_k$ where k=2, 3, $\ldots$, i-1 with this butterfly into STM$(l_1, l_2, \ldots, x_{k-1}, l_k, \ldots, l_{i-2}, l_i, \ldots, l_{D-1})$ where $x_{k-1} =: /l_{k-1}$ will be fixed by cross-checking the memberships in the simplex-transitions-butterfly-sets containing the butterflies in STM$(l_1, l_2, \ldots, x_{k-1}, l_k, \ldots, l_{i-2}, l_i, \ldots, l_{D-1})$ where $x_{k-1} =: /l_{k-1}$. The locations of those butterflies have been fixed in the previous steps. Then the locations of all of the remaining butterflies that should be placed in STM$(:,:, \ldots, :, x_{i-1}, l_i, \ldots, l_{D-1})$ are fixed. The internal orders of all butterflies are fixed using Procedure 1.

From Procedure 2 above, it is seen that the D+3 times choice defined in STM-FREE totally fix an STM. Changing one butterfly's internal order or the order of placing one set of the n butterflies along the $i_{th}$ dimension will cause corresponding change on all the other butterfly's internal order or the order of placing all the other sets of the n butterflies along the $i_{th}$ dimension, i=1, 2, $\ldots$, D-1 which implies that one butterfly's internal order will fix the internal order of all the other butterflies, i.e., define STM (left side butterfly, right side butterfly). The order of placing one set of the n butterflies along the it, dimension of STM will fix the order of placing all the other sets of n butterflies along the $i_{th}$ dimension, i.e., define STM-FREE ($i_{th}$ dimension). Placing the first selected butterfly in a location other than STM(1, 1, $\ldots$, 1) and keeping the other members in STM-FREE the same will result in a different STM. It can be verified that this resultant STM can also be built by first choosing the butterfly in the this resultant STM(1, 1, $\ldots$, 1) as the first selected butterfly, then placing it in STM (1, 1, $\ldots$, 1) and defining other members in STM-FREE accordingly which shows that we can always place the first selected butterfly in STM(1, 1, $\ldots$, 1) and still can get all the different STM's by defining the other members in STM-FREE. This gives the total number of different STM's for CTCM(n, D) as $n_{D-1} \cdot n! \cdot n! \cdot ((n-1)!)^{D-1}$.

EXAMPLE 6

Building an STM for CTCM(4, 3)

All sets of butterflies constituting simplex-transition$_2$ and simplex-transition$_3$ are listed in Example 4 above. A 2-dimensional STM of this example may be built as follows:

1. Select any butterfly from the butterflies 1–16 (see FIG. 10), arrange its internal order arbitrarily, and place it into any location in the STM. For this example, butterfly 1 is chosen and placed in STM (2, 3) (see FIG. 17($a$)).
2. Build the first dimension.

Simplex-transition$_2$-butterfly-set containing butterfly 1 is butterfly {1, 2, 4, 10}. So, butterflies 2, 4, and 10 are placed in locations STM(1, 3), STM(3, 3) and STM(4, 3) in an arbitrary order. The internal orders of them are fixed with respect to butterfly 1 using Procedure 1 (see FIG. 17($b$)).
3. Build the second dimension.

Simplex-transition$_3$-butterfly-set containing butterfly 1 is butterfly {1, 3, 5, 15}. So, butterflies 3, 5, and 15 are placed into locations STM(2, 1), STM(2, 2), and STM(2, 4) in an arbitrary order. Their internal orders are fixed with respect to butterfly 1 using Procedure 1 (see FIG. 17($c$)). Moreover, the other 3 butterflies constituting simplex-transition$_2$ with butterflies 3, 5, and 15, which are butterflies 6, 9, and 12, butterflies 7, 8, and 14 and butterflies 11, 13, and 16, may be placed into the remaining locations in STM(:,2), STM(:,1), and STM(:,4), respectively. Their location indexes along the first dimension will be fixed by cross-checking the membership in three sets of simplex-transition$_3$-butterfly-set containing butterflies in STM(1, 3), STM(3, 3), and STM(4, 3) which are butterfly set {2, 6, 8, 11}, butterfly set {10, 12, 14, 16}, and butterfly set {4, 9, 7, 13}, respectively. So, butterflies 6, 9, and 12 should be placed into STM(:,2) and have the same location index along the first dimension as butterfly 2, 4, and 10 in STM(:,3). And their internal orders are fixed with respect to butterfly 2, 4, and 10 using Procedure 1. Similarly, STM (:,1) and STM (:,4) are filled properly (see FIG. 17(d)).

It is now time to describe the construction of a simplex signal constellation in a multi-dimensional space and a mapping rule between the signal constellation and the state transitions of the STM constructed above. The description herein below will begin by providing what a simplex is and how it is represented in the context of a CTCM. Then, the concept of channel symbol assignment will be explained with a number of examples. And, finally, procedures for building a simplex signal constellation of channel symbols in connection with the STM described above and mapping (i.e. symbol assignment) the symbols to the transitions of the STM will be provided.

A. Algebraic Representation of Simplex

A simplex is a set of M signals in an N-dimensional space with $N \geq M-1$. For a circular trellis with permuted state structure, i.e. CTCM(n, D), where n is the size of the information symbol alphabet, a simplex is to be assigned to a set of n state transitions, that is to say the simplex should contain M=n signals. Non-binary transmission are often more efficient than binary transmission, and when M>4, the energy saving of simplex signaling over orthogonal signaling is not considered significant. So, for this embodiment, M=4 is chosen for practicality, i.e. CTCM(4, D). When M=4 and $N \geq 3$, a three-dimensional space is the smallest signal space to build a simplex that contains four member signals.

An algebraic representation for an exemplary simplex may now be introduced as follows. A simplex signal $s_i$, where i=1, 2, 3, 4, may be represented as a vector ($\pm a$, $\pm b$, $\pm c$), where a, b, c$\in$\{1, 2, . . . , N\} and N is the dimension of the signal space. This representation means that signal s, has negative (−) or positive (+) unit pulses in the $a_{th}$, $b_{th}$ and $c_{th}$ space dimension and 0's in all the other space dimensions. The element in this vector representation may be referred to as pulse-location and the $i_{th}$ element where i=1, 2, 3 as pulse-location$_i$. The value of pulse-locations is a signed integer. In signal $s_i$, the $\pm a$, $\pm b$ and $\pm c$ are the values of pulse-location$_1$, pulse-location$_2$, and pulse-location$_3$ respectively. This exemplary signaling scheme is called the 3-out-of-N simplex signaling scheme in which a, b, and c are the space dimensions occupied by a signal (or a simplex, or pulse-locations). The corresponding normalized signal $s_i$ is $$\sqrt{\frac{1}{3}}\,(\pm a, \pm b, \pm c).$$

This simplex will be written as simplex $\{s_i|i=1, 2, 3, 4\}$. There are two types of simplexes which are found suitable for the exemplary signal constellation.

Figures 18, 19A, 19B, 20A:
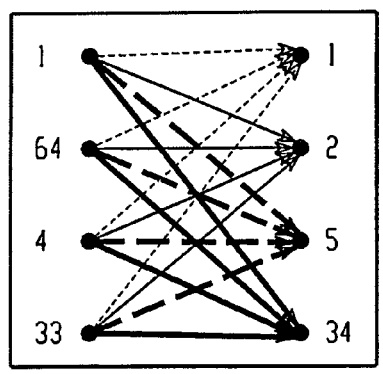
FIG. 18 illustrates even and odd source simplex types.
FIG. 19(a) illustrates signal pairs of an exemplary type B simplex and the "copy" rule associated therewith.
FIG. 19(b) illustrates how the members of the type B simplex of FIG. 19(a) relate to corresponding source simplexes and the ordered arrangement of such members therein.
FIGS. 20(a)–20(b) illustrate the assignment relationship of member symbols of a simplex to the transitions of a butterfly or butterfly set of two different stages of a trellis.
Figure 20:
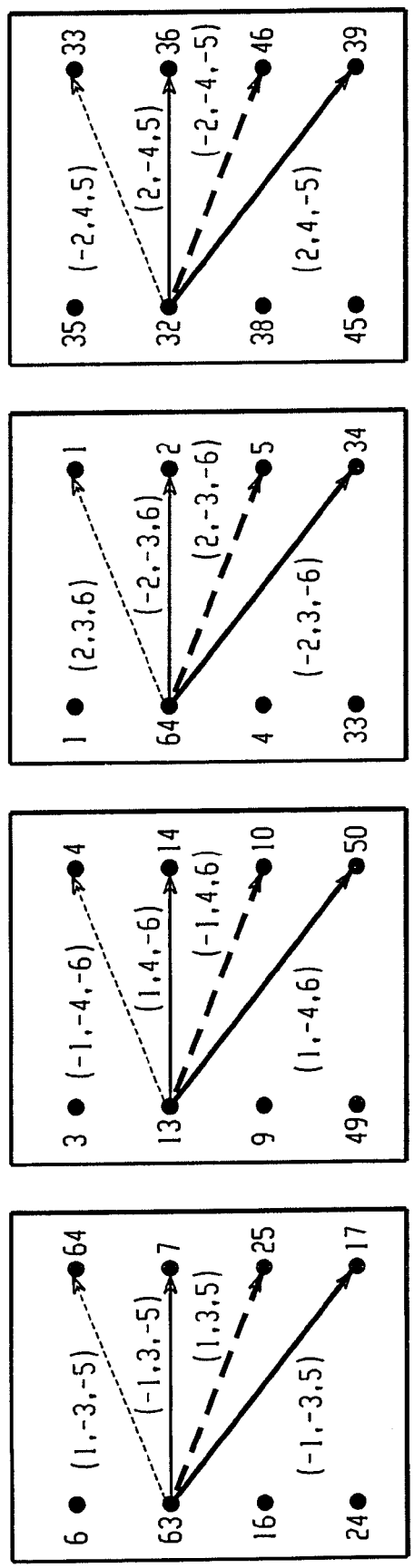

Type A simplex, also referred to as source simplex, is a simplex in which all its four member signals occupy the same three dimensions a, b, and c. There are only two subtypes of the Type A or source simplex and are referred to as even or odd source simplex (see FIG. 18). As shown in FIG. 18, an odd source simplex (shown to the right) has an odd number of negatives in all of its member signals (rows) and an even source simplex (shown to the left) has an even number of negatives in all its member signals When a simplex is written in the way as shown in FIG. 18, it is regarded as an ordered structure or matrix and the location (row) of a signal in the simplex matrix is referred to as the internal location of the signal in this simplex. Numbers 1, 2, and 3 refer to the three different dimensions of the simplex, not necessarily the first three dimensions in an N-dimensional space.

Type B simplex is a simplex in which no two member signals occupy the same three dimensions. For the instant example, the total number of the occupied dimensions of a type B simplex is 6 (see FIG. 19(a)). Note that a "copy" rule in this representation means that, in a pair of signals, one pulse-location has the same absolute value but opposite sign. For instance, in FIG. 19(a) in the first two signals, pulse-location is 1, and −1, respectively, which means these two signals are related to each other by the "copy" rule for pulse-location$_1$. In a type B simplex, a pair of signals related to each other by the "copy" rile for pulse-location$_i$, where i=1, 2, 3, is called a signal pair for pulse-location$_i$. Their locations (rows) in this simplex matrix are called a location pair for pulse-location$_i$. It can be verified from the example of FIG. 19(a) that any two signals can constitute a signal pair for a certain pulse-location$_i$. For each pulse-location$_i$, the four member signals in a type B simplex constitute two signal pairs. Also in the present example, the location (row) of a signal in a simplex matrix is defined from top to bottom as 1, 2, 3, and 4. In FIG. 19(a), the first two signals and the second two signals are two signal pairs for pulse-location. The two location pairs for pulse-location$_1$ are locations (1, 2) and locations (3, 4). All location pairs for all pulse-location$_i$'s, where i=1, 2, 3, for the example of FIG. 19(a) are listed in a matrix called pair as shown below:

$$\text{pair} = \begin{bmatrix} 1 & 1 & 1 \\ 2 & 3 & 4 \\ 3 & 2 & 2 \\ 4 & 4 & 3 \end{bmatrix}.$$

The two location pairs for pulse-location$_i$ are listed in the $i_{th}$ column of this matrix. They are locations (pair(1, i), (2, i)) and locations (pair(3, i), (4,i)). Each of the two locations in a location pair is called a pair location of the other location. From the exemplary pair matrix shown above, it can be verified that for a given signal location, its pair location for pulse-location$_i$ and pulse-location$_j$, where i$\neq$j, are different.

Each member signal in a type B simplex is a member signal in a type A simplex that occupies the same three space dimensions as its corresponding type B member signal. This type A simplex may be referred to as the related source simplex to the type B member signal. For instance, a member signal (1, 3, 5) in the type B simplex shown in FIG. 19(a) is related to a source simplex {(1, 3, 5), (1, −3, −5), (−1, 3, −5), (−1, −3, 5)}. Four member signals in type B simplex will relate to four source simplexes. It can be verified that there is one and only one way to arrange these four source simplexes to form four type B simplexes with each member signal of a formed type B simplex drawn from a different source simplex. For the four source simplexes related to the four signals in the type B simplex shown in FIG. 19(a), the only arrangement to form four type B simplexes is shown in FIG. 19(b). The set of four signals in each row come from a same source simplex, and the four signals in each column form a type B simplex.

B. The Concept of Symbol Assignment for the STM

For a CTCM(4, D), a signal constellation may be built with total $S \cdot n = 4^{D+1}$ symbols which may be assigned to the $4^{D+1}$ state transitions in STM such that all sets of 4 transitions constituting simplex-transition$_i$'s, i=1, 2, ..., D+1 (where D+1 is the last stage in the present example) are assigned simplexes. In STM, a simplex-transition$_1$ is in a butterfly and the four transitions in it have a same originating state. A simplex-transition$_{D+1}$ is in the same butterfly with all of its transitions having the same next state, but each of its transitions originating from a different originating state in this butterfly. A simplex-transitions, i=2, 3, ..., D, i.e. the middle stages of the trellis, is the set of 4 transitions in the same internal location of the four butterflies along the $(i-1)_{th}$ dimension of STM with each of its transitions originating from one of the four originating states in the same internal location of these four butterflies.

The concept of symbol assignment then is to relate each of the member signals $s_j$, j=1, 2, 3, 4 of a type B simplex to each of the four originating or next states in the same butterfly in STM, i=1, D+1, or to each of the four originating states, which are in the same internal location of the set of four butterflies along the $(i-1)_{th}$ dimension of STM, i2, 3, ..., D. In this example, the originating state to which the signal $s_j$ is related may be denoted as $g_k$. In our symbol assignment, the four state transitions originating from state $g_k$ (a simplex-transition$_1$, denoted as the simplex-transition, originating from state $g_k$) will be assigned the member signals from the related source simplex to signal $s_j$ denoted as $\overline{\omega}_j$. In this way, a simplex-transition$_1$ is assigned a source simplex which may be referred to as $\overline{\omega}_j$, the related source simplex to this originating state $g_k$ or the related source simplex to the simplex-transition$_1$ originating from state $g_k$. Then the 4 simplex-transition 1's originating from $g_k$, for all k, k=1, 2, 3, 4 will be assigned using the four related source simplexes $\overline{\omega}_j$, j=1, 2, 3, 4.

As shown in FIG. 20(a) which illustrates the transitions in a butterfly, like butterfly 1, for example, in STM built for a CTCM(4, 3) in Example 6 above, when the four originating states $g_k$, for all k, k=1, 2, 3, 4, are in the same butterfly in STM, the four simplex-transition$_1$'s originating states $g_k$, also constitute four simplex-transition$_{D+1}$'s, with each transition in a simplex-transition$_{D+1}$ drawn from a different simplex-transition$_1$. But, when the four originating states $g_k$ are in the same internal location of four butterflies along the $(i-1)_{th}$ dimension in the STM, the four simplex-transition$_i$'s originating states $g_k$ will constitute four simplex-transition$_i$'s with each transition in a simplex-transition$_i$ drawn from a different simplex-transition$_j$. FIG. 20(b) shows the transitions originating from the four originating states in one set of four butterflies along the second dimension in that STM. Note that in FIGS. 20(a) and 20(b), the set of four transitions from a same originating state, each having a different line style, is a simplex-transition$_1$. In FIG. 20(a), the set of four transitions having the same line style is a simplex-transition$_{D+1}$. But, the four transitions having the same line style in FIG. 20(b) is a simplex-transition$_3$.

Each of these four simplex-transition$_{D+1}$'s or simplex-transition$_i$'s, i=2, 3, ..., D, should also be assigned a simplex. We have shown that there is one and only one way to arrange these four related source simplex $\overline{\omega}_j$, i=1, 2, 3, 4, to form four type B simplexes, denoted as $\xi_l$, l=1, 2, 3, 4, with each member signal of $\xi_l$ drawn from a different source simplex $\overline{\omega}_j$. Thus, the order of assigning the signals in source simplex $\overline{\omega}_j$ to the transitions originating from state $g_k$ may be arranged such that these four simplex-transition$_{D+1}$'s or simplex-transition$_i$'s be assigned the four type B simplexes $\xi_l$. How to do this may be illustrated by the following example.

EXAMPLE 7

Symbol assignment for the transitions originating from four originating state in a butterfly in STM or four originating states in the same internal location of the set of four butterflies along the $(i-1)_{th}$ dimension in STM.

In FIG. 20(a), the four signals from top to bottom in the type B simplex shown in FIG. 19(a) may be related to the four originating states 1, 64, 4, and 33, respectively. Then, the source simplex in each row from row 1 to row 4 in FIG. 19(b) will be assigned to the simplex-transition$_1$'s from originating state 1, 64, 4, and 33, respectively. The only combination of arranging these four source simplexes to form four type B simplexes is in FIG. 19(b). First, any simplex-transition, may be chosen and assigned the related source simplex to it arbitrarily. For example, the simplex-transition, from originating state 1 from top to bottom in the butterfly shown in FIG. 20(a) may be assigned the simplex signals (1, 3, 5), (1, −3, −5), (−1, 3, −5), and (−1, −3, 5), respectively. Then, the symbols assigned to the other simplex-transition$_1$'s of this butterfly will be fixed.

The reason is as follows. The symbols assigned to the simplex-transition$_1$ are known from one of the originating states. That is to say, for each last stage simplex-transition$_4$, the symbol assigned to one transition in this simplex-transition$_4$ is known. This symbol is a member signal of one of the four type B simplexes; say, $\xi_m$, m=1, 2, 3, 4 in FIG. 19(b). Then, in order to make this simplex-transition to be assigned a type B simplex, the other three transitions in this simplex-transition should be assigned the other three member signals in this type B simplex $\xi_m$. In this example, knowing transition 1→1 is assigned signal (1, 3, 5), which is a member signal of type B simplex 1 in FIG. 19(b), the other three transitions in the last stage simplex-transition$_4$ having the same next state 1, 64→1, 4→1 and 33→1 should be assigned the remaining signals in type B simplex 1 in FIG. 19(b), i.e., (−1, 4, 6), (2, −3, −6) and (−2, −4, −5). In this way, all the transitions from originating state 64, 4, and 33 are assigned proper symbols from the related source simplexes. In FIG. 20(a), the signals assigned to the four transitions from an originating state from top to bottom in this butterfly are listed beside that originating state from left to right. The four last stage simplex-transition$_4$'s having the next states 1, 2, 5, and 34 are assigned type B simplex 1, 2, 3, and 4, as shown in FIG. 19(b), respectively.

Similarly, the signals in the type B simplex in FIG. 19(a) from top to bottom are related to the four originating states 63, 13, 64 and 32 in FIG. 20(b). Thus, one simplex-transition$_1$ from an originating state may be assigned arbitrarily using the related source simplex. For example, assign the four transitions originating from state 63 from top to bottom the signals (1, −3, −5), (−1, 3, −5), (1, 3, 5), (−1, −3, 5), respectively, from type B simplex 2, 3, 1, and 4, as shown in FIG. 19(b). Then, in a similar manner, all the transitions from originating states 13, 64, and 32 will be assigned proper symbols from the same related source simplexes in the same order. Accordingly, for the four simplex-transition's of the example shown by FIG. 20(b) from top to bottom are assigned simplex signals from type B simplex 2, 3, 1, and 4, as showed in FIG. 19(b).

This example shows that after knowing the signals related to the four originating states, the symbols assigned to the simplex-transition$_1$'s from any one originating state will fix the symbols assigned to the other simplex-transition$_1$'s from the other originating states.

In summary, a total number of S type B simplex signal matrices may be built so that each of the originating states $g_k$ in a butterfly in STM, k=1,2,3,4, may be related to a signal $S_j$ in a type B simplex, j=1,2,3,4. In addition, it is desired to have the signals also related to the four originating states, which are in the same internal locations of the set of four butterflies along the (i−1)$_{th}$ dimension of STM, be also member signals from a type B simplex for i=2,3, . . . , D. Then by assigning the related source simplex to $s_j$ to the four transitions originating from $g_k$ in a proper way, each of all the simplex-transition$_1$'s in STM will be assigned a source simplex; and each of the simplex-transition$_i$'s, i=2,3, . . . , D+1, will be assigned a type B simplex. The concept of building these S signals will now be described.

In the description to follow, a type B simplex will be regarded as a unit element or matrix with each simplex signal expressed in a row thereof and having an ordered structure (rows from top to bottom). Each butterfly in STM may be replaced with a type B simplex to form a new matrix which will be referred to as initial input simplex (IIS). Similarly, a location in IIS is referred to using the notation IIS $(x_1, x_2, \ldots, x_1, \ldots, x_{D-1})$. If the signals in the same internal location of the four type B simplexes along the (i−1), dimension of IIS can also be made a type B simplex, then a one-to-one mapping may be built between the originating state in STM and signals in IIS, such that a set of four signals in the same internal locations of the four type B simplexes along the (i−1)$_{th}$ dimension of IIS, i.e. IIS $(x_1, x_2, \ldots, x_{i-2},:, x_i, \ldots, x_{D-1})$ is related to the set of four states in the same intern of the set of four butterflies along the (i−1)$_{th}$ of STM—STM$(x_1, x_2, \ldots, x_{i-2},:, x_i, \ldots)$ if the four originating states in a butterfly in STM are made related to a type B simplex in IIS, then, by properly assigning the simplex-transition, originating from a state, the related source simplex, all the simplex-transition$_i$, i=1,2, . . . , D+1, will be assigned simplex. In this way, the exemplary simplex signal constellation for CTCM (4, D) will consist of all the source simplexes related to all the signals in IIS. How to build such a type B simplex will be described directly below in accordance with the steps of Procedure 3.

Procedure 3

Build a Type B Simplex

In the present embodiment, a type B simplex occupies six distinct space dimensions which may be numbered from 1 to 6.

Step 1. Select any three of these six dimensions and give them any sign to build a signal and place it in location 1 of the type B simplex (see FIG. 21(a)). From the pair equation above, location 1 is the first location in the first location pair for all pulse-locations, i=1, 2, 3.

Step 2. For each pulse-location$_i$, i=1, 2, 3, from the pair equation above, find the other location in the first location pair which is location pair(2, i) and "Copy" the exiting value to that location (see FIG. 21(b)). For pulse-location$_i$, i=1, 2, 3, its value is copied to location 2, 3, and 4, respectively, in this simplex.

Step 3. For each pulse-location$_i$, "fill" the first location in the second location pair, i.e., location pair(3, i), using a new dimension and "copy" to its pair location pair(4, i). The sign of pulse-location$_i$ used to "fill" is the same as the sign of pulse-location$_i$ in the first location of the first location pair (see FIG. 21(c)). For pulse-location$_1$, the second location pair is location (3, 4), "fill" location 3 using a new space dimension 2; "copy" it to location 4 as −2.

C. Building an IIS Matrix

Procedure 3 will be extended into a Procedure 4 below to build the IIS Matrix. It starts from a type B simplex placed in the first location in IIS, and then applies "copy" and "fill" operations along each matrix dimension of IIS. The location 1, 2, 3, and 4 in matrix pair will be the location index along the $_i$dimension, i=1, 2, . . . , D−1.

Procedure 4

Building an IIS Matrix (with Reference to FIGS. 22(a)-22(k))

Step 1. Take a CTCM (4, 4) trellis as an example (see FIG. 22(a)). Put the first type B simplex in IIS(1, 1, . . . , 1).

Step 2. Regard this type B simplex as a unit or matrix. Extend along the first matrix dimension of ITS. First, for each pulse-location$_i$, i=1, 2, 3, "copy" the existing values to the other location of the first location pair, i.e., IIS (pair(2, i), 1, . . . , 1) (see FIG. 22(b)). Then, for each pulse-location$_i$, for the locations in the second location pair, "fill" the first location, IIS (pair(3,i), 1, . . . , 1), using two new dimensions and "copy" to its pair location, IIS (pair(4,i), 1, . . . , 1). The values used to "fill" comply with "copy" rule and have the same sign pattern as pulse-location$_i$ in the first location of the first location pair (see FIG. 22(c)).

Step 3. Extend along the second matrix dimension and take all four type B simplexes along the first dimension as a whole from now on. When filling a pulse-location$_i$, four new dimensions are needed, and "copy" rule and sign pattern for that pulse-location$_i$ are the same as pulse-location$_i$ in IIS (:, 1, . . . , 1). First, for each pulse-location$_i$, i=1, 2, 3 "copy" the existing values to the second location in the first location pair, IIS (:,pair(2, i), 1, . . . , 1) (see FIG. 22(d)). Then for each pulse-location$_i$, "fill" the first location in the second location pair, IIS (:, pair(3,i), 1, . . . , 1), and "copy" to its pair location, IIS (:, pair(4, i), 1, . . . , 1) (see FIG. 22(e)).

Step 4. Extend along the third matrix dimension. First, for each pulse-locations, "copy" all the existing values to its pair location which is IIS (:,:, pair(2,i), 1, . . . , 1) (see FIGS. 22(f), 22(g), and 22(h)). Then, for each pulse-location$_i$, "fill" the first location in the second location pair, IIS (:,:, pair(3, i), 1, . . . , 1) and "copy" to its pair location, IIS (:,:, pair(4,i), 1, . . . , 1). This time, the "fill" is on a two-dimensional plane with no existing pulse-location$_i$'s on it, so the first location from both location pairs needs to be filled, then "copy" them to their pair location (see FIGS. 22(i), 22(j), and 22(k)).

$$(\underbrace{:, :, \ldots}_{j-2}, \text{pair}(2, i), \underbrace{1, \ldots, 1}_{D-j}).$$

Step 5. Continue in the same manner as described for the previous steps until extending IIS to the (D−1)$_{th}$ matrix dimension. Each time, extend IIS to one more dimension, in step j, "copy" the existing values to its pair location along the (i−1)$_{th}$ dimension, i.e., IIS Then, for each pulse-location$_i$, for the locations in the second location pair along the (j−1)$_{th}$ dimension, "fill" the first location, IIS $$(\underbrace{:, :, \ldots}_{j-2}, \text{pair}(3, i), \underbrace{1, \ldots, 1}_{D-j})$$

and "copy" to its pair location IIS $$(\underbrace{:, :, \ldots}_{j-2}, \text{pair}(4, i), \underbrace{1, \ldots, 1}_{D-j}).$$

The "fill" is on a j–2-dimensional matrix with no existing pulse-location$_i$'s on it, so, it contains "fill" the first locations in both the location pairs along the (j–2)$_{th}$ dimension, IIS $$(\underbrace{:, :, \ldots}_{j-3}, \text{pair}(1, i), \text{pair}(3, i), \underbrace{1, \ldots, 1}_{D-j})$$

and IIS $$(\underbrace{:, :, \ldots}_{j-3}, \text{pair}(3, i), \text{pair}(3, i), \underbrace{1, \ldots, 1}_{D-j})$$

and "copy" to their pair location, IIS $$\left(\underbrace{:, :, \ldots}_{j-3}, \text{pair}(2, i), \text{pair}(3, i), \underbrace{1, \ldots}_{D-j}, 1\right)$$

and IIS $$\left(\underbrace{:, :, \ldots}_{j-3}, \text{pair}(1, i), \text{pair}(3, i), \underbrace{1, \ldots}_{D-j}, 1\right).$$

Recursively, that will contain "fill" and "copy" along the (j–3)$_{th}$ dimension, until the "fill" and "copy" along the second dimension of IIS is complete as in step 3.

In this way, for a CTCM(4, D) trellis, the total number of distinct signal dimensions needed to build IIS is N=6·2$^{D-1}$. The signal dimension can be a frequency or a time slot when the signal is actually transmitted.

D. The Procedure of Symbol Assignment

The mapping between the originating states in STM and signals in IIS has been described herein above as the guide for building the IIS matrix. As shown in Example 7, the simplex symbol assigned to a particular transition will change if the order of mapping the four signals s$_j$ in a type B simplex to the four originating states in a butterfly or the four originating states in the same internal locations of the set of four butterflies along the (i–1)$_{th}$ dimension of STM is changed. The same symbol assignment can be obtained by keeping a fixed mapping order and changing the order of the four originating states in a butterfly (defined by STM-FREE (left side butterfly)) or the order of the four butterflies along the (i–1)$_{th}$ dimension (defined by STM-FREE ((i–1)$_{th}$ dimension). That is to say, the same symbol assignment may be obtained if we fix the mapping order and use a different STM built by changing the STM-FREE (left side butterfly) and STM-FREE ((i–1)$_{th}$ dimension). For symbol assignments in the present embodiment, the mapping order will be fixed and the different symbol assignments will be left to employing different STM-FREEs. The originating state having an internal location in the butterfly located at STM(l$_1$, l$_2$, . . . , l$_{D-1}$) will be mapped to the signal that has the same internal location in the type B simplex located at IIS (l$_1$, l$_2$, . . . , l$_{D-1}$). Then, the four transitions from each originating state in STM will be assigned using the related source simplex and, as shown in Example 7, the order of assigning the four signals in this related source simplex to these four transitions can be arranged properly such that each of all the simplex-transition$_i$'s, i=1, 2, . . . , D+1, is assigned a simplex. An example will be presented to exemplify how to make the symbol assignment after the mapping order between the originating states in STM and signals in IIS is fixed.

EXAMPLE 8

Symbol assignment for a CTCM(4,3)

In this example, the IIS built as described in connection with FIG. 22(e) will be used with the STM built in Example 6 (see FIG. 17(d)).

Step 1. Start the symbol assignment from the first originating state in the first butterfly in STM, i.e., butterfly located at STM(1, 1). The originating state 26 is related to simplex signal (1, 3, 5). Then the four transitions originating from the state 26 (simplex-transition, having state 26 as originating state) should be assigned the related source simplex {(1, 3, 5), (1, –3, –5), (–1, 3, –5), (–1, –3, 5)}. The order of assigning these four signals to these four transitions is flexible. But if a particular one is chosen, as will be shown, it will fix the order of assigning all the simplex-transition$_1$'s from all the other originating states in STM using the related source simplexes. Accordingly, the four transitions originating from state 26 from top to bottom in this butterfly, i.e., 26→13, 26→27, 26→53 and 26→55 may be assigned the simplex signals (1, 3, 5), (1, –3, –5), (–1, 3, –5), and (–1, –3, 5), respectively, (see FIG. 19(b)). This order can be identified from the locations of negative signs in these four signals.

Step 2. Then consider the other three originating states 12, 54 and 52 in this butterfly at STM (1, 1) which relate to simplex signals (–1, 4, 6), (2, –3, –6), and (–2, –4, –5), respectively, of the matrix at IIS (1, 1) (see FIG. 22(e)). The related source simplex to each of these signals will be assigned to the four transitions originating from state 12, 54, and 52, respectively, (see FIG. 19(b)). From Example 7, the symbols assigned to the simplex-transition$_1$'s originating from state 26 will fix the symbols assigned to the other simplex-transition$_1$'s from the other originating states in this butterfly. Then, all the transitions in the butterfly located at STM (1, 1) are assigned proper symbols.

Step 3. Then, transitions in the other n–1 butterflies constituting simplex-transition$_2$ with the first butterfly may be considered. They are located along the first dimension of STM, i.e., at locations STM(x$_1$, 1), where x$_1$=:/1 (see FIG. 17(d)). For each of the four internal locations that an originating state can have, consider the four originating states in that internal location of the four butterflies located at STM (:, 1). From the previous step, we know the symbols assigned to the simplex-transition$_1$ originating from the originating state in the butterfly located at STM(1, 1). Then from Example 7, the symbols assigned to all the transitions originating from the originating state in butterflies located at STM (2, 1) and STM(3,1) and STM(4,1) will be fixed. For instance, for the four originating states 12, 63, 31, and 62 at the same internal location in the STM matrices along the first dimension, knowing the symbols assigned to the simplex-transition$_1$ from originating state 12 will fix the symbols assigned to the simplex-transition$_1$'s from originating state 63, 31, and 62. In this way, all the other transitions in butterflies located in STM (2,1), STM (3,1), and STM (4,1) are assigned proper symbols.

Step 4. After knowing the symbols assigned to the transitions in butterflies located in STM (:, 1), symbols to transitions in the set of four butterflies along the second dimension of STM may also be assigned. Consider the four originating states in the same internal location of these four butterflies. From the previous step, the symbols assigned to the simplex-transition$_1$ from the originating state in STM(:,1) are known. Then from Example 7, the symbols assigned to all the transitions originating from the originating states in STM(:,2) STM(:,3) and STM(:,4) will be fixed. In this manner, all the state transitions of the STM may be assigned proper symbols.

For the more general case of CTCM (4,D) with D≧3, continue the above symbols assignment procedure. At each step, extend the symbol assignment procedure to a new dimension of STM. Consider the set of four originating states in the same internal location of the four butterflies along that dimension. There is one originating state located in the butterfly at the first location index along that dimension. From the previous step, the symbols assigned to the simplex-transition$_1$ from this originating state are known; then from Example 7, the simplex-transition$_1$'s from the other three originating states will be fixed. In this way, all the transitions in the set of butterflies along that dimension will be assigned proper symbols at that step.

For a particular state transition, different symbol assignments will be obtained if the symbol assignment procedure is started from a different butterfly or a different originating state in the first butterfly in STM, or if we change the order of assigning the related source simplex to the simplex-transition from the first originating state. Those resultant symbol assignments can also be obtained by using the symbol assignment procedure described above but employing different STMs built by choosing different STM-FREE (first butterfly) (or STM-FREE (first location)) and different STM-FREE (left side butterfly), respectively. In the present embodiment, different symbol assignments will be left to employing different STM-FREEs.

In summary, for a CTCM(4,D) encoder system, the IIS may be built using Procedure 4. The signal constellation consists of all the source simplexes related to all the signals in IIS. Different symbol assignments (different codes) for the CTCM (4, D) result from applying the symbol assignment procedure described above to different STMs built by choosing different STM-FREEs. Also, it has been shown that there is a one to one mapping between each originating state in STM and the symbols in IIS. Moreover, from the symbol assignment procedure for a state transition in STM, knowing its location in STM (i.e. the location of the butterfly containing this transition and the internal location of this transition in this butterfly), the symbol assigned to this transition will be known. That is to say, there is also a one to one mapping between each state transition and each symbol in the signal constellation.

Now that a CTCM encoder has been described herein above for use in the communication system, attention is directed to a CTCM decoder at the receiving end to decode the received channel symbols and reproduce the information code sequence. As indicated in the Background section, both Viterbi and BCJR algorithms have been used for decoding, but both require the starting state or the distribution of the starting state be known a priori to the decoder. This is not the case for the present CTCM encoder embodiment. An optimum ML decoding for a circular trellis in which the starting state is unknown would be to execute the Viterbi algorithm for the number of possible starting states which is obviously not desirable for large trellis. In the Anderson et al. IEEE Paper and U.S. Patent referenced herein above, the BCJR algorithm was extended to tail biting codes and referred to as a circular BCJR algorithm. Thus, a modified circular BCJR algorithm will be considered herein as a suitable CTCM decoder for the present embodiment.

But first, the BCJR algorithm will be described by way of example without derivation. In this example, the source is assumed to be a discrete-time finite-state Markov process. The S distinct states of the Markov source are indexed by the integer m, m=0,1, . . . , S−1. The state of the source at time t is denoted by $S_t$ and its output by $X_t$. A state transition sequence extending from time t to t' is denoted by $S_t^{t'}=S_t$, $S_{t+1}, \ldots, S_{t'}$ and the corresponding code sequence is $X_t^{t'}=X_t$, $X_{t+1}, \ldots, X_{t'}$, where $X_t$ belongs to some finite discrete alphabet. In coded modulation scheme, a channel symbol is assigned to state transition $S_{t-1} \rightarrow S_t$. The Markov source starts in the initial state $S_0$ and produces an output or transmission symbol sequence $X_1^L$, ending in the terminal state $S_L$. $X_1^L$ is the input to a noisy DMC channel whose output or reception is the symbol sequence $Y_1^L=Y_1, Y_2, \ldots, Y_L$. For all $1 \leq t \leq L$, $$P(Y_1^t|X_1^t) = \prod_{j=1}^{t} P(Y_j|X_j) \quad (11)$$

where $P(Y_j|X_j)$ is the transition probability of this DMC.

The objective of a BCJR decoder is to examine $Y_1^L$ and estimate the a posteriori probability (APP) of the states and state transitions of the Markov source, i.e., the conditional probabilities $$P(S_t=m|Y_1^L)=P(S_t=m,Y_1^L)/P(Y_1^L) \quad (12)$$

and $$P(S_{t-1}=m',S_t=m|Y_1^L)=P(S_{t-1}=m',S_t=m,Y_1^L)/Y_1^L) \quad (13)$$

In reality, BCJR calculates the joint probabilities $$\lambda_t(m)=P(S_t=m,Y_1^L) \quad (14)$$

and $$\sigma_t(m',m)=P(S_{t-1}=m',S_t=m,Y_1^L) \quad (15)$$

$P(Y_1^L)$ is the probability that $$\beta_t(m) = \sum_{m'} \beta_{t+1}(m') \gamma_{t+1}(m, m')$$

is observed. For a given $Y_1^L$, $P(Y_1^L)$ is a constant. Dividing Equations (15) and (14) by this constant which is available from the decoder will always give Equations (12) and (13). Alternatively, we can normalize $\lambda_t(m)$ and $\sigma_t(m', m)$ to obtain the same result.

Three sets of probabilities are defined as follows:

$$\alpha_t(m)=P(S_t=m,Y_1^t), \quad (16)$$

$$\beta_t(m)=P(Y_{t+1}^L|S_t=m), \text{ and} \quad (17)$$

$$\gamma_t(m',m)=P(S_t=m,Y_t|S_{t-1}=m'). \quad (18)$$

Then, $$\lambda_t(m) = \alpha_t(m)\beta_t(m) \text{ and} \quad (19)$$

$$\sigma_t(m',m) = \alpha_{t-1}(m')\gamma_t(m',m)\beta_t(m) \quad (20)$$

where $\alpha_t(m)$ and $\beta_t(m)$ can be formed by forward recursion in Equation (21) and backward recursion in Equation (22).

$$\alpha_t(m) = \sum_{m'} \alpha_{t-1}(m')\gamma_t(m',m) \quad t = 1, \ldots, L \quad (21)$$

$$\beta_t(m) = \sum_{m'} \beta_{t+1}(m')\gamma_{t+1}(m,m') \quad t = L-1, \ldots, 0 \quad (22)$$

$\gamma_t(m',m)$ can be obtained from Markov data source and channel property.

$$\gamma_t(m',m) = P(Y_t, S_{t-1} = m' \to S_t = m) \quad (23)$$

$$= \sum_X P(S_t = m|S_{t-1} = m') \cdot$$

$$P(X_t = X|S_{t-1} = m', S_t = m) \cdot P(Y_t|X)$$

From the $\lambda_t$ or $\sigma_t$ $$P(Y_1^L) = \sum_m \lambda_t(m) = \sum_{m,m'} \sigma_t(m,m') \quad (24)$$

For the recursions in Equations (21) and (22) to apply at $t=1$ and $t=L-1$ respectively, $\alpha_0(m)$ must be the probability of the encoder starting in state m before stage 1 and $\beta_L(m)$ the probability of the encoder ending in state m after stage L. The standard application of the BCJR algorithm assumes $S_0 = S_L = 0$, so $$\alpha_0(0)=1 \text{ and } \alpha_0(m)=0, \text{ for } m \neq 0 \quad (25)$$

and $$\beta_L(0)=1 \text{ and } \beta_L(m)=0, \text{ for } m \neq 0. \quad (26)$$

The operations of the decoder for computing $\lambda_t$ and $\sigma_t$ are outlined below:

1. $\alpha_0(m)$ and $\beta_L(m)$ are initialized according to Equations (15) and (16).
2. As soon as $Y_t$ is received, the decoder computes $\gamma_t(m',m)$ using Equation (23) and $\alpha_t(m)$ using Equation (21) for all t and m.
3. After the complete sequence $Y_1^L$ has been received, the decoder recursively computes $\beta_t$ using Equation (22). Then compute $\lambda_t(m)$ and $\sigma_t(m', m)$ using Equation (19) and (20).

After Equations (14) and (15) are obtained, the probability of any event that is a function of states or state transitions can be obtained by summing the appropriate $\lambda_t(m)$ or $\sigma_t(m', m)$. Then the event is decoded as the one having the largest probability.

In Anderson's circular BCJR algorithm, the BCJR algorithm may be rewritten in vector and matrix format by defining $\alpha_t$ as a row vector and $\beta_t$ as a column vector. Each of these row and column vectors has S elements defined in Equations (16) and (17) above, respectively. Also, $\gamma_t$ may be defined as an S×S matrix with each element defined in Equation (18) above. For tailing biting codes, $$S_0 = S_L, \quad (27)$$

then, the following expression may be obtained $$\alpha_0 = \frac{\alpha_0 \gamma_1 \ldots \gamma_L}{P(Y_1^L)} \quad (28)$$

This means $\alpha_0$ is the normalized left eigenvector of the matrix $\gamma_1 \ldots \gamma_L$ corresponding to the largest eigenvalue. Similarly, the right eigenvector of $\gamma_1 \ldots \gamma_L$ is the proper starting vector for $\beta_L$ in most applications. Anderson's circular BCJR employs successive normalization to control the precision of the calculation without changing the results. This augment depends on the fact that scaling of any or all of the $\alpha_t$, $\beta_t$ or $\gamma_t$ during recursions in Equations (21) and (22) simply leads to scaled $\lambda_t(m)$ and $\sigma_t(m', m)$ in Equations (19) and (20), but Equations (12) and (13) can always be obtained by normalizing $\lambda_t(m)$ and $\sigma_t(m', m)$ to have unit sum. This circular BCJR is referred to as circular BCJR with eigenvectors. Using superscript "o" to indicate a unit-sum vector, the basic steps are Given $Y_1^L = Y_1, Y_2, \ldots, Y_L$
1. Find the left eigenvector corresponding to the largest eigenvalue of $\gamma_1 \ldots \gamma_L$ This is $\alpha_0$.
2. Calculate the normalized $\alpha$'s by forward recursion $$\alpha_t = \alpha_{t-1}^o \gamma_t \quad (29)$$

$$\alpha_t^o = \alpha_t / \sum_i \alpha_t(i), t = 1, \ldots, L. \quad (30)$$

3. Starting from the right eigenvector of $\gamma_1 \ldots \gamma_L$ form the normalized $\beta$'s by $$\beta_t = \gamma_{t+1}\beta_{t+1}^o \quad (31)$$

$$\beta_t^o = \beta_t / \sum_i \beta_t(i), t = L-1, \ldots, 0 \quad (32)$$

4. Calculate the normalized $\lambda_t$ and $\sigma_t(m', m)$ by $$\lambda_t(m) = \alpha_t^o(m)\beta_t^o(m), \quad (33)$$

$$\lambda_t^o(m) = \lambda_t(m) / \sum_i \lambda_t(i) \quad (34)$$

$$\sigma_t = (m', m) = \alpha_{t-1}^o(m')\gamma_t(m', m)\beta_t^o(m), \quad (35)$$

$$\sigma_t^o = \sigma_t(m', m) / \sum_{m',m} \sigma_t(m', m) \quad t = 1, \ldots, L \quad (36)$$

Anderson also argues that if we iterate the forward recursion enough times and properly normalize the outcomes, then the resulting sequence of outcomes $\alpha_1 \ldots \alpha_L$, $\alpha_{L+1} \ldots \alpha_{2L}, \alpha_{2L+1} \ldots$ will converge to repetitions of $\alpha_1^o \ldots \alpha_L^o$, where $\alpha_1^o \ldots \alpha_L^o$ is the normalized $\alpha$ obtained from circular BCJR with eigenvectors. The speed of convergence (the number of iterations required by the forward recursion) is affected by the choice of initial $\alpha_0$. Similar argument holds for backward recursion.

This gives rise to an iterative circular BCJR as described below.

Given $Y_1^L = Y_1, Y_2, \ldots, Y_L$

1. Do not calculate the eigenvectors of $\gamma_1 \ldots \gamma_L$. Set initial $\alpha_0$ in some way.
2. Calculate a set of normalized $\alpha_1^o \ldots \alpha_L^o$ by the recursions in Equation (29) and (30), a continue this recursion to find $\alpha_t^o$, $t = L+1, L+2, \ldots$. Take $\gamma_t = \gamma_l$ where $l = t \bmod L$.
   When $\|\alpha_t^o - \alpha_l^o\|$ is sufficiently small by a suitable measure, stop. A complete set of $\alpha$ is available in the last L round.
3. Execute a similar procedure backward along the trellis circle, to find the set $\beta_1^o \ldots \beta_L^o$.
   Set $\beta_L = \alpha_0$ initially.
4. Same as in circular BCJR with eigenvectors.

Now, application of the circular BCJR algorithm as a CTCM decoder will be explored for drawbacks. In a CTCM (n, D) encoder, the total number of states is $S = n^D$ and the information sequence length is denoted as L. In a circular BCJR with eigenvectors, eigenvectors of the multiplication of a sequence of matrixes $\gamma_1 \ldots \gamma_L$ are to be calculated, where $\gamma_t$ is an $S \times S$ matrix, $t = 1, \ldots, L$. Each element in $\gamma_t$ is a probability. The elements in $\gamma_1 \ldots \gamma_L$ can be extremely small for a reasonably large L, and due to this, the eigenvectors of this matrix will not converge. When the values of elements in $\gamma_1 \ldots \gamma_L$ become so small that the computer does not have enough precision to represent them, they will simply be treated as zero. This will cause $\gamma_1 \ldots \gamma_L$ to be a matrix with all zeros and the eigenvectors obtained will not be correct.

One solution to this drawback is as follows: when calculating $\gamma_1 \ldots \gamma_L$, scale $\gamma_1 \ldots \gamma_t$ whenever it is getting too small and multiply this scaled value with $\gamma_{t+1}$ to get $\gamma_1 \ldots \gamma_{t+1}$. Because what is desired is the normalized eigenvectors of $\gamma_1 \ldots \gamma_L$ scaled $\gamma_1 \ldots \gamma_L$ will have scaled eigenvectors, and normalizing the scaled eigenvectors will give the same results as normalizing the unscaled ones. With this modification, the normalized eigenvectors of $\gamma_1 \ldots \gamma_L$ can be calculated for any large L and S.

Also, another drawback is the large delay in decoding by the circular BCJR decoder which will be incurred by the normalization of $\alpha_t$ and $\beta_t$ at each trellis stage and for each iteration in circular BCJR (referred to hereinafter as iterative circular BCJR), when L is reasonably large. The normalization is introduced previously to control the calculation precision. But in order to control computation precision, the normalization of $\alpha_t$ and $\beta_t$ is only necessary at stages when they are getting too small. This is called "selective normalization". In iterative, circular BCJR, the iterations stop when the difference on $\alpha$ between consecutive $r_{th}$ and $(r-1)_{th}$ iterations, $\|\alpha_{rL+t}^o - \alpha_{(r-1)L+t}^o\|$, is sufficiently small, by a suitable measure, for all t, $t = 1, \ldots, L$. The superscript "o" indicates the normalized vectors. This requires $\alpha$ to be normalized at each trellis stage t in every iteration. When the modification of "selective normalization" is employed, $\alpha$ is only normalized at stages when it is getting too small; this stop condition should be modified accordingly. Since the speed for $\alpha_{L+t}^o, \alpha_{2L+t}^o$ to converge to $\alpha_t^o$ is the same for all t, $t = 1, \ldots, L$, one stage may be chosen from the total L stages, $\alpha$ is normalized at this stage no matter if it is too small or not, and the difference of $\alpha^o$ at this stage is compared between consecutive iterations to decide if more iterations are needed.

Without loss of generality, the present example chooses stage L and defines $\Delta = \max(\text{abs}((\alpha_{RL}^o - \alpha_{(r-1)L}^o))$, where "abs" means the absolute value; then when $\Delta$ is sufficiently small, the iteration is stopped and the set of $\alpha$ vectors is obtained at the $r_{th}$ iteration. A similar argument holds for iterations on $\beta$.

Although the eigenvectors of $\gamma_1 \ldots \gamma_L$ can be obtained for any large L and S using a circular BCJR algorithm, the computation load to obtain it is much larger than that involved in iterative circular BCJR with several iterations—especially for large L and S. The circular BCJR with eigenvectors is served more as a theoretical basis to derive the iterative circular BCJR than to be implemented practically in the communication system of the present embodiment. To overcome the aforementioned drawbacks and afford a practical decoding of a CTCM encoded sequence in accordance with another aspect of the present invention, an embodiment of an iterative circular shift BCJR decoder will now be described for use in the communication system of the present embodiment.

An initial $\alpha_0$ and $\beta_L$ will be set in order to run the iterative circular BCJR. Some initial choices of $\alpha_0$ and $\beta_L$ will lead to faster convergence than others will. In the following paragraphs a scheme will be introduced based on a statistical estimate of the starting state on the observation of the received sequence of symbols. In this scheme, the reliability of the estimation is defined and used to select the most reliable symbol in the received sequence. Also, the circular property of the CTCM will be incorporated to make this most reliable symbol as the starting point in the decoding.

A. Statistic Estimation of Starting State in CTCM Decoding

First let the receiver tentatively hard decode each symbol in the received sequence of symbols denoted as $Y_1^L = Y_1, Y_2, \ldots, Y_L$. On the observation of $Y_t$, the decoder hard decodes it to $\hat{X}_t$, where $\hat{X}_t$ belongs to the channel signal constellation. For the situation that all channel symbols are equally likely, which is true for CTCM, in order to minimize the probability of making an erroneous decision, the receiver should choose $\hat{X}_t$ such that $$P(Y_t|\hat{X}_t) = \max_{\text{over all } X} P(Y_t|X) \quad (41)$$

In an N dimensional space, where N is the space dimension of signal constellation for CTCM (n, D), transmitted and received channel symbols X and $Y_t$, respectively, are represented as $X = (x_1, x_2, \ldots, x_N)$ and $Y_t = (y_{t1}, y_{t2}, \ldots, y_{tN})$, then for a discrete memoryless AWGN channel with one-sided noise spectrum density $N_0$, $$P(Y_t|X) = \frac{1}{\sqrt{\pi N_0}} e^{-\frac{\|Y_t - X\|^2}{N_0}} = \prod_{k=1}^{N} \frac{1}{\sqrt{\pi N_0}} e^{-\frac{(y_{tk} - x_k)^2}{N_0}} \quad (42)$$

$\|Y_t - X\|^2$ is the squared Euclidean distance between $Y_t$ and X.

The larger $P(Y_t|\hat{X}_t)$ is, the smaller is the likelihood of making an error when decoding $Y_t$ to $\hat{X}_t$, i.e., the more reliable is this decision. $P(Y_t|\hat{X}_t)$ is defined as the reliability of decoding $Y_t$ to $\hat{X}_t$ or simply the reliability of symbol $Y_t$. In this way, the receiver decodes $Y_1^L$ to $\hat{X}_1^L = \hat{X}_1, \hat{X}_2, \ldots, \hat{X}_L$, with reliability information $P(Y_t|\hat{X}_1)$ for each t. $P(Y_t|\hat{X}_t)$ is then compared with itself for all t to find the largest one—say, $P(Y_i|\hat{X}_i)$—, for example. Then, $Y_i$ is the most reliable symbol. Denote the state transition to be assigned $\hat{X}_i$ as m″→m‴, where m″ and m‴ are two trellis states. If $Y_1^L$ is circular shift to let $Y_i$ be the first symbol in the shifted sequence, denoted as $Y_1^{L^{SHIFT(i)}}=Y_i, Y_{i+1}, \ldots, Y_L, Y_1, Y_2, \ldots, Y_{i-1}$, then when running iterative circular shift BCJR on $Y_1^{L^{SHIFT(i)}}$, initial $\alpha_0$ can be set as $$\alpha_0(m) = \begin{cases} 1, & m = m'' \\ 0, & \text{otherwise} \end{cases} \tag{43}$$

$\beta_L$ is set the same as $\alpha_0$ initially.

B. Circular Property of CTCM and Iterative Circular Shift BCJR

The circular property of a trellis path in a CTCM will be used to select the most reliable symbol in $Y_1^L$ as the starting point for decoding. Denote the information sequence as $U=(U_1, U_2, \ldots, U_t, \ldots, U_L)$, where $U_i$ belongs to the finite information symbol alphabet. The corresponding starting state is $S_0$, and the state transition sequence is $S_0 \to S_1 \to S_2 \to \ldots \to S_{t-1} \to S_t \to \ldots S_{L-1} \to S_0$. The corresponding code sequence is denoted as $V=(V_1, V_2, \ldots, V_t, \ldots, V_L)$ where $V_i$ belongs to the channel signal constellation. The permuted state transition table employed by CTCM guarantees that a circular shift version of U, denoted as $U^{SHIFT(t)}=(U_t, U_{t+1}, \ldots, U_L, U_1, U_2, \ldots, U_{t-1})$, will have a state transition sequence and a code sequence which are the circular shift versions of those for U. The state transition sequence will be $S_{t-1} \to S_t \to \ldots \to S_{L-1} \to S_0 \to S_1 \to \ldots \to S_{t-2} \to S_{t-1}$, and the code sequence will be $V^{SHIFT(t)}=(V_t, V_{t+1}, \ldots, V_L, V_1, V_2, \ldots, V_{t-1})$.

Therefore, if the circular shift version of receive sequence, $Y_1^{L^{SHIFT(i)}}$ may be decoded to get information sequence $\hat{U}$, then decoding of $Y_1^L$ will give a circular shift-back version of $\hat{U}$, i.e., $\hat{U}^{SHIFT(L-i)}$. Accordingly, the initialization problem for decoding $Y_1^{L^{SHIFT(i)}}$ using iterative circular BCJR is solved. This scheme of running iterative circular BCJR on the circular shift version of received sequence and the corresponding way to set initial $\alpha_0$ and $\beta_L$ is what is referred as iterative circular shift BCJR algorithm for decoding a CTCM encoded channel symbol sequence in the present communication system embodiment.

For decoding a CTCM (n, D) encoded sequence, the symbols in the information sequence are directly related to state transitions other than those in shift register based trellis coding. Therefore, we only need to calculate σ's in the iterative circular shift BCJR. Now, if we let $C^{(j)}$ be the set of transitions $S_{t-1}=m' \to S_t=m$ caused by input symbol j, where j belongs to the information symbol alphabet, then after $\sigma_t(m', m)$ is obtained, the probability of the input symbol at stage t is $$P(U_t = j | Y_1^L) = \frac{1}{P(Y_1^L)} \sum_{(m',m) \in C(j)} \sigma_t(m', m) = \frac{1}{\sum_{\text{all }(m',m)} \sigma_t(m', m)} \sum_{(m',m) \in C(j)} \sigma_t(m', m) \tag{44}$$

Then, $U_t=j'$ may be decoded such that $$P(U_t = j' | Y_1^L) = \max_{\text{all } j} P(U_t = j | Y_1^L) \tag{45}$$

Some other parameters in iterative circular shift BCJR for decoding CTCM (n, D) encoded signals are specified as follows.

For the calculation of $\gamma_t$ in Equation (23) above, we have $$P(S_t = m | S_t = m') = \begin{cases} 1/n, & \text{if transition } m' \to m \text{ is allowed at stage } t \\ 0, & \text{otherwise} \end{cases} \tag{46}$$

Then if we denote the channel symbol assigned to transition m'→m as $X^{(m',m)}$, we have $$P(X_t = X, S_t = m | S_{t-1} = m') = \begin{cases} 1, & X = X^{(m',m)} \\ 0, & \text{otherwise} \end{cases} \tag{47}$$

In implementation, $\gamma_t(m', m)$ may be stored in memory as a sparse matrix table only for m' and m where transition m'→m is allowed in order to reduce the computation load and memory usage.

Now, we can summarize exemplary steps for the decoding of a CTCM encoded sequence of channel symbols using the iterative circular shift BCJR. "Selective normalization" and modified stop condition for iterations are included here as well.

Given $Y_1^L = Y_1, Y_2, \ldots, Y_L$:

1. Hard decode $Y_1^L$ to $\hat{X}_1^L = \hat{X}_1, \hat{X}_2, \ldots, \hat{X}_L$ and find the most reliable symbol $Y_i$. Denote the state transition to which $\hat{X}_i$ is assigned as m″→m‴. Circular shift $Y_1^L$ to $Y_1^{L^{SHIFT(i)}} = Y_i, Y_{i+1}, \ldots, Y_L, Y_1, Y_2, \ldots, Y_{i-1}$. Decode $Y_1^{L^{SHIFT(i)}}$ in the following steps.
2. Set initial $\alpha_0$ as in Equation (43).
3. Set iteration count r=1. Calculate a set of $\alpha_{rL+1}, \ldots, \alpha_{(r+1)L}$ by $$\alpha_{rL+t} = \alpha_{rL+t-1} \gamma_{rL+t}, t=1, \ldots, L \tag{48}$$

using $\gamma_{rL+t} = \gamma_t$. \hfill (49)

Normalize $\alpha_{rL+t}$ only when it is too small or t=L using $$\alpha_{rL+t} = \alpha_{rL+t} / \sum_i \alpha_{rL+t}(i) \tag{50}$$

Calculate $\Delta = \max(\text{abs}(\alpha_{rL}^o - \alpha_{(r-1)L}^o))$. If $\Delta$ is sufficiently small, stop the iterations; the set of α vectors is obtained as $\alpha_t = \alpha_{rL+t}$, t=1, \ldots, L. Otherwise, set r=r+1, and repeat the iteration.

4. Execute a similar procedure backward along the trellis circle to find the set $\beta_1^o \ldots \beta_L^o$.

Set $\beta_L = \alpha_0$ initially.

5. Calculate $\sigma_t(m', m)$ using Equation (20)
6. Decode the information sequence using Equations (44) and (45), denoted as $\hat{U}$, then the original information sequence corresponding to $Y_1^L$ is $\hat{U}^{SHIFT(L-i)}$.

For simulations of decoding using iterative circular shift BCJR on CTCM (n, D) encoded symbol sequences, bit error probability is calculated in the following paragraphs using two methods. In the first method, the symbol in the information sequence is decoded at each stage, and rewritten as $\log_2 n$ bits. The second method decodes each of the $\log_2 n$ bits in each symbol at each stage. This can be done by establishing the relationship between the bits in the symbol and the state transitions at that stage. For example, for a CTCM (4, D) encoder, the information symbol alphabet is $\{0, 1, 2, 3\}$. Symbols 0 and 1 have bit 0 at the first place and symbol 0 and 2 have bit 0 at the second place. Accordingly, each symbol in the information sequence $U_i$ may be rewritten as two bits $U_i^{(1)}U_i^{(2)}$. Thus, similar to Equation (44) above, we have $$P(U_t^{(1)} = 0|Y_1^L) = \frac{1}{\sum_{\text{all }(m',m)} \sigma_t(m',m)} \sum_{(m',m) \in (C^{(0)} \cup C^{(1)})} \sigma_t(m',m) \quad (51)$$

$$P(U_t^{(2)} = 0|Y_1^L) = \frac{1}{\sum_{\text{all }(m',m)} \sigma_t(m',m)} \sum_{(m',m) \in (C^{(0)} \cup C^{(2)})} \sigma_t(m',m) \quad (52)$$

We decode $U_t^{(k)}=0$, k=1, 2, if $P(U_t^{(k)}=0|Y_1^L) \geq 0.5$, otherwise $U_t^{(k)}=1$.

Figure 23:
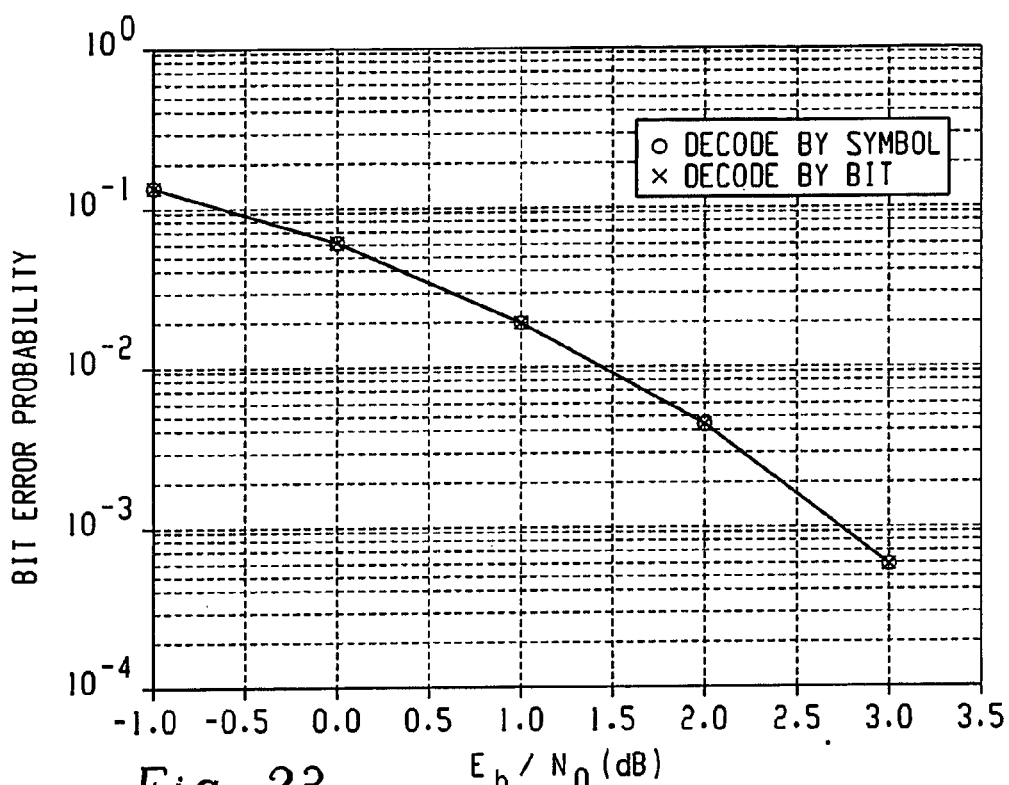
FIG. 23 is a graph illustrating a bit error probability for decoding a CTCM (4,2) encoded sequence with information length L=16 using an iterative shift BCJR.

The bit error probability in the simulation is the number of different bits between the decoded information sequence and the information sequence inputted to the encoder over total number of bits in the information sequence. Since these two methods both relate their decoding events to the APP of state transitions at each stage, there should be no significant difference between the resultant bit error probabilities. FIG. 23 is a graph showing the bit error probability for decoding a CTCM (4, 2) encoded sequence with information length L=16 using iterative circular shift BCJR. $E_b/N_0$ is the average bit energy per noise power spectrum density. The "decode by symbol" and "decode by bit" refer to the first and second method, respectively.

The speed of convergence for the iterative circular BCJR decoder may be affected by the initialization of $\alpha_0$ and $\beta_L$ and the stop condition for the iterations. For this reason, the convergence property of iterative circular shift BCJR is investigated now. For comparison, an iterative circular BCJR using a different initialization is chosen as a reference decoding scheme. In this reference scheme, since a legal path can start and end at one of all the possible states with equal possibility in CTCM (n, D) encoder, in the absence of better knowledge, initial $\alpha_0$ and $\beta_L$ are set as follows:

$$\alpha_0(m) = \beta_L(m) = \frac{1}{n^D}, \text{for all state } m \quad (53)$$

Then, the received sequence (not shift version) is decoded using the iterative circular BCJR decoder. The number of iterations required for these two initialization schemes is compared.

Figure 24:
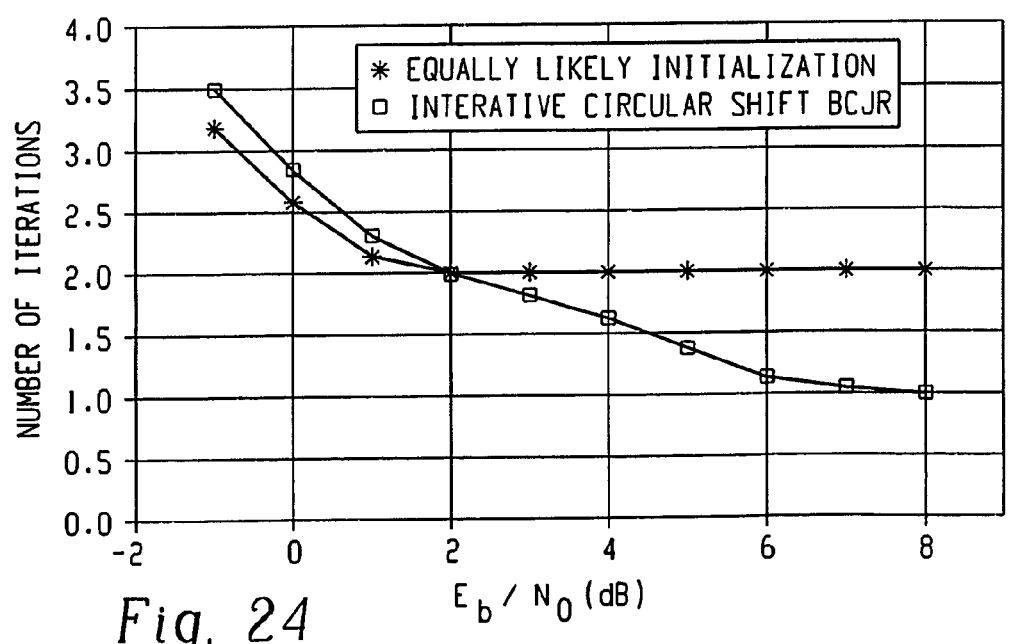
FIGS. 24 and 25 are graphs illustrating the number of iterations of $\alpha$ and $\beta$ in CTCM (4,3) decoder simulation in two different decoding schemes.
Figure 25:
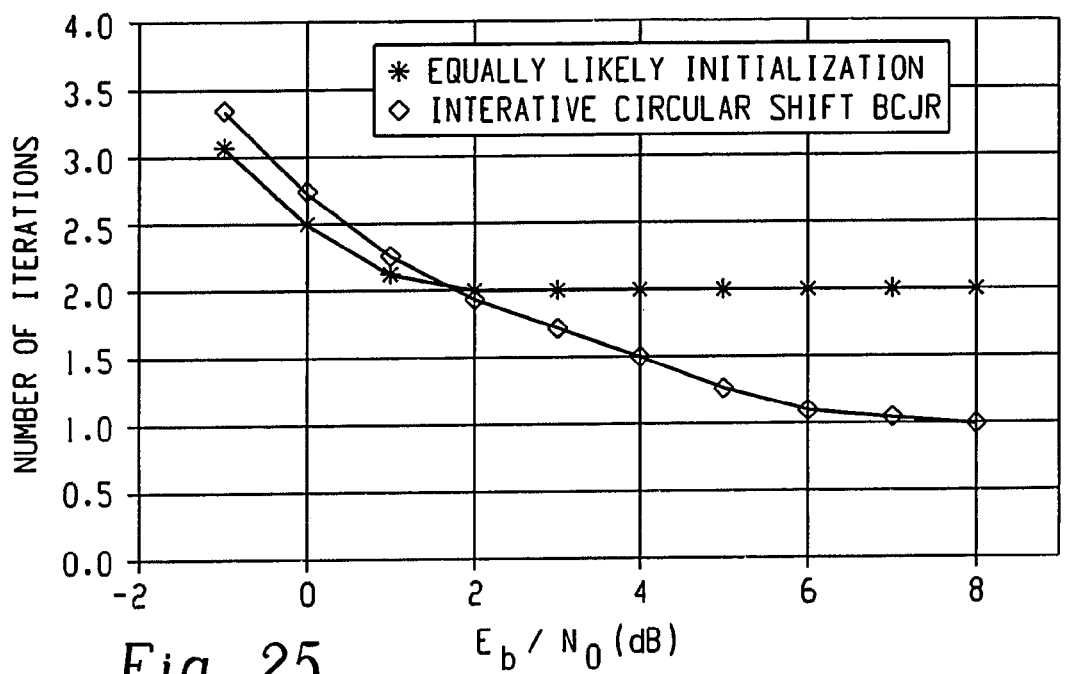

In the present example, simulations were done for a CTCM (4, 3) encoder with L=16. FIGS. 24 and 25 are graphs showing the number of iterations required by $\alpha$ and $\beta$ in these two decoding schemes, both at stop condition $\Delta<10^{(-3)}$. "Equally likely initialization" refers to the reference scheme. The number of iterations is averaged over 10,000 information sequences. For low $E_b/N_0$, the estimation of starting state in iterative circular shift BCJR is considered no better than the simple initialization in the reference scheme, but for medium and high $E_b/N_0$, the estimation of starting state leads to faster convergence than the reference scheme. Note, for $$\frac{E_b}{N_0} \geq 2 \text{ dB},$$

no more than two iterations are needed to converge at $\Delta<10^{(-3)}$ for both schemes.

Figure 26:
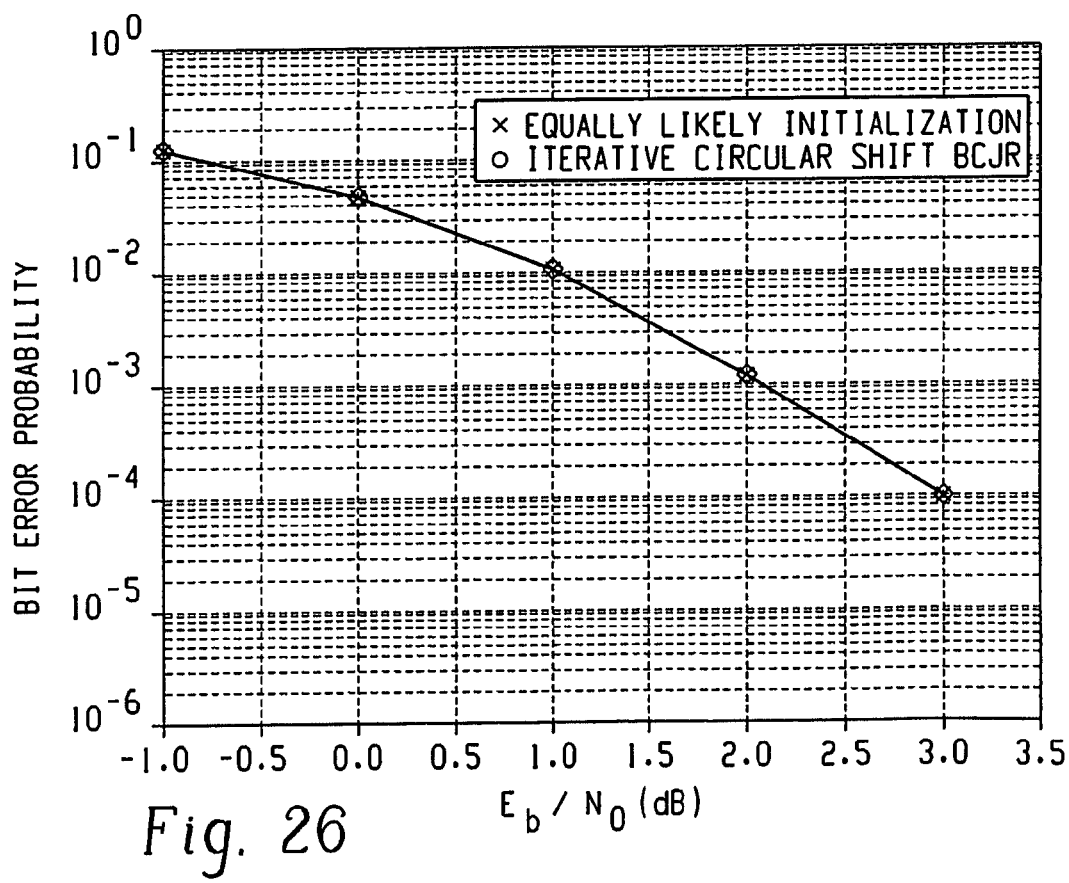
FIG. 26 illustrates the bit error probability of decoding the code of the decoding schemes of FIGS. 24 and 25.

Also, FIG. 26 shows the bit error probability of decoding this code using these two decoding schemes. All of the FIGS. 24, 25 and 26 illustrate that the iterative circular BCJR decoder forgets an erroneous starting $\alpha_0$ and $\beta_L$ very rapidly and converges to the objective steady value after just several iterations.

Figure 27:
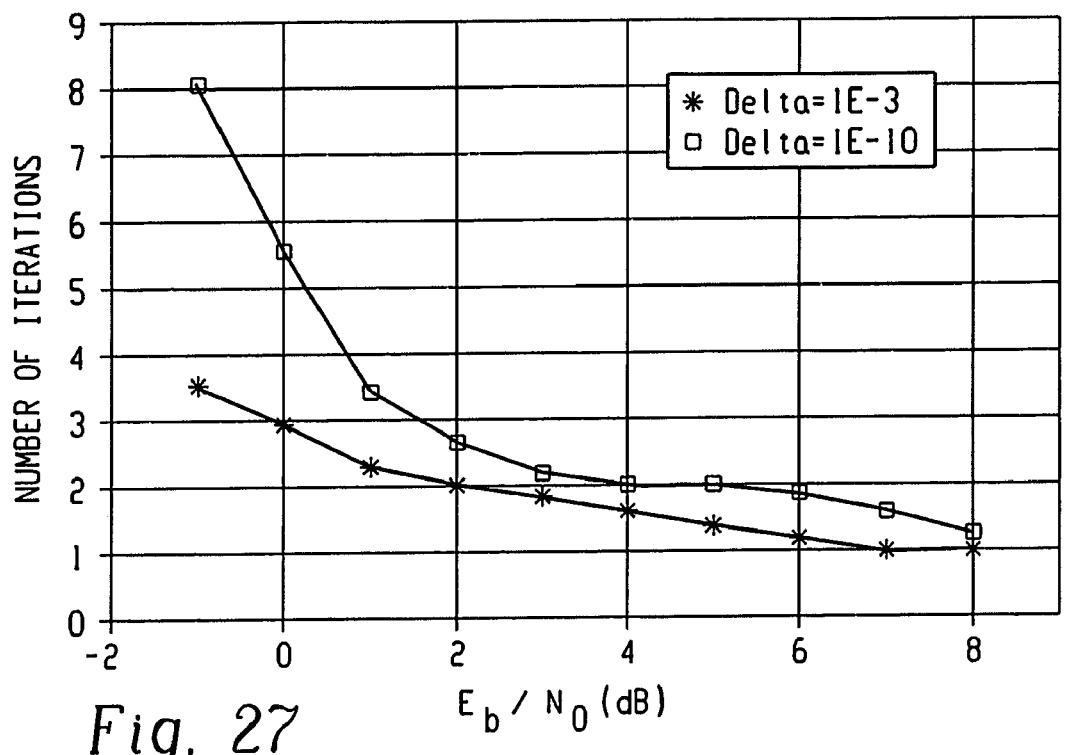
FIGS. 27 and 28 are graphs illustrating the number of decoding iterations of $\alpha$ and $\beta$ for a CTCM (4,3) decoder averaged over a large number of information sequences.
Figure 28:
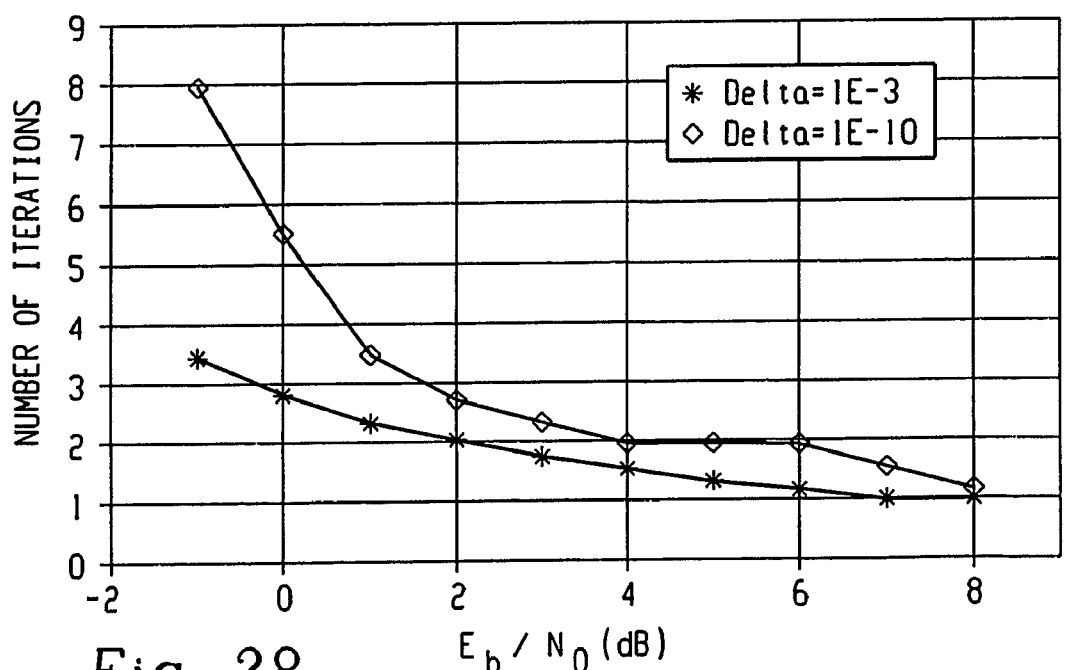
Figure 29:
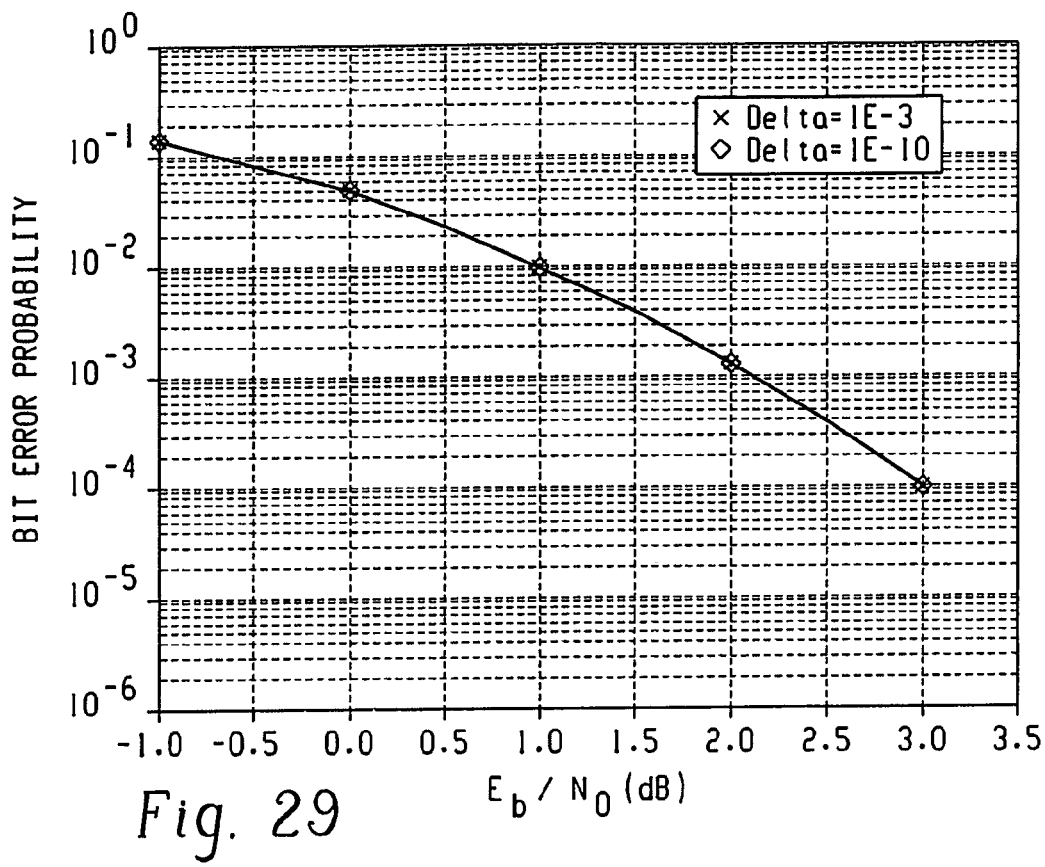
FIG. 29 is a graph illustrating the bit error probability of decoding of code under two different stop conditions.

For iterative circular shift BCJR decoding, the number of iterations needed at two different stop conditions, $\Delta<10^{(-10)}$ and $\Delta<10^{(-3)}$, are compared with decoding being for the same CTCM (4, 3) encoded sequence with L=16. FIGS. 27 and 28 are graphs showing the number of iterations required by $\alpha$ and $\beta$ averaged over 10,000 information sequences. They show that at very low $E_b/N_0$, under stop condition $\Delta<10^{(-10)}$, $\alpha$ and $\beta$ need about twice as many iterations as under stop condition $\Delta<10^{(-3)}$. The difference becomes smaller as $E_b/N_0$ increases. FIG. 29 is a graph showing the bit error probability of decoding this code under these two stop conditions. The graph shows that $\alpha$ and $\beta$ obtained at $\Delta<10^{(-3)}$ lead to almost the same decode decision as those obtained at $\Delta<10^{(-10)}$. $\Delta<10^{(-3)}$ is small enough to control the convergence.

Simulation results are now provided by way of example to obtain an overall bit error performance of a CTCM (4,D) encoder and an iterative circular shift BCJR algorithm decoder.

Figure 30:
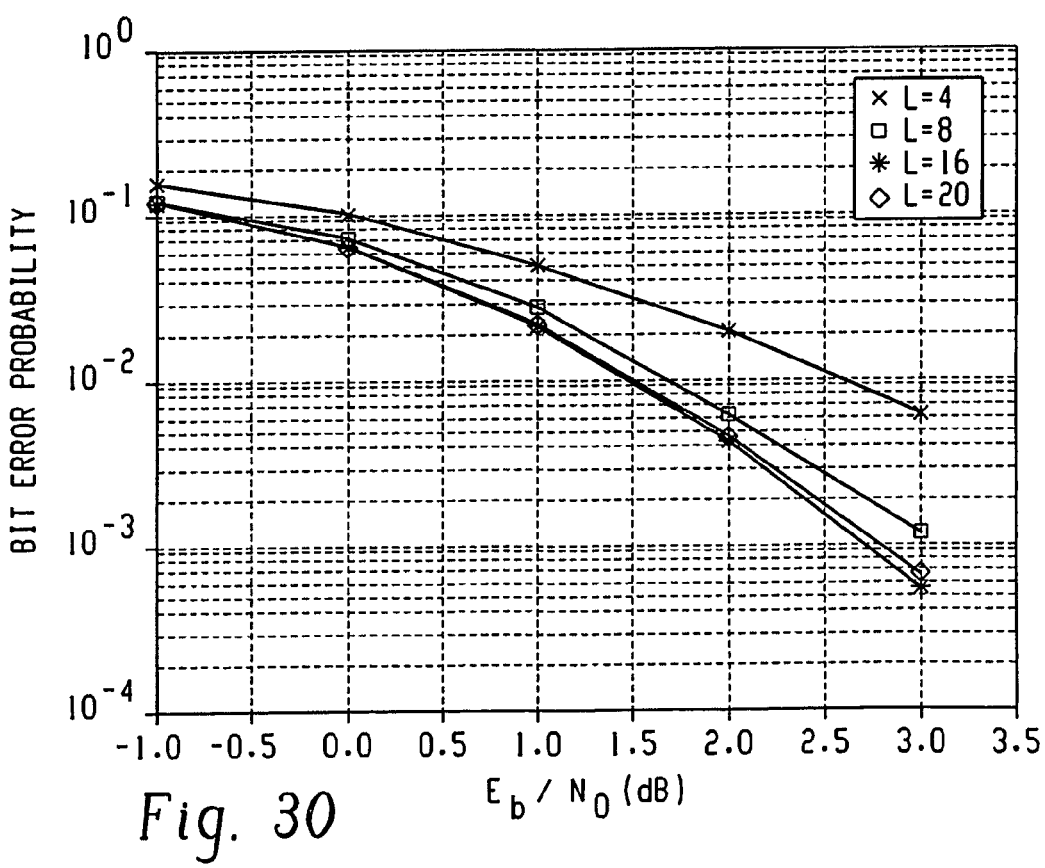
FIGS. 30 and 31 is a graph illustrating a trend in bit error probability versus information symbol length for decoding CTCM (4,2) and CTCM (4,3) encoded sequences, respectively.
Figure 31:
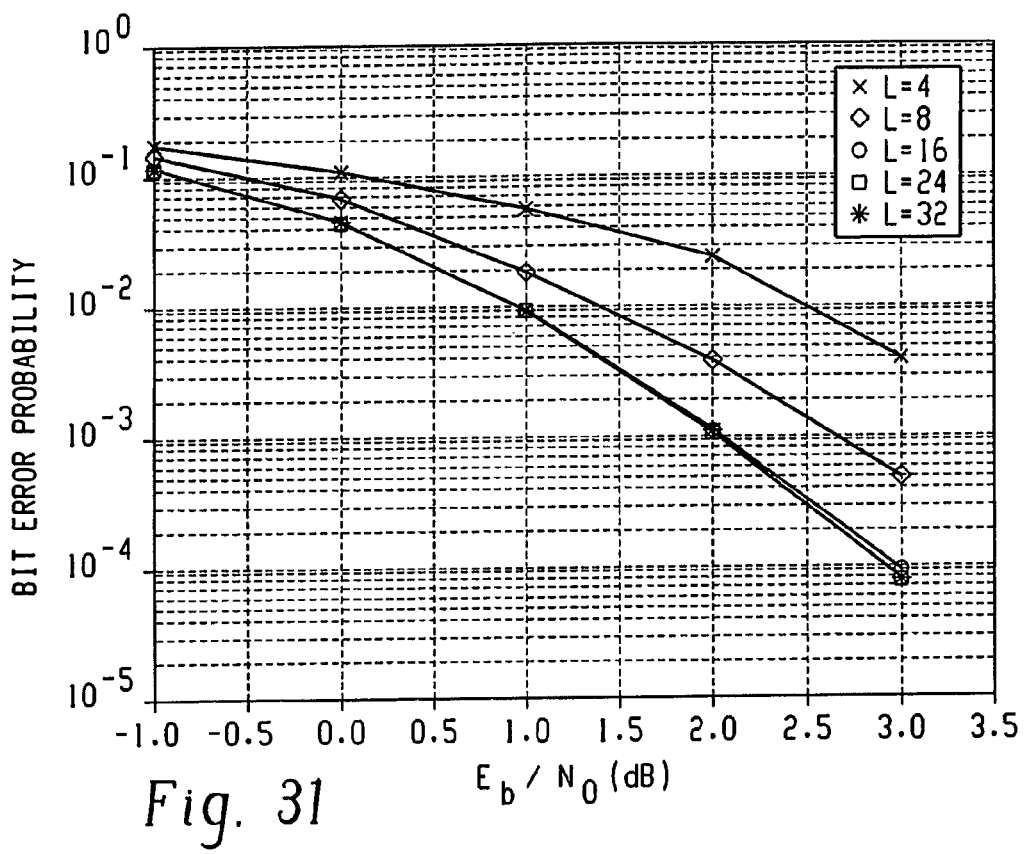

The importance of the minimum distance of a code in determining its error performance is well known. We know the minimum distance of CTCM (4, D) is increased with big steps when the information length L is increased starting from D+1, and then will reach a steady value at some point. Accordingly, the bit error probability will decrease with big steps when L is increased starting from D+1 and then will not decrease as much after L reaches some value. This trend is shown in FIGS. 30 and 31 in which the bit error probability versus the information symbol length L is plotted for decoding CTCM (4, 2) and CTCM (4, 3) encoded sequences, respectively.

Figure 32:
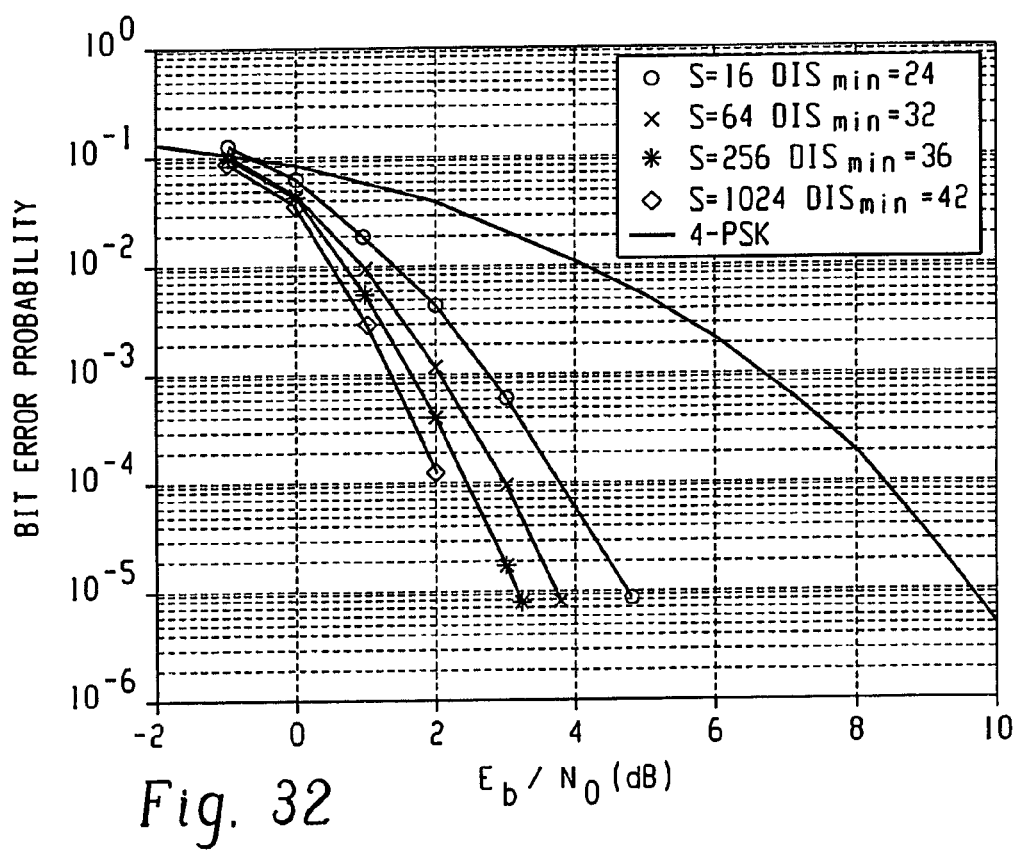
FIG. 32 is a graph illustrating bit error probability of the optimal distance codes for CTCM (4,D) where D ranges over 2–5.

For any CTCM (4, D) encoded sequence with L>2D+ (0~2), optimal distance codes may be built. FIG. 32 is a graph showing the bit error probability of the optimal distance codes for CTCM (4, D), D=2, 3, 4, 5. In FIG. 32, the bit error probability of an uncoded 4-PSK, regarded as a reference system, is also plotted. S is the total states in trellis. $DIS_{min}$ is the minimum distance of this code. It can be seen that, at bit error probability $10^{(-5)}$, the coding gain for 16, 64, 256, and 1024 states trellis are approximately 5.0 dB, 6.0 dB, 6.6 dB, and 7.2 dB, respectively.

In summary, a multi-dimensional circular trellis-coded modulation with permuted state structure (CTCM) encoder has been described herein above, particularly suited for a communication system operating in power limited channel applications. The CTCM encoder includes a multi-dimensional simplex signal constellation built to achieve optimal energy efficiency and to maximize the minimum distance among error events for any size trellis. The building method includes analyzing the error events and identifying sets of state transitions that should be assigned simplex to achieve maximum coding gain. Butterfly structures or matrices of trellis coding are related to the identified state transitions and aligned into a multi-dimensional matrix, referred to as a state transition matrix or STM, which is designed in such a way that the identified sets of state transitions are located in the same internal location of the butterflies along a particular matrix dimension. In addition, an algebraic representation of a simplex structure of channel symbols in a multi-dimensional space is built as a unit element or matrix for each state of the STM. These simplex matrices are aligned into another multi-dimensional matrix, referred to as a initial input simplex or IIS matrix in such a way that the simplex matrices along a particular matrix dimension of the IIS matrix have simplex signals in the same internal location of each which taken together form a simplex structure. Thus, a one-to-one correspondence or symbol assignment is established between the states of the STM and the simplex signals or symbols of the IIS matrix, and between the state transitions in STM and symbols of the simplex signal constellation. The construction of STM, IIS matrix and the symbol assignment are applicable to any size CTCM encoder.

As has been explained herein above, with a CTCM encoder having an unknown starting state, the maximum likelihood (ML) decoder (Viterbi decoder) is not suitable for decoding the sequence of channel symbols effected thereby. Accordingly, a modified circular BCJR algorithm decoder, referred to herein as an iterative circular shift BCJR decoder, is developed. In this decoder, the starting state of the sequence of channel symbols is statistically estimated using a tentative hard decision with reliability information, and the circular character of the CTCM encoder is incorporated to render the most reliable symbol in the received sequence of symbols as the starting point for decoding. Exemplary simulations illustrated a good convergence property of the iterative circular shift BCJR decoder for different stop conditions and different sequence lengths. In addition, bit error performance of the iterative circular shift BCJR was compared with corresponding uncoded communication systems to illustrate substantial improvements.

Figure 33:
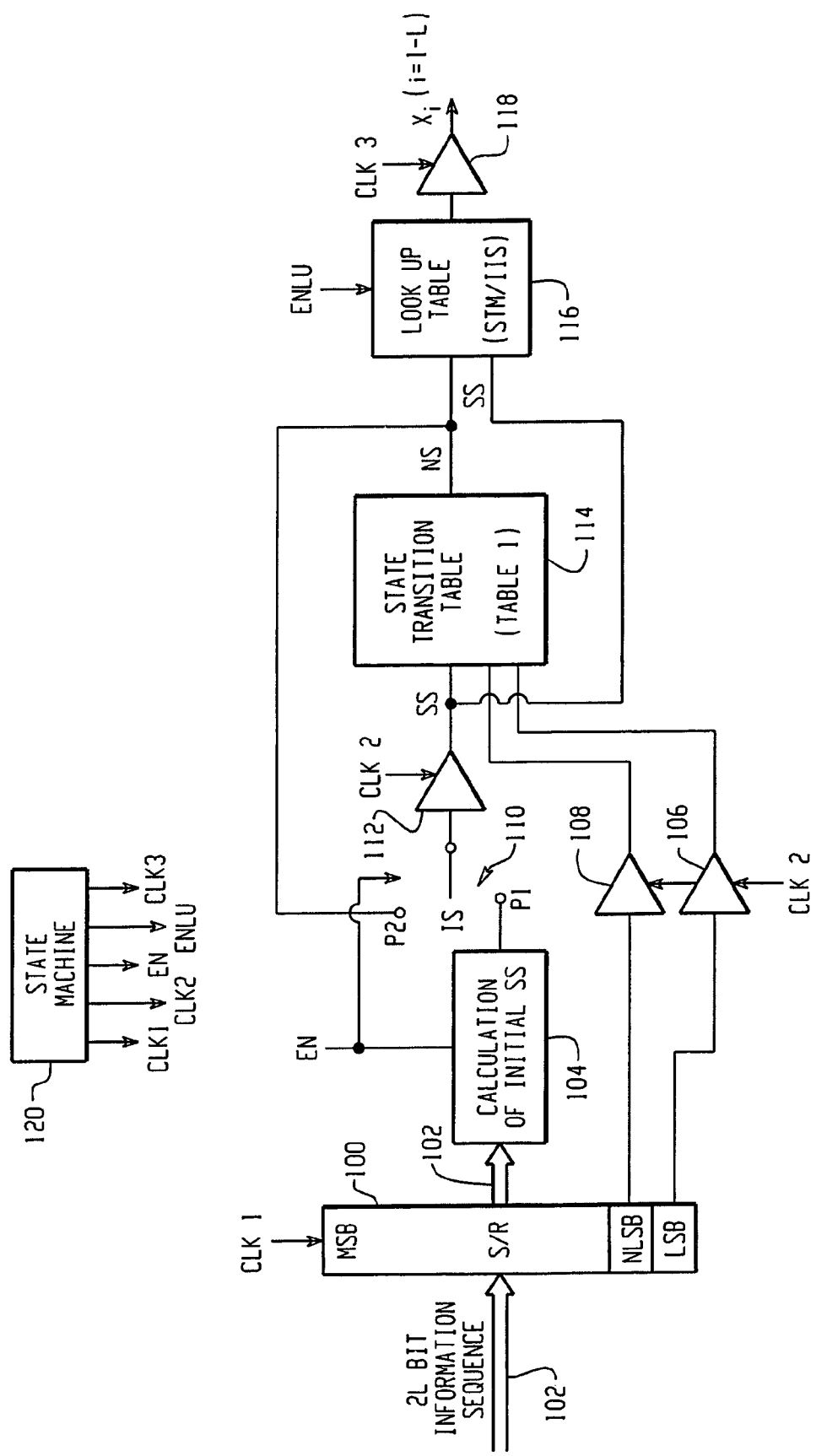
FIG. 33 is a block diagram schematic of an exemplary CTCM (4,3) encoder embodiment suitable for use in the communication system of FIG. 1.
Figure 34:
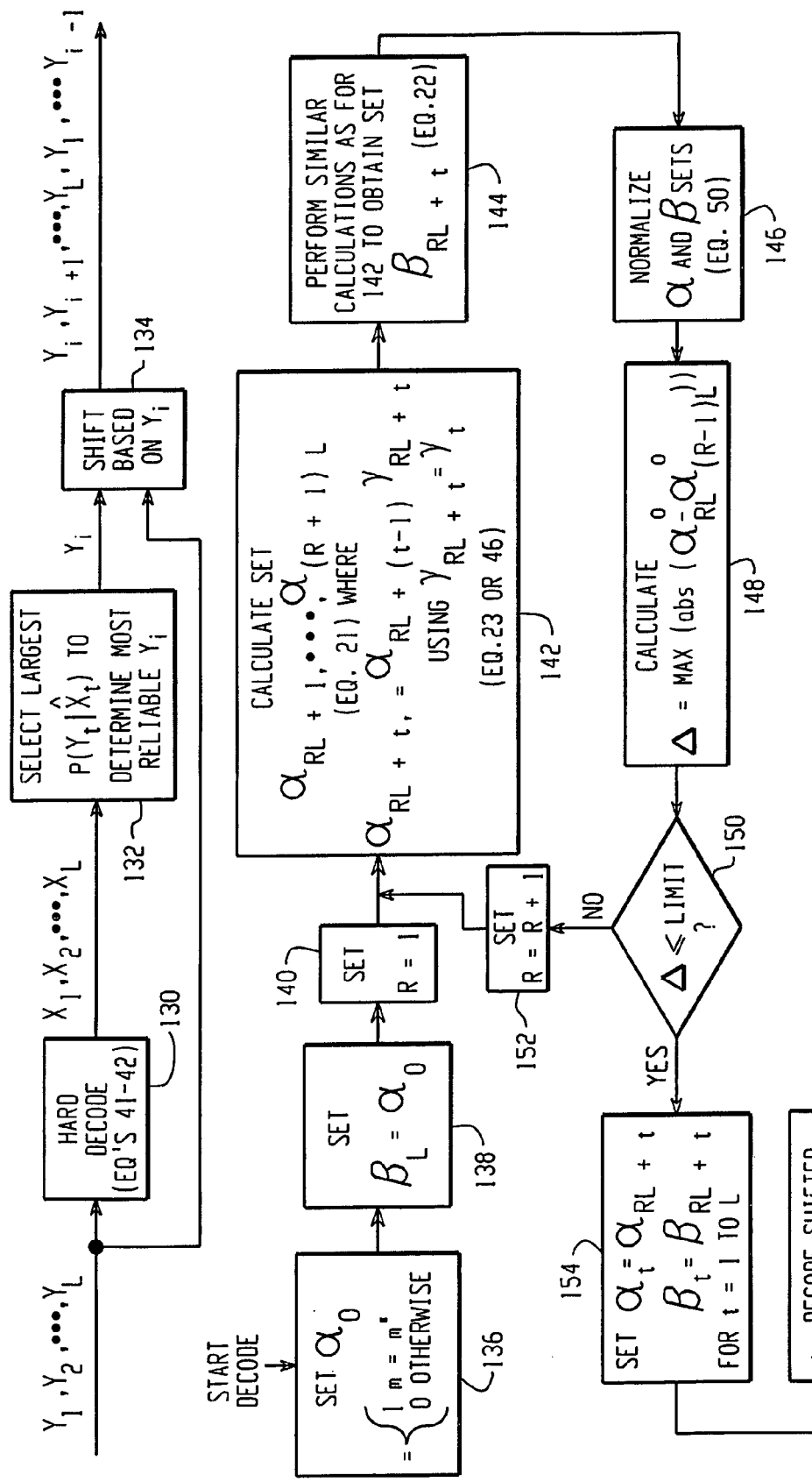
FIG. 34 is a block diagram schematic of an exemplary CTCM (4,3) decoder embodiment suitable for use in the communication system of FIG. 1.

An exemplary CTCM (4, 3) encoder and decoder suitable for embodying the principles of the present invention are shown in the functional block diagram schematics of FIGS. 33 and 34, respectively. Both of these embodiments are suitable for use in a communication system similar to that described in connection with FIG. 1. The encoder embodiment of FIG. 33 may embody the function of the block 14, and similarly, the decoder embodiment of FIG. 34 may embody the function of the block 26. Referring to FIG. 33, a block of 2L bits of information data is provided to a shift-register (S/R) function 100 from the information source 10, for example, over signal lines 102. The same block of information data is also provided to a functional block 104 which functions to calculate the starting state of the trellis based on the current block of 2L bits of data. The shift-register function 100 includes least significant bit (LSB) and next least significant bit (NLSB) registers having outputs coupled to respective inputs of sample-and-hold (S/H) functions 106 and 108. Since the present embodiment has an information symbol alphabet of n=4, the 2-bits output from the S/H functions 106 and 108 represent each information symbol of the block of data in the S/R function 100. These 2 bits are input via S/H functions 106 and 108 to a state transition table 114 which may be a look-up table for the present embodiment. A suitable look-up table for this example is shown in FIG. 9 as Table 1. The output of functional block 104 representative of the initial state (IS) of the trellis is coupled to position P1 of a functional switch 110. The pole position of switch 110 is coupled to the input of another S/H function 112. The output of function 112 which is representative of a starting state (SS) of the trellis is input to the look-up table 114. The output of the look-up table 114 which is representative of the next state (NS) of the trellis is coupled to position P2 of switch 110. Signals SS and NS which together represent a transition of the trellis are also coupled to inputs of another look-up table 116 which is generated from the STM and IIS described herein above. The look-up table 116 offers a one-to-one mapping between a transition (SS-NS) of the trellis and a simplex channel symbol Xi associated therewith. The associated channel symbol Xi is output from the table 116 into another S/H function 118.

Clocking signals generated from a state machine 120, for example, may be used to operate the various functional blocks of the encoder in a sequential manner. For example, a clock signal CLK1 which may generate 2 clock pulses periodically may control the shifting of information bits of the S/R function 100, a clock signal CLK2 may control the sample-and hold functions of blocks 106, 108 and 112, an enable signal EN may enable the calculation of function 104 and the switch position of switch 110, and an enable look-up signal ENLU may control the operation of the look-up table 116, and a clock signal CLK3 may control the sample-and-hold function of the block 118. Operation of these clocking signals will become more evident from the description of operation of the encoder found directly below.

An exemplary operation of the encoder embodiment of FIG. 33 will now be described. Referring to FIG. 33, a block of 2L information data bits are supplied over signal lines 102 and stored in the S/R function 100. The block of data bits are also supplied to inputs of the function 104. The enable signal EN is generated by the state machine 120 to enable the function 104 to calculate the initial starting state of the trellis from the block of data bits supplied thereto. This calculation may be based on Zech's logarithm as described herein above. Signal EN also controls switch 110 to position P1 which couples the output signal IS of the function 104 to the input of the S/H 112. Thereafter, the clock signal CLK2 is generated by the state machine 120 to control the sampling and holding of the S/H functions 106, 108 and 112 whereby the signals coupled to the inputs thereof are captured and held at the outputs which are input to the transition table 114. Accordingly, the S/H function 112 provides the initial starting state at stage 1 of the trellis and S/H functions 106 and 108 provide the information data symbol or alphabet value (i.e. 0, 1, 2, or 3 for the present embodiment) for the starting state. From this input data, the transition look-up table 114 outputs the next state (i.e. at stage 2 of the trellis). The current starting state (stage 1) and next state (stage 2) are input to the look-up table 116 so that when the signal ENLU is generated by the state machine, the look-up table 116 outputs the simplex channel symbol Xi uniquely associated with the transition SS(stage 1)-NS(stage 2). The clock signal CLK3 generated by the state machine 120 controls the sampling and holding of $X_1$ by the S/H function 118. When the enable signal EN is caused to change to a non-enabling state (i.e. released), the switch 110 is controlled to position P2 which couples the next state output of function 114 to the input of the S/H 112.

In this state, the state machine 120 again generates the signal CLK1 (2 clock pulses) which shifts the next two bits of the block of information data to the LSB and NLSB registers of the S/R 100. Thereafter, signal CLK2 is generated to capture in the S/H's 106, 108 and 112 the signals at their respective inputs which are the starting state (stage 2) and the information symbol alphabet value (2 bits) uniquely associated therewith. From this new data at its inputs, the table function 114 outputs the next state of the trellis at stage 3. This new transition SS(stage 2)-NS(stage 3) is input to the look-up table 116 which outputs a signal representative of the uniquely associated channel symbol $X_2$ when enabled by signal ENLU generated by the state machine 120. The symbol $X_2$ is captured by the S/H 118 upon the generation of the CLK3 signal. This process is repeated for each information symbol 3 to L of the current data block to produce signals representative of the channel symbols $X_3$ to $X_L$, respectively. With each new data block of 2L bits stored in the S/R function 100, the enable signal EN is generated by the state machine 120 to calculate the initial starting state of the trellis for producing the first channel symbol and then released for the production of the remaining channel symbols $X_2$ to $X_L$. Channel symbols representative of a data block may be transmitted over the channel by the transmitter 20 as they are produced by the CTCM encoder, or in the alternative, the channel symbols may be stored upon production by the CTCM encoder for subsequent transmission at a different rate than the rate being produced, for example, which is a process sometimes referred to as buffering.

Now, the CTCM decoder embodiment depicted in FIG. 34, which is based on an iterative circular shift BCJR algorithm, will be described. In this embodiment, the most reliable symbol of the received sequence of symbols $Y_1$, $Y_2$, ... $Y_L$ is selected to determine an initial starting state for the algorithm using statistical estimation techniques as described herein above. The received sequence of signals are circular shifted based on the selected symbol and the circular shifted version of the received symbol sequence is decoded using the iterative circular BCJR algorithm to produce the information sequence $U^L$. Included in the present embodiment are an improved way of setting the initial values of $\alpha_0$ and $\beta_L$, and the "selective normalization" process, both of which having been described in detail herein above.

Referring to FIG. 34, the sequence of symbols $Y_1, Y_2, \ldots Y_L$ received by the receiver 22 from the channel which may be a memoryless AWGN with a one-sided noise spectrum $N_0$, for example, are hard decoded in functional block 130 to produce respective symbols $X_1, X_2, \ldots, X_L$ belonging to the simplex signal constellation of the encoder. The hard decode function 130 may include the calculations expressed in Equations 41 and 42 above, for example, in order to provide an initial estimate of the symbols $X_1$–$X_L$ based on probabilities and to minimize the probability of making an erroneous decision. Then, in functional block 132 the largest of the probabilities $P(Y_t|X_t)$ is selected, and $Y_i$ thereof is considered the most reliable of the sequence of symbols. Next, in functional block 134, the received sequence of symbols are circular shifted based on the selected symbol $Y_1$ to yield a circular shifted sequence $Y_i, Y_{i+1}, \ldots, Y_L, Y_1, \ldots, Y_{i-1}$ with $Y_i$ as the initial starting state. In general, any of the symbols Y may be selected arbitrarily as the initial starting state for decoding purposes. But, selecting the most reliable symbol $Y_i$ as the initial starting state permits a quicker convergence in the decoding process to follow.

Decoding of the circular shifted sequence begins at functional block 136 wherein the initial $\alpha_0$ is set according to Equation 43 above. In block 138, $\beta_L$ is initially set to $\alpha_0$. An iterative process next begins by setting an index R to one in block 140. In the first block of the iterative process, block 142, a set of $\alpha_{RL+1}, \ldots, \alpha_{(R+1)L}$ is calculated in a forward direction using Equations 21 and 23 or 46 above, for example. In block 144, similar calculations as for block 142 are performed, albeit in the reverse direction, to obtain a set $\beta_{RL+t}$ using Equation 22 above. Thereafter, in block 146, the calculated α and β sets are normalized using Equation 50 above, for example. For the present embodiment, a test to determine if the, ratios are too small for computational purposes is provided in blocks 148 and 150. In block 148, the absolute values of the differences of respective normalized α's ($(\alpha^0_{RL}-\alpha^0_{(R-1)L})$ are computed and the maximum of the absolute values, Δ, is selected to be compared to a predetermined limit in decisional block 150. If Δ is not too small, i.e. greater than the predetermined limit, then the index R is increased by one in block 152 and blocks 142, 144, 146, 148 and 150 are repeated. This iterative process will continue until Δ is considered too small by decisional block 150. Thereafter, in block 154, for t equals 1 to L, the set $\alpha_t$ is set equal to the set $\alpha_{RL+t}$, and the set βt is set equal to the set $\beta_{RL+t}$, respectively. Finally, in block 156, the circular shifted sequence received from receiver 22, for example, is decoded into its corresponding information symbol sequence $U_i, U_{i+1}, \ldots, U_L, U_1, \ldots, U_{i-1}$ using Equations 35, 36, 44 and 45 above, for example. The resulting information symbol sequence may be easily converted to its information code knowing the symbol alphabet of the encoder. The foregoing described CTCM encoder and decoder embodiments may either be implemented in circuitry or in software, i.e. programmed into a microcontroller, for example.

While the present invention has been described herein above in connection with a number of embodiments, it is understood that this description was made purely by way of example and not intended in any way, shape or form to be limiting to the present invention. Rather, the present invention should be construed in breadth and broad scope in accordance with the recitation of the appended claims hereto.

What is claimed is:

1. Method of building systematically a multi-dimensional (n, D, L) circular trellis coded modulation (CTCM) encoder with properties of optimal energy efficiency, strong tail biting and maximum minimum distance ($d_{min}$) of trellis paths, where n is the size of the symbol alphabet, D is the depth of the trellis, and L is the length of the information symbol sequence, said method comprising the steps of:

a) identifying simplex-transition sets of originating and next states for each stage i of a circular trellis;

wherein a simplex is a set of M signals in an N-dimensional space with N≧M−1, satisfying that for all I, j∈{1, 2, ..., M}, the cross-correlation between signals $s_i$ and $s_j$ is $$s_i \cdot s_j = \begin{cases} 1, & i = j \\ -1/(M-1), & i \neq j \end{cases}$$

for normalized signal energy. The M signals have equal distance from each other;

b) determining butterfly structures (butterflies) associated with the identified simplex-transition sets wherein the originating and next states of said simplex-transition sets are arranged in an internal order within said butterfly structures;

c) aligning said butterfly structures into a multi-dimensional state transition matrix (STM) in a predetermined order;

d) constructing a simplex of channel symbols from a multi-dimensional signal constellation space for each of said identified simplex-transition sets;

e) aligning each simplex of channel symbols into a multi-dimensional initial input simplex (IIS) matrix in an order in relation to said predetermined order of butterfly structures in said STM; and f) assigning channel symbols to state transitions of a trellis path by mapping between said simplex-transition sets of the STM and said simplexes of symbols of said IIS matrix.

2. The method of claim 1 wherein step (a) includes the steps of:

analyzing error events of the circular trellis; and identifying sets of state transitions that should be assigned simplex to maximize coding gain, said sets of state transitions being the identified simplex-transition sets.

3. The method of claim 2 wherein step (c) includes the steps of:

identifying a set of butterfly structures associated with a simplex-transition set of a middle stage of the circular trellis; and aligning the butterfly structures of said set along a particular dimension of the STM so that the state transitions of the corresponding simplex-transition set are located in the same internal location of said butterfly structures.

4. The method of claim 1 wherein step (b) includes the steps of:

grouping the butterfly structures into a predetermined number of simplex-transition$_i$-butterfly-sets constituting simplex-transtion$_i$ for each stage i; and arranging the internal order of the originating and next states in the butterfly structures in the simplex-transition$_i$-butterfly sets based on the simplex-transtion$_i$'s associated therewith.

5. The method of claim 4 wherein the step of arranging the internal order of states includes the steps of:

selecting any one of the butterflies in any one of the simplex-transition$_i$-butterfly sets;

arranging the originating states and next states into internal locations of the selected butterfly;

fixing the internal locations of the originating states and next states of all of the other butterflies in the selected simplex-transition$_i$-butterfly set based on the simplex-transition$_i$'s associated with the originating and next states thereof and the internal locations in which the originating states and next states are arranged in the selected butterfly;

repeating the above steps for each simplex-transition$_i$-butterfly set of the predetermined number; and repeating the above steps for each stage i.

6. The method of claim 4 wherein the step (c) includes the steps of:

selecting any one of the butterflies of the grouping;

placing the selected butterfly into a location in STM;

determining a simplex-transition$_j$-butterfly set containing the selected butterfly, j representing a stage;

placing the other butterflies of said determined set j in an order along a first dimension of STM aligned with the selected butterfly;

determining the simplex-transition$_k$-butterfly set containing the selected butterfly, k representing another stage, k≠j;

placing the other butterflies of said determined set k in an order along a second dimension of STM aligned with the selected butterfly; and filling in the remaining locations of STM with other butterflies by dimensional cross checking based on the association thereof with the simplex-transition$_i$-butterfly sets.

7. The method of claim 1 wherein the step (d) includes the steps of:

constructing source type simplexes from channel symbols of the multi-dimensional space for the simplex-transitions of the first stage;

constructing type B simplexes for the simplex-transition sets of the last stage associated with a common butterfly structure from channel symbols of the source type simplexes by arranging the internal order of the channel symbols thereof in relation to the internal order of the originating and next states of each simplex-transition set of the corresponding common butterfly structure; and constructing type B simplexes for the simplex-transition sets of the middle stages associated with butterfly structures of simplex-transition-butterfly-sets from channel symbols of the source type simplexes by arranging the internal order of the channel symbols thereof in relation to the internal order of the originating and next states of each simplex-transition set of the butterfly structures of the corresponding simplex-transition-butterfly-set.

8. The method of claim 7 wherein the type B simplexes are constructed using copy and fill rules of member signals thereof.

9. The method of claim 1 wherein step (e) includes aligning simplexes along a particular dimension of the IIS matrix so that member signals in the same internal location of each said simplex when taken together form another simplex.

10. The method of claim 1 including the step of constructing a look-up table from the mapping of step (f).

11. A communication system for use in a power limited channel application, said system comprising:

a circular trellis coded modulation (CTCM) encoder for converting a sequence of digital information bits of a predetermined length into a corresponding sequence of channel symbols based on a circular trellis path associated with the sequence of digital information bits and a set of simplexes identified for said path from a multi-dimensional signal constellation, said CTCM encoder including means for determining an initial starting state of the circular trellis path which renders said path circular without the addition of redundant bits to the sequence of digital information bits; first storing means for storing a representation of a multi-dimensional matrix of simplexes of channel symbols, said simplexes being arranged in said matrix in an ordered relationship to identified state transitions of the circular trellis path; and means for converting the sequence of digital information bits into the corresponding sequence of channel symbols of the circular trellis path by operating on the sequence of digital information bits in accordance with said stored matrix representation;

wherein a simplex is a set of M signals in an N-dimensional space with N≧M−1, satisfying that for all I, j∈{1, 2, . . . , M}, the cross-correlation between signals $s_i$ and $s_j$ is $$s_i \cdot s_j = \begin{cases} 1, & i = j \\ -1/(M-1), & i \neq j \end{cases}$$

for normalized signal energy. The M signals have equal distance from each other, a transmitter coupled to said CTCM encoder for transmitting said sequence of channel symbols over said channel;

a receiver for receiving a transmission from said transmitter including said sequence of channel symbols and any noise induced therein;

a CTCM decoder coupled to said receiver for decoding received transmission without knowledge of the starting state of the circular trellis path of the CTCM encoder to recover the sequence of information bits.

12. The system of claim 11 wherein the first storing means stores the matrix representation in the form of a look-up table.

13. The system of claim 11 wherein the converting means includes:

means of converting the sequence of digital information bits into a corresponding sequence of information symbols based on the information symbol alphabet; and second storing means for storing a representation of a state transition table of a circular trellis with permuted state structure through which a next state of the circular trellis path may be accessed by an information symbol of the sequence of information symbols and a starting state of the circular trellis path associated therewith, said initial starting state being the starting state for a first stage of the circular trellis path and the next state becoming the starting state for stages of the circular trellis path subsequent the first stage.

14. The system of claim 13 wherein the second storing means stores the matrix representation in the form of a look-up table.

15. The system of claim 13 wherein the first storing means being accessed by the starting state and next state of a transition along the circular trellis path to output a simplex channel symbol from the set of simplexes correspondingly associated with said transition.

16. The system of claim 15 wherein the first and second storing means operated sequentially to output the sequence of simplex channel symbols based on the sequence of transitions along the circular trellis path.

17. The system of claim 11 wherein the determining means of the CTCM encoder includes means for calculating an initial starting state based on the sequence of digital information bits.

18. The system of claim 17 wherein the determining means of the CTCM encoder includes means for calculating an initial starting state by operating on the sequence of digital information bits with Zech's logarithm.

19. The system of claim 11 wherein the CTCM decoder includes an iterative circular shift BCJR algorithm for decoding the received sequence of symbols.

20. A circular trellis coded modulation (CTCM) encoder for converting a sequence of digital information bits of a predetermined length into a corresponding sequence of channel symbols based on a circular trellis path associated with the sequence of digital information bits and a set of simplexes identified for said path from a multi-dimensional signal constellation, said CTCM encoder comprising:

means for determining an initial starting state of the circular trellis path which renders said path circular without the addition of redundant bits to the sequence of digital information bits;

first storing means for storing a representation of a multi-dimensional matrix of simplexes of channel symbols, said simplexes being arranged in said matrix in an ordered relationship to identified state transitions of the circular trellis path; and wherein a simplex is a set of M signals in an N-dimensional space with N≧M−1, satisfying that for all I, j∈{1, 2, . . . , M}, the cross-correlation between signals $s_i$ and $s_j$ is $$s_i \cdot s_j = \begin{cases} 1, & i = j \\ -1/(M-1), & i \neq j \end{cases}$$

for normalized signal energy. The M signals have equal distance from each other, means for converting the sequence of digital information bits into the corresponding sequence of channel symbols of the circular trellis path by operating on the sequence of digital information bits in accordance with said stored matrix representation.

21. The encoder of claim 20 wherein the first storing means stores the matrix representation in the form of a look-up table.

22. The encoder of claim 20 wherein the converting means includes:

means of converting the sequence of digital information bits into a corresponding sequence of information symbols based on the information symbol alphabet; and second storing means for storing a representation of a state transition table of a circular trellis with permuted state structure through which a next state of the circular trellis path may be accessed by an information symbol of the sequence of information symbols and a starting state of the circular trellis path associated therewith, said initial starting state being the starting state for a first stage of the circular trellis path and the next state becoming the starting state for stages of the circular trellis path subsequent the first stage.

23. The encoder of claim 22 wherein the second storing means stores the state transition table representation in the form of a look-up table.

24. The encoder of claim 22 wherein the first storing means being accessed by the starting state and next state of a transition along the circular trellis path to output a simplex channel symbol from the set of simplexes correspondingly associated with said transition.

25. The encoder of claim 24 wherein the first and second storing means operated sequentially to output the sequence of simplex channel symbols based on the sequence of transitions along the circular trellis path.

26. The encoder of claim 20 wherein the determining means of the CTCM encoder includes means for calculating an initial starting state based on the sequence of digital information bits.

27. The encoder of claim 26 wherein the determining means of the CTCM encoder includes means for calculating an initial starting state by operating on the sequence of digital information bits with Zech's logarithm.

28. A method of circular trellis coded modulation (CTCM) encoding comprising the step of:
converting a sequence of digital information bits of a predetermined length into a corresponding sequence of channel symbols based on a circular trellis path associated with the sequence of digital information bits and a set of simplexes identified for said path from a multi-dimensional signal constellation, said step of converting including: determining an initial starting state of the circular trellis path which renders said path circular without the addition of redundant bits to the sequence of digital information bits; storing a representation of a multi-dimensional matrix of simplexes of channel symbols arranged in an ordered relationship to identified state transitions of the circular trellis path; and converting the sequence of digital information bits into the corresponding sequence of channel symbols of the circular trellis path by operating on the sequence of digital
wherein a simplex is a set of M signals in an N-dimensional space with $N \geq M-1$, satisfying that for all I, $j \in \{1, 2, \ldots, M\}$, the cross-correlation between signals $S_i$ and $s_j$ is $$s_i \cdot s_j = \begin{cases} 1, & i = j \\ -1/(M-1), & i \neq j \end{cases}$$

for normalized signal energy. The M signals have equal distance from each other.

29. The method of claim 28 wherein the matrix representation is stored in the form of a look-up table.

30. The method of claim 28 wherein the step of converting includes the steps of:
converting the sequence of digital information bits into a corresponding sequence of information symbols based on the information symbol alphabet; and
storing a representation of a state transition table of a circular trellis with permuted state structure through which a next state of the circular trellis path may be accessed by an information symbol of the sequence of information symbols and a starting state of the circular trellis path associated therewith, said initial starting state being the starting state for a first stage of the circular trellis path and the next state becoming the starting state for stages of the circular trellis path subsequent the first stage.

31. The method of claim 30 wherein the state transition table representation is stored in the form of a look-up table.

32. The method of claim 30 including the step of accessing the stored matrix representation by the starting state and next state of a transition along the circular trellis path to output a simplex channel symbol from the set of simplexes correspondingly associated with said transition.

33. The method of claim 32 including the step of sequentially accessing the stored state transition table representation and the stored matrix representation to output the sequence of simplex channel symbols based on the sequence of transitions along the circular trellis path.

34. The method of claim 28 wherein the step of determining includes calculating an initial starting state based on the sequence of digital information bits.

35. The method of claim 34 wherein the step of determining includes calculating an initial starting state by operating on the sequence of digital information bits with Zech's logarithm.

36. A communication system for use in a power limited channel application, said system comprising:
a circular trellis coded modulation (CTCM) encoder for converting a sequence of digital information bits of a predetermined length into a corresponding sequence of channel symbols based on a circular trellis path associated with the sequence of digital information bits and a set of simplexes identified for said path from a multi-dimensional signal constellation, said CTCM encoder including means for determining an initial starting state of the circular trellis path which renders said path circular without the addition of redundant bits to the sequence of digital information bits;
wherein a simplex is a set of M signals in an N-dimensional space with $N \geq M-1$, satisfying that for all I, $j \in \{1, 2, \ldots, M\}$, the cross-correlation between signals $s_i$ and $s_j$ is $$s_i \cdot s_j = \begin{cases} 1, & i = j \\ -1/(M-1), & i \neq j \end{cases}$$

for normalized signal energy. The M signals have equal distance from each other,
a transmitter coupled to said CTCM encoder for transmitting said sequence of channel symbols over said channel;
a receiver for receiving a transmission from said transmitter including said sequence of channel symbols and any noise induced therein;
a CTCM decoder coupled to said receiver for decoding the received transmission without knowledge of the starting state of the circular trellis path of the CTCM encoder to recover the sequence of information bits, said CTCM decoder including: means for decoding the received sequence of symbols based on a statistical estimate of the starting state of the CTCM encoder; means for determining the reliability of the statistical estimation for each received channel symbol; and means for selecting one of the received channel symbols as being representative of the starting state based on the determined reliabilities of the received channel symbols.

37. The system of claim 36 wherein the selecting means includes a means for selecting one of the received channel symbols as being representative of the starting state based on the largest determined reliability of the reliabilities of the received channel symbols.

38. A communication system for use in a power limited channel application, said system comprising:
a circular trellis coded modulation (CTCM) encoder for converting a sequence of digital information bits of a predetermined length into a corresponding sequence of channel symbols based on a circular trellis path associated with the sequence of digital information bits and a set of simplexes identified for said path from a multi-dimensional signal constellation, said CTCM encoder including means for determining an initial staffing state of the circular trellis path which renders said path circular without the addition of redundant bits to the sequence of digital information bits;
wherein a simplex is a set of M signals in an N-dimensional space with $N \geq M-1$, satisfying that for all I, $j \in \{1, 2, \ldots, M\}$, the cross-correlation between signals $s_i$ and $s_j$ is $$s_i \cdot s_j = \begin{cases} 1, & i = j \\ -1/(M-1), & i \neq j \end{cases}$$

for normalized signal energy. The M signals have equal distance from each other,
- a transmitter coupled to said CTCM encoder for transmitting said sequence of channel symbols over said channel;
- a receiver for receiving a transmission from said transmitter including said sequence of channel symbols and any noise induced therein;
- a CTCM decoder coupled to said receiver for decoding the received transmission without knowledge of the starting state of the circular trellis path of the CTCM encoder to recover the sequence of information bits, said CTCM decoder including: means for generating a circular shift version of the received sequence of channel symbols based on a statistical estimate of the staffing state of the CTCM encoder; and means for decoding the circular shift version of the received sequence of channel symbols to obtain an information sequence.

* * * * *